(12) United States Patent
Urano et al.

(10) Patent No.: US 9,647,179 B2
(45) Date of Patent: May 9, 2017

(54) LED MODULE AND METHOD OF PREPARING THE LED MODULE, LIGHTING DEVICE

(71) Applicant: PANASONIC CORPORATION, Osaka (JP)

(72) Inventors: Yoji Urano, Osaka (JP); Kenichiro Tanaka, Osaka (JP); Akifumi Nakamura, Osaka (JP); Toru Hirano, Osaka (JP); Hideaki Hyuga, Osaka (JP); Masanori Suzuki, Osaka (JP); Teruhisa Yokota, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/387,703

(22) PCT Filed: May 24, 2013

(86) PCT No.: PCT/JP2013/003302
§ 371 (c)(1),
(2) Date: Sep. 24, 2014

(87) PCT Pub. No.: WO2013/179625
PCT Pub. Date: Dec. 5, 2013

(65) Prior Publication Data
US 2015/0137149 A1    May 21, 2015

(30) Foreign Application Priority Data

May 31, 2012 (JP) ................................ 2012-125016
Aug. 31, 2012 (JP) ................................ 2012-191742
Nov. 2, 2012 (JP) ................................ 2012-242686

(51) Int. Cl.
*H01L 33/48* (2010.01)
*H01L 33/60* (2010.01)
(Continued)

(52) U.S. Cl.
CPC ................ *H01L 33/50* (2013.01); *F21K 9/27* (2016.08); *H01L 25/0753* (2013.01);
(Continued)

(58) Field of Classification Search
CPC ......... H01L 27/15; H01L 33/38; H01L 29/22; H01L 29/18; H01L 33/00; H01L 31/0203;
(Continued)

(56) References Cited

U.S. PATENT DOCUMENTS 5,998,925 A    12/1999 Shimizu
8,430,527 B2 *  4/2013 Lai ................................ 362/244
(Continued)

FOREIGN PATENT DOCUMENTS

CN    102047449 A    5/2011
JP    11-112025      4/1999
(Continued)

OTHER PUBLICATIONS

Search report from PCT/JP2013/003302, mail date is Jun. 18, 2013.
(Continued)

*Primary Examiner* — Armando Rodriguez
*Assistant Examiner* — Sean Hagan
(74) *Attorney, Agent, or Firm* — Greenblum & Bernstein, P.L.C.

(57) ABSTRACT

An LED module includes a submount having a face in a thickness direction thereof, an LED chip bonded to the face of the submount with a first bond, and a patterned wiring circuit electrically connected to the LED chip. The first bond transmits light emitted from the LED chip. The submount is a light-transmissive member having light diffusing proper-
(Continued)

ties, and a planar size larger than a planar size of the LED chip. The patterned wiring circuit is provided on the face of the submount so as not to overlap the LED chip. The submount is constituted by a plurality of light-transmissive layers which are stacked in the thickness direction and have different optical properties so that a light-transmissive layer of the plurality of light-transmissive layers which is farther from the LED chip is higher in reflectance in a wavelength range of the light emitted from the LED chip.

10 Claims, 28 Drawing Sheets

(51) Int. Cl.
| | | |
|---|---|---|
| H01L 33/50 | (2010.01) | |
| H01L 33/58 | (2010.01) | |
| H01L 25/075 | (2006.01) | |
| H01L 33/62 | (2010.01) | |
| H01L 33/64 | (2010.01) | |
| F21K 9/27 | (2016.01) | |

(52) U.S. Cl.
CPC .......... H01L 33/486 (2013.01); H01L 33/504 (2013.01); H01L 33/507 (2013.01); H01L 33/58 (2013.01); H01L 33/60 (2013.01); H01L 33/62 (2013.01); H01L 33/642 (2013.01); H01L 2224/45144 (2013.01); H01L 2224/48091 (2013.01); H01L 2224/48137 (2013.01); H01L 2224/48227 (2013.01); H01L 2224/73265 (2013.01); H01L 2224/8592 (2013.01); H01L 2924/181 (2013.01); H01L 2933/0058 (2013.01)

(58) Field of Classification Search
CPC ..... H01L 29/227; H01L 29/207; H01L 31/02; H01L 31/18; H01L 33/60; H01L 33/48; H01L 33/50; H01L 33/62; H01L 33/58; H01L 33/46; H01L 33/08; H01L 33/56; H01L 2924/00014; H01L 33/468; B82Y 99/00
USPC ....... 257/40, 79, 80–82, 84, 88–93, 98–100, 257/355, 432–434, 419, 676, 773, E31.11, 257/E33.056, E33.057, E33.058, E33.059, 257/E33.053, E33.052, E33.072, E33.077, 257/E27.12, E33.06, E33.061, E33.065, 257/E33.066, E33.067, E33.068, E33.001, 257/E21.598, E21.532, E21.223, E21.249, 257/E21.499; 438/6, 33, 83, 25–28, 43, 438/106, 110, 551, 675, 667–671, 733, 438/832; 362/84, 611, 11.02
See application file for complete search history.

(56) References Cited

U.S. PATENT DOCUMENTS

| | | | |
|---|---|---|---|
| 8,604,678 B2* | 12/2013 | Dai et al. ...................... | 313/112 |
| 2002/0039002 A1 | 4/2002 | Fukasawa et al. | |
| 2003/0102810 A1 | 6/2003 | Cross | |
| 2004/0164311 A1* | 8/2004 | Uemura ........................... | 257/99 |
| 2005/0122742 A1 | 6/2005 | Ho | |
| 2008/0191236 A1 | 8/2008 | De Graaf et al. | |
| 2009/0121253 A1 | 5/2009 | Abe | |
| 2010/0006819 A1* | 1/2010 | Shimizu et al. ................. | 257/13 |
| 2010/0212942 A1 | 8/2010 | Tuan et al. | |
| 2011/0006323 A1 | 1/2011 | Suzuki et al. | |
| 2011/0101394 A1 | 5/2011 | McKenzie | |
| 2011/0147778 A1 | 6/2011 | Ichikawa | |
| 2011/0278618 A1* | 11/2011 | Nakayama .............. | H01L 33/44 257/98 |
| 2012/0087103 A1 | 4/2012 | Dai | |
| 2012/0177909 A1* | 7/2012 | Uchino ................... | C04B 35/10 428/312.6 |
| 2012/0193647 A1* | 8/2012 | Andrews ......................... | 257/88 |
| 2012/0320601 A1* | 12/2012 | Motoya et al. .......... | 362/296.01 |
| 2013/0004779 A1* | 1/2013 | Ogata ........................... | 428/434 |
| 2013/0242565 A1* | 9/2013 | Arai ..................... | H01L 33/486 362/296.04 |
| 2013/0316478 A1 | 11/2013 | Ichikawa | |
| 2014/0167092 A1* | 6/2014 | Gartner .................. | H01L 33/52 257/98 |
| 2014/0239325 A1* | 8/2014 | Andrews et al. ....... | H01L 33/60 257/98 |

FOREIGN PATENT DOCUMENTS

| | | |
|---|---|---|
| JP | 2001-284656 | 10/2001 |
| JP | 2002-111073 | 4/2002 |
| JP | 2004-207519 | 7/2004 |
| JP | 2005-209958 | 8/2005 |
| JP | 2006-237557 | 9/2006 |
| JP | 2007-048969 | 2/2007 |
| JP | 2007-059781 | 3/2007 |
| JP | 2007-287713 | 11/2007 |
| JP | 2008-091831 | 4/2008 |
| JP | 2008-539576 | 11/2008 |
| JP | 2009-123908 | 6/2009 |
| JP | 2009-162950 | 7/2009 |
| JP | 2009-164311 | 7/2009 |
| JP | 2011-129661 | 6/2011 |
| JP | 2011-151187 | 8/2011 |
| WO | 2011/142097 | 11/2011 |
| WO | 2012/039442 | 3/2012 |
| WO | 2012/057163 | 5/2012 |

OTHER PUBLICATIONS

Search report from E.P.O., mail date is Feb. 18, 2015.
Search Report issued by P.C.T. patent office in P.C.T. Patent Application No. PCT/JP2013/003301, dated Jun. 18, 2013, along with an English language translation thereof.
Office Action issued in U.S. Appl. No. 14/387,312, dated May 16, 2016.
Office Action issued in Chinese family member Patent Appl. No. 201380018549.7, dated May 5, 2016, along with an English translation thereof.
Office Action issued in EPO family member Patent Appl. No. 13796749.3, dated Jan. 3, 2017.

* cited by examiner

FIG. 35
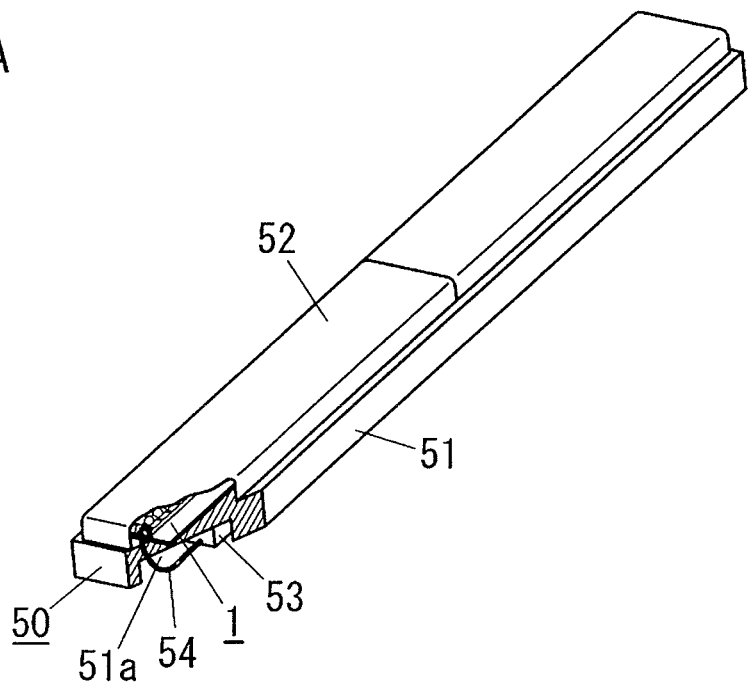
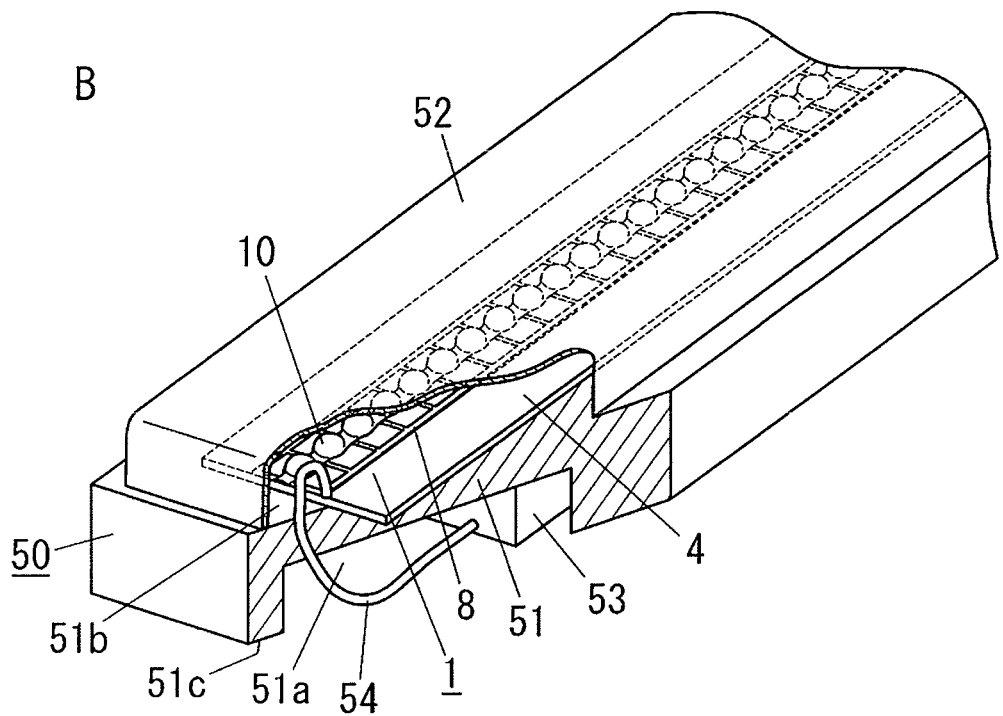

LED MODULE AND METHOD OF PREPARING THE LED MODULE, LIGHTING DEVICE

TECHNICAL FIELD

The present invention relates to an LED module, a method of manufacturing the LED module, and a lighting device.

BACKGROUND ART

Heretofore, a light emission apparatus 100 having a configuration shown in FIG. 45 has been proposed (JP 2008-91831A: Patent Document 1). The light emission apparatus 100 includes a submount substrate 120 having a nitride-based ceramic substrate 121, an Au layer 124 provided on a surface of the nitride based ceramic substrate 121, an oxide layer 123 interposed between the nitride based ceramic substrate 121 and the Au layer 124, and an LED light-emitting element 126 mounted on the submount substrate 120 via a solder layer 125. The oxide layer 123 includes a metal oxide as a main component. The submount substrate 120 has a reflecting layer 122 composed of at least one of Ag and Al that is formed on the surface of the nitride-based ceramic substrate 121 so as not to overlap the Au layer 124.

Patent Document 1 discloses that, for the purpose of extracting light efficiently from the LED light-emitting element 126, it is preferable to use the nitride-based ceramic substrate 121 of aluminum nitride having high reflectance.

Also, heretofore, a chip-type light-emitting element having a configuration shown in FIG. 46 has been proposed (JP 11-112025A: Patent Document 2). The chip-type light-emitting element includes an insulating substrate 201, an LED chip 206 that is mounted on a surface of the insulating substrate 201, and a package 207 which covers the LED chip 206 and surroundings thereof.

Patent Document 2 discloses that blue light propagating toward the back face of the substrate of the LED chip 206 can be reflected by the insulating substrate 201 that is a white insulating substrate composed of ceramics such as alumina and aluminum nitride.

Also, heretofore, as shown in FIG. 47, a configuration has been proposed in which a light emission apparatus is mounted on an external circuit substrate 301 (JP 2006-237557A: Patent Document 3). The light emission apparatus includes: a light-emitting element housing package having a substrate 304 and a reflecting member 302; and a light-emitting element 306 constituted by an LED chip mounted on a mounting portion 304a of the substrate 304.

Patent Document 3 discloses that the substrate 304 and the reflecting member 302 are preferably composed of white ceramics. Also, Patent Document 3 discloses a lighting apparatus including the above-mentioned light emission apparatus as a light source.

In the light emission apparatus 100 having the configuration shown in FIG. 45, it is speculated that part of light emitted from a light-emitting layer of the LED light-emitting element 126 propagates toward the nitride-based ceramic substrate 121 through the LED light-emitting element 126 and is reflected by the solder layer 125. However, in the light emission apparatus 100, it is speculated that light outcoupling efficiency decreases due to absorption, multiple reflection and the like of the light reflected by the solder layer 125 in the LED light-emitting element 126.

In the chip-type light-emitting element having the configuration shown in FIG. 46, blue light that propagates toward the back face of the substrate of the LED chip 206 is reflected by the insulating substrate 201. It is speculated that light outcoupling efficiency decreases due to absorption, multiple reflection and the like of the light in the LED chip 206.

In the configuration shown in FIG. 47, part of the light emitted from a light-emitting layer of the light-emitting element 306 propagates toward the substrate 304 through the light-emitting element 306, and is reflected by the substrate 304. It is speculated that light outcoupling efficiency decreases due to absorption, multiple reflection, and the like of the light in the light-emitting element 306.

SUMMARY OF INVENTION

The present invention has been made in view of the above-described insufficiencies, and an object of the present invention is to provide an LED module with improved light outcoupling efficiency, a method of manufacturing the LED module, and a lighting device.

An LED module in accordance with the present invention includes: a submount having a face in a thickness direction of the submount; an LED chip bonded to the face with a first bond; and a patterned wiring circuit electrically connected to the LED chip. The first bond allows light emitted from the LED chip to pass therethrough. The submount is a light-transmissive member having light diffusing properties and a planar size larger than a planar size of the LED chip. The patterned wiring circuit is provided on the face of the submount so as not to overlap the LED chip. The submount is constituted by a plurality of light-transmissive layers which are stacked in the thickness direction and have different optical properties so that a light-transmissive layer of the plurality of light-transmissive layers which is farther from the LED chip is higher in reflectance in a wavelength range of the light emitted from the LED chip.

It is preferable that the LED module includes a color conversion portion made of a transparent material containing a first fluorescent material which is excited by the light emitted from the LED chip to emit light having a different color from the light emitted from the LED chip, the color conversion portion covering sides of the LED chip and an opposite surface of the LED chip from the first bond.

It is preferable that, in the LED module, the color conversion portion contains a light diffusion material.

It is preferable that the LED module includes an opaque substrate, and the submount is bonded to a surface of the opaque substrate with a second bond.

It is preferable that, in the LED module, at least one of the first bond and the second bond contains a second fluorescent material which is excited by the light emitted from the LED chip to emit light having a different color from the light emitted from the LED chip.

It is preferable that the LED module includes a resin portion which is situated over the face of the submount and serves as an outer cover through which light passes last, and that the resin portion is made of a transparent resin which contains a light diffusion material.

It is preferable that the LED module includes a plurality of the LED chips on the face of the submount. The patterned wiring circuit includes a first conductor and a second conductor that are arranged apart from each other on the face of the submount. The plurality of the LED chips include a group of LED chips which are connected in series and arranged on a virtual line connecting the first conductor and the second conductor to each other. An LED chip of the group of LED chips that is closest to the first conductor on the virtual line has an anode electrode which is electrically connected to the first conductor by a first wire. An LED chip of the group of LED chips that is closest to the second conductor on the virtual line has a cathode electrode which is electrically connected to the second conductor by a second wire. Adjacent LED chips of the group of LED chips on the virtual line are electrically connected to each other in such a manner that an LED chip of the adjacent LED chips that is closer to the first conductor has a cathode electrode which is electrically connected to an anode electrode of an LED chip of the adjacent LED chips that is closer to the second conductor by a third wire.

It is preferable that the LED module includes an encapsulating portion with a band shape which covers the first wire, the second wire, the third wire, and the group of the LED chips arranged on the virtual line, and the encapsulating portion has a recessed portion between the adjacent LED chips on the virtual line for suppressing total reflection of light that is emitted from the adjacent LED chips.

It is preferable that the LED module includes a reflection layer provided on a further face of the submount in the thickness direction for reflecting the light from the LED chip.

It is preferable that, in the LED module, the reflection layer is a metal layer, and the LED module includes a protection layer provided on the further face of the submount for protecting the reflection layer.

It is preferable that, in the LED module, each of the light-transmissive layers is a ceramic layer.

A method of manufacturing the LED module includes: screen-printing a silver paste on a ceramic green paste, the silver paste being to be formed into the reflection layer, and the ceramic green sheet being to be formed into a light-transmissive layer of the plurality of light-transmissive layer that is farthest from the LED chip; and sintering the silver paste to form the reflective layer.

A lighting device in accordance with the present invention includes a light source that is the LED module.

The LED module in accordance with the present invention can have improved light outcoupling efficiency.

The method of manufacturing the LED module in accordance with the present invention can provided an LED module with improved light outcoupling efficiency.

The lighting device in accordance with the present invention can have improved light outcoupling efficiency.

BRIEF DESCRIPTION OF DRAWINGS

FIG. 35A is a schematic perspective view of a lighting device of Embodiment 2, which is partially exploded;

FIG. 35B is a main portion enlarged view in FIG. 35A;

DESCRIPTION OF EMBODIMENTS

Embodiment 1

Figure 1:
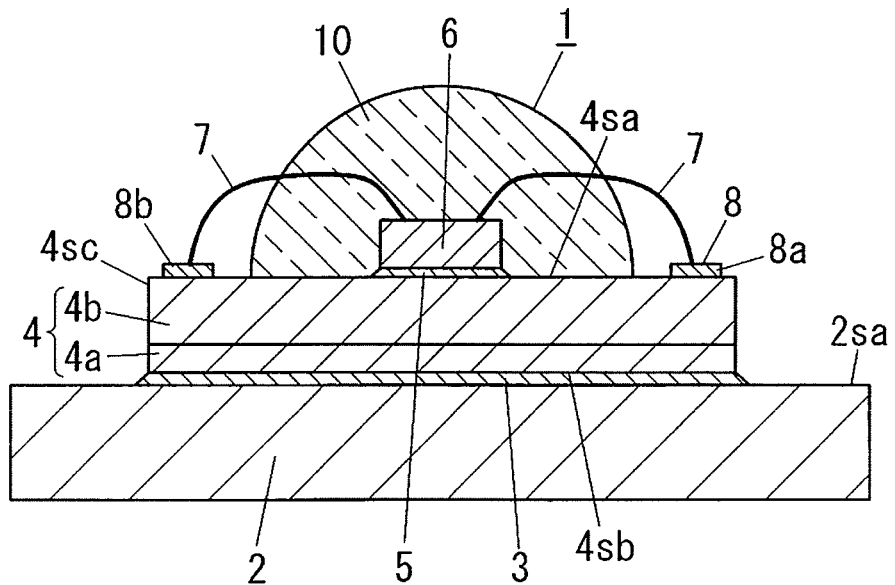
FIG. 1 is a schematic cross-section of an LED module of Embodiment 1.
Figure 2:
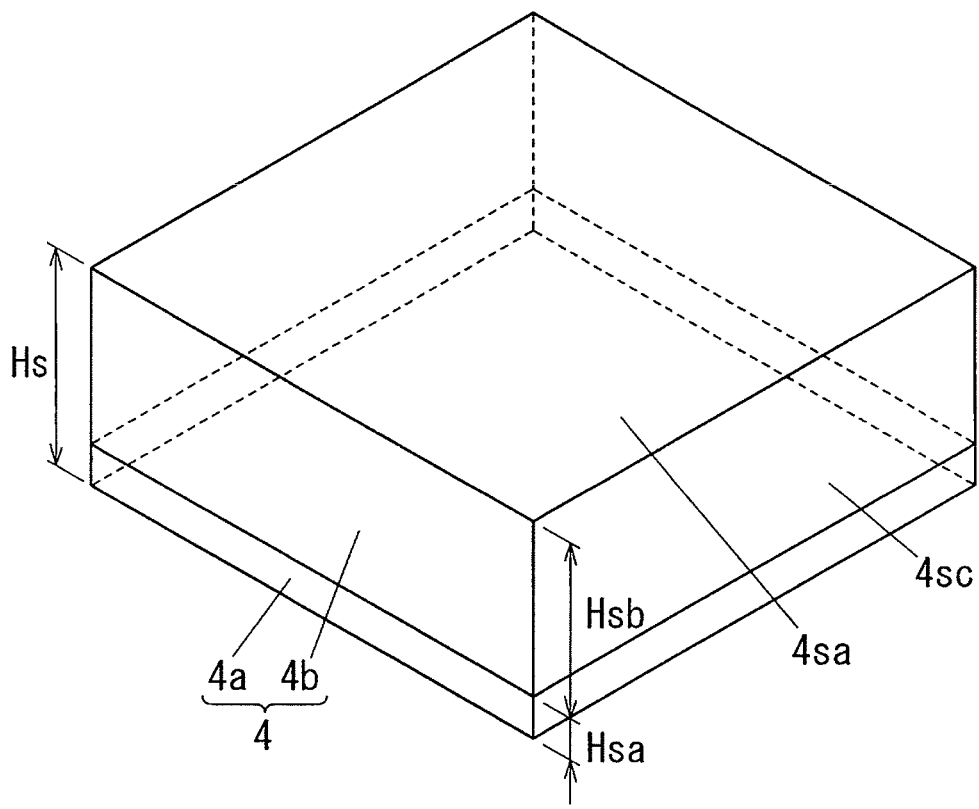
FIG. 2 is a schematic perspective view of a submount of the LED module of Embodiment 1.

Hereinafter, an LED module 1 of the present embodiment will be described with reference to FIGS. 1 to 8.

The LED module 1 includes a submount 4 having a face 4*sa* in a thickness direction of the submount 4, an LED chip 6 which is bonded to the face 4*sa* of the submount 4 with a first bond 5, and a patterned wiring circuit (patterned conductor) 8 electrically connected to the LED chip 6.

In the LED module 1, the first bond 5 allows light emitted from the LED chip 6 to pass therethrough, and the submount 4 is a light-transmissive member having light diffusing properties. The light-transmissive member propagates incident light to the outside through refraction or internal diffusion (scattering).

The submount 4 has a planar size larger than the planar size of the LED chip 6. The patterned wiring circuit 8 is provided on the face 4*sa* of the submount 4 so as not to overlap the LED chip 6. The submount 4 is constituted by at least two light-transmissive layers which are stacked in the thickness direction of the submount 4. The light-transmissive layers have different optical properties from each other, and a light-transmissive layer of the light-transmissive layers which is farther from the LED chip 6 is higher in reflectance in a wavelength range of the light emitted from the LED chip 6.

Accordingly, in the LED module 1, part of the light emitted from a light-emitting layer (not shown) in the LED chip 6 passes through the LED chip 6 and the first bond 5, and thereafter is diffused inside the submount 4. Consequently, the light that has passed through the LED chip 6 and the first bond 5 is less likely to be totally reflected, and more likely to emerge from the submount 4 through either side faces 4*sc* or the face 4*sa*. Therefore, in the LED module 1, light outcoupling efficiency can be improved and a total light flux amount can be increased.

The LED module 1 may include an opaque substrate 2. In this case, in the LED module 1, the submount 4 is preferably bonded to a surface 2*sa* of the opaque substrate 2 with a second bond 3.

Hereinafter, each constituent element of the LED module 1 will be described in detail.

The LED chip 6 includes a first electrode (not shown) serving as an anode electrode and a second electrode (not shown) serving as a cathode electrode both on a face of the LED chip 6 in the thickness direction.

Figure 3:
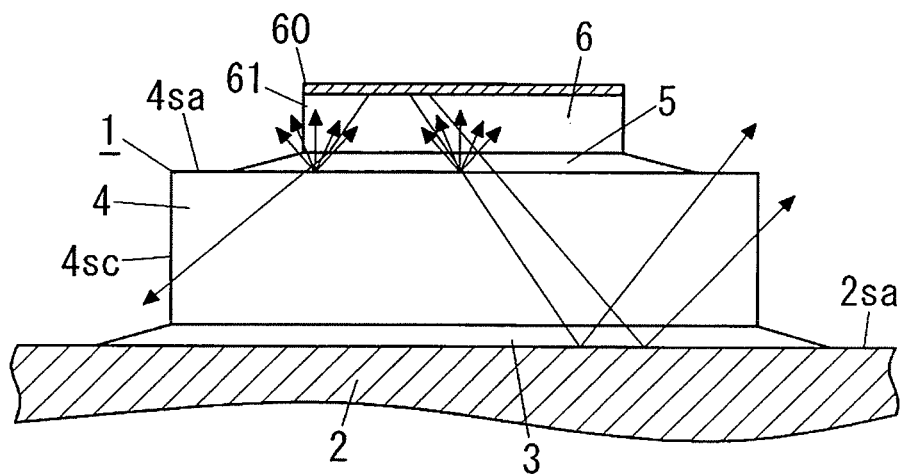
FIG. 3 is a schematic explanatory diagram of a propagating path of light in the LED module of Embodiment 1.
Figure 4:
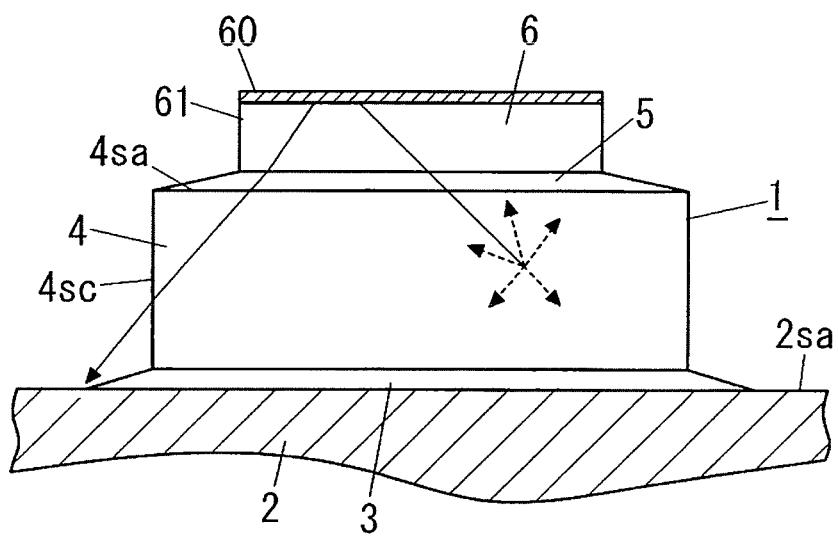
FIG. 4 is a schematic explanatory diagram of a propagating path of light in the LED module of Embodiment 1.

The LED chip 6 includes, as shown in FIG. 3, a substrate 61 and an LED structure portion 60 on a main surface of the substrate 61. The LED structure portion 60 includes an n-type semiconductor layer, a light-emitting layer, and a p-type semiconductor layer. The stacking order of the n-type semiconductor layer, the light-emitting layer, and the p-type semiconductor layer is the n-type semiconductor layer, the light-emitting layer, and the p-type semiconductor layer from the substrate 61. The stacking order is not limited thereto, however, and the stacking order may be the p-type semiconductor layer, the light-emitting layer, and the n-type semiconductor layer from the substrate 61. The LED chip 6 more preferably has a structure in which a buffer layer is provided between the LED structure portion 60 and the substrate 61. The light-emitting layer preferably has a single quantum well structure or a multiple quantum well structure, but is not limited thereto. For example, the LED chip 6 may have a doublehetero structure configured by the n-type semiconductor layer, the light-emitting layer, and the p-type semiconductor layer. Note that, the structure of the LED chip 6 is not particularly limited. The LED module 1 may be an LED chip which includes a reflector such as a Bragg reflector.

The LED chip 6 may be a GaN-based blue LED chip which emits blue light, for example. In this case, the LED chip 6 includes a sapphire substrate serving as the substrate 61. Note that, the substrate 61 of the LED chip 6 is not limited to the sapphire substrate, and the substrate 61 may be a transparent substrate with respect to light that is emitted from the light-emitting layer.

The chip size of the LED chip 6 is not particularly limited. The LED chip 6 may have a chip size of 0.3 mm sq. (0.3 mm by 0.3 mm), 0.45 mm sq. (0.45 mm by 0.45 mm), 1 mm sq. (1 mm by 1 mm), or the like. Also, the planar shape of the LED chip 6 is not limited to a square shape, and, for example, may be a rectangular shape. When the planar shape of the LED chip 6 is a rectangular shape, the chip size of the LED chip 6 may be 0.5 mm by 0.24 mm or the like.

In the LED chip 6, the material and the emission color of the light-emitting layer is not particularly limited. That is, the LED chip 6 is not limited to a blue LED chip, and may be a violet LED chip, an ultraviolet LED chip, a red LED chip, a green LED chip, or the like.

The first bond 5 which bonds the LED chip 6 to the submount 4 may be formed of a transparent material such as a silicone resin, an epoxy resin, and a hybrid material composed of a silicone resin and an epoxy resin.

The light-transmissive member which is the submount 4 is light-transmissive so as to transmit light in an ultraviolet wavelength region and a visible wavelength region. As shown schematically by arrows in FIG. 4, the light-transmissive member transmits and diffuses light that is emitted from the light-emitting layer of the LED structure portion 60 of the LED chip 6. The light-transmissive member which is the submount 4 may be formed of light-transmissive ceramics (such as alumina and barium sulfate), for example. Properties of the light-transmissive ceramics such as transmittance, reflectance, refractive index, and thermal conductivity can be adjusted by the type and concentration of a binder, an additive substance, or the like. In the LED module 1, the LED chip 6 is bonded to a center of the face 4sa of the submount 4 with the first bond 5.

The submount 4 has light diffusing properties. Accordingly, in the LED module 1, as shown schematically by arrows in FIG. 4, light emitted from the light-emitting layer of the LED structure portion 60 of the LED chip 6 toward a further face of the LED chip 6 in the thickness direction is diffused inside the submount 4. Therefore, in the LED module 1, it is possible to prevent light emitted toward the submount 4 from the LED chip 6 from returning to the LED chip 6 and therefore light can be more easily extracted from the face 4sa and the side faces 4sc of the submount 4. The light outcoupling efficiency of the LED module 1 can thereby be improved. Note that, in FIG. 4, broken-line arrows schematically show propagating directions of rays of light that are diffused inside the submount 4. Also, in FIG. 4, a solid-line arrow schematically shows a propagating direction of a ray of light which emerges from the submount 4 through the side face 4sc.

The submount 4 has a rectangular shape in a planar view, but the shape thereof is not limited thereto, and may be a round shape, a polygonal shape other than a rectangle, or the like. The planar size of the submount 4 is set to be larger than the planar size of the LED chip 6. Accordingly, light outcoupling efficiency of the LED module 1 can be improved.

The submount 4 preferably has a stress alleviation function of alleviating stress which acts on the LED chip 6 caused by the difference between the linear expansion coefficients of the LED chip 6 and the opaque substrate 2. The stress alleviation function is provided by designing the submount 4 to have a linear expansion coefficient close to that of the LED chip 6. Accordingly, in the LED module 1, it is possible to alleviate the stress which acts on the LED chip 6 caused by the difference between the linear expansion coefficients of the LED chip 6 and the opaque substrate 2.

The submount 4 preferably has a heat conduction function of conducting heat which is generated in the LED chip 6 toward the opaque substrate 2. Also, the submount 4 preferably has a heat conduction function of conducting heat which is generated in the LED chip 6 to a region which is larger than the chip size of the LED chip 6. Accordingly, in the LED module 1, heat generated in the LED chip 6 can be efficiently dissipated via the submount 4 and the opaque substrate 2.

The second bond 3 for bonding the submount 4 to the opaque substrate 2 may be made of a transparent material such as a silicone resin, an epoxy resin, and a hybrid material composed of a silicone resin and an epoxy resin, for example. Alternatively, the second bond 3 may be made of a conductive paste (such as silver paste and gold paste) or a resin containing a filler (such as titania and zinc oxide) or the like. When the second bond 3 is made of the silver paste, it is preferable to surround the second bond 3 by a gas barrier layer composed of an adhesive having high gas barrier properties or the like. When the opaque substrate 2 is provided with a mask layer at the surface 2sa, the mask layer may be used as the second bond 3.

The opaque substrate 2 is ideally an opaque medium (non-transparent body) which does not transmit light in a visible wavelength region, and is an non-transparent substrate which does not transmit light in the visible wavelength region. The transmittance of the opaque substrate 2 with respect to light in a visible wavelength region is preferably 0% to 10%, more preferably 0 to 5%, and still more preferably 0 to 1%. Also, the opaque substrate 2 ideally does not absorb light in the visible wavelength region, and the absorptance thereof with respect to light in the visible wavelength region is preferably 0% to 10%, more preferably 0 to 5%, and still more preferably 0 to 1%. The transmittance and the absorptance are measured using an integrating sphere.

The opaque substrate 2 may be made of aluminum, an aluminum alloy, silver, copper, phosphor bronze, a copper alloy (such as alloy 42), a nickel alloy, or the like.

The opaque substrate 2 may be constituted by a base material formed of the above-described material and a reflection layer (not shown) provided on a surface of the base material, the reflection layer having higher reflectance than the base material with respect to light that is emitted from the LED chip 6. That is, the opaque substrate 2 may include the reflection layer as a surface treatment layer. The reflection layer may be formed of an Ag film, a stack of an Ni film, a Pd film, and an Au film, a stack of an Ni film and an Au film, a stack of an Ag film, a Pd film, and an Au—Ag alloy film, or the like. The reflection layer formed of a metal material preferably includes a plating layer or the like. In short, the reflection layer formed of a metal material is preferably formed by a plating method. Also, the reflection layer may be formed of, for example, a white mask layer. The white mask for the mask layer may be composed of a resin (such as silicone resin) that contains a white pigment such as barium sulfate ($BaSO_4$) and titanium dioxide ($TiO_2$). The white mask may be made of ASA COLOR (registered trademark) RESIST INK available from Asahi Rubber Inc., which is a white mask material made of silicone, or the like. The white mask layer may be formed by coating, for example.

The opaque substrate 2 may be a highly reflective substrate including: an aluminum plate serving as the base material; an aluminum film on a surface of the aluminum plate; and a reflection enhancing film on the aluminum film. The aluminum film has higher purity than the aluminum plate, and the reflection enhancing film is constituted by two kinds of dielectric films having different refractive indices. Here, the two kinds of dielectric films are preferably an $SiO_2$ film and a $TiO_2$ film, for example. The LED module 1 can have reflectance of 95% or more with respect to visible light, due to using the highly reflective substrate as the opaque substrate 2. The highly reflective substrate may be MIRO2 or MIRO® available from Alanod, for example. The aforementioned aluminum plate may be an aluminum plate having a surface which has been subjected to an anodic oxidation treatment.

Alternatively, the opaque substrate 2 may be an insulating substrate formed of a material including a resin and a filler to increase reflectance. This insulating substrate may be made of unsaturated polyester and titania as the resin and the filler, respectively, for example. The resin of the insulating substrate is not limited to unsaturated polyester, and may be vinylester or the like. Also, the filler is not limited to titania and may be magnesium oxide, boron nitride, or aluminum hydroxide, for example. The opaque substrate 2 may be a resin substrate composed of a white resin, or a ceramic substrate having a reflection layer formed of a white resin.

On the face 4*sa* of the submount 4, the patterned wiring circuit 8 (hereinafter also referred to as "patterned circuit") serving as a circuit to supply power to the LED chip 6 is provided. The electrodes (first electrode and second electrode) of the LED chip 6 are electrically connected to the patterned wiring circuit 8 via wires 7 individually. The wire 7 may be a gold wire, an aluminum wire, or the like, for example. The patterned wiring circuit 8 may be made of, for example, copper, phosphor bronze, a copper alloy (such as 42 alloy), a nickel alloy, aluminum, an aluminum alloy, or the like. The patterned wiring circuit 8 may be formed of a lead frame, a metal foil, a metal film, or the like. When the submount 4 has electrical conductivity, an electrical insulation layer may be provided between the submount 4 and the patterned wiring circuit 8. Note that, in the LED module 1 of the present embodiment, the submount 4 and the patterned wiring circuit 8 constitute a mounting substrate on which the LED chip 6 is mounted.

The patterned wiring circuit 8 is preferably provided with a surface treatment layer (not shown). The surface treatment layer is preferably made of a metal material having higher oxidation-resistance and corrosion-resistance than the material of the patterned wiring circuit 8. When the patterned wiring circuit 8 is made of copper, the surface treatment layer is preferably a nickel film, a stack of a nickel film and a gold film, a stack of a nickel film, a palladium film, and a gold film, a stack of a nickel film and a palladium film, or the like, for example. Here, the surface treatment layer is more preferably a stack of a nickel film and a palladium film, from the viewpoint of cost reduction. Note that the surface treatment layer may be formed by plating.

The planar shape of the opaque substrate 2 is a rectangular shape, but the planar shape is not limited thereto, and may be a round shape, an elliptical shape, a triangular shape, a polygonal shape other than a rectangle, or the like.

The number of LED chips 6 that are arranged on the face 4*sa* of the submount 4 is not limited to one, and may be two or more. The LED module 1 may be configured such that the planar shape of the submount 4 is an elongated shape, and a plurality of LED chips 6 are arranged along a longitudinal direction of the submount 4, for example. In this case, the patterned circuit 8 may be configured to be connected to the plurality of LED chips 6 in series, in parallel, or in series-parallel. In short, the LED module 1 may have a circuit configuration in which a plurality of LED chips 6 are connected in series, may have a circuit configuration in which a plurality of LED chips 6 are connected in parallel, or may have a circuit configuration in which a plurality of LED chips 6 are connected in series-parallel.

In the LED module 1, the surface 2*sa* of the opaque substrate 2 preferably has light diffusing properties or specular reflective properties.

Figure 5:
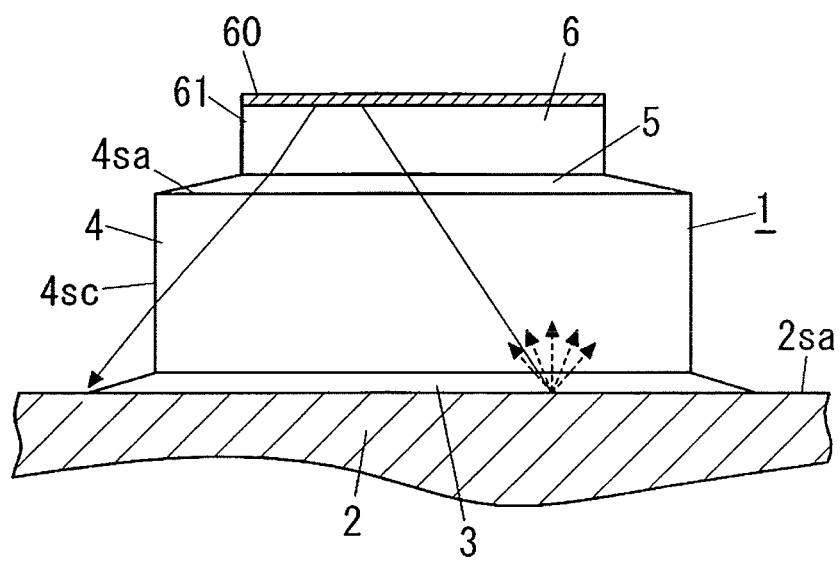
FIG. 5 is a schematic explanatory diagram of a propagating path of light in the LED module of Embodiment 1.

When the surface 2*sa* of the opaque substrate 2 has light diffusing properties, in the LED module 1, it is possible to diffusely reflect light which is emitted from the light-emitting layer of the LED structure portion 60 in the LED chip 6 and then passes through the first bond 5, the submount 4, and the second bond 3, by the surface 2*sa* of the opaque substrate 2, as shown schematically by arrows in FIG. 5. As a result, light returning to the LED chip 6 can be reduced. Note that, in FIG. 5, the broken-line arrows schematically show propagating directions of rays of light which strike the face 4*sa* of the submount 4 and are diffusely reflected by the surface 2*sa* of the opaque substrate 2. Also, in FIG. 5, the solid-line arrow schematically shows a propagating direction of a ray of light which enters the submount 4 through the face 4*sa* and then emerges from the submount 4 through the side face 4*sc*.

Figure 6:
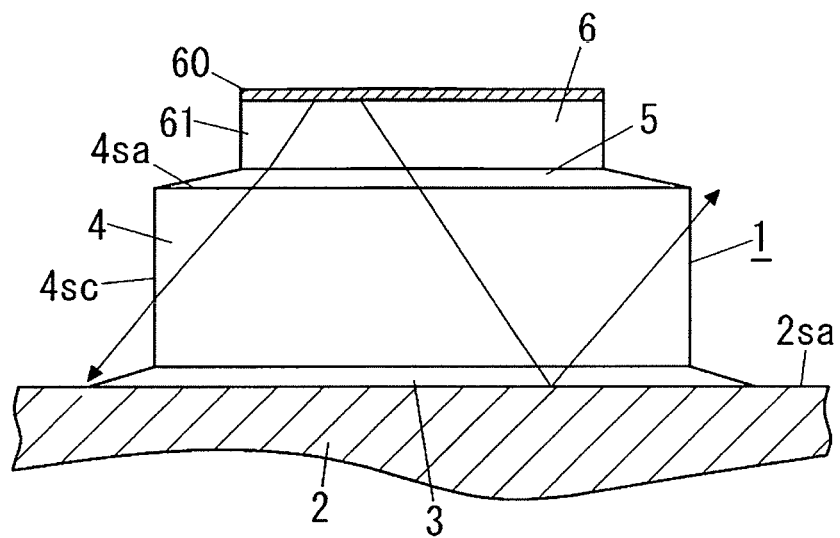
FIG. 6 is a schematic explanatory diagram of a propagating path of light in the LED module of Embodiment 1.

When the surface 2*sa* of the opaque substrate 2 has specular reflective properties, in the LED module 1, it is possible to specularly reflect light which is emitted from the LED chip 6, then passes the first bond 5, the submount 4, and the second bond 3, and thereafter obliquely enter the surface 2*sa* of the opaque substrate 2 as shown schematically by an arrow in FIG. 6. As a result, light outcoupling efficiency of the side faces 4*sc* of the submount 4 can be improved. Note that, in FIG. 6, the right arrow schematically shows a propagating direction of a ray of light that strikes the face 4*sa* of the submount 4 and is specularly reflected by the surface 2*sa* of the opaque substrate 2. Also, in FIG. 6, the left arrow schematically shows a propagating direction of a ray of light that enters the submount 4 through the face 4*sa* and then emerges from the submount 4 through the side face 4*sc*.

When the LED module 1 includes the opaque substrate 2 having the surface 2*sa* with light diffusing properties or specular reflective properties, light outcoupling efficiency thereof can be further improved.

Figure 7:
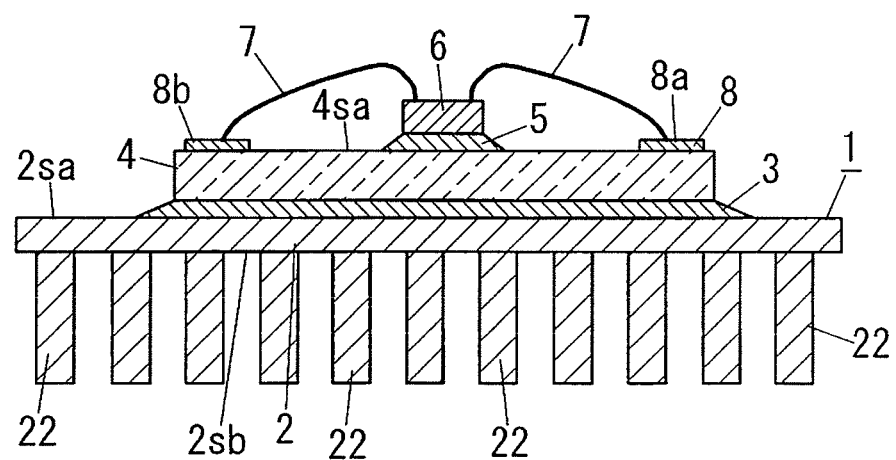
FIG. 7 is a schematic cross-section illustrating another exemplary configuration of an opaque substrate of the LED module of Embodiment 1.

In the LED module 1, the opaque substrate 2 preferably serves as a heat sink. In the LED module 1, when the opaque substrate 2 is made of metal having high thermal conductivity such as aluminum and copper, the opaque substrate 2 can function as a heat sink. Accordingly, in the LED module 1, heat generated in the LED chip 6 can be more efficiently dissipated, and as a result light output can be increased. The heat dissipation property of the LED module 1 can be improved without increasing the number of parts, when the LED module 1 has a configuration in which a plurality of fins 22 protruding from a further surface 2*sb* are integrally provided on the further surface 2*sb* of the opaque substrate 2 as shown in FIG. 7. The opaque substrate 2 in which the plurality of fins 22 are integrally provided can be formed by aluminum die-casting or the like.

The LED module 1 may include a color conversion portion 10 made of a transparent material containing a first fluorescent material. The first fluorescent material is a fluorescent material that is excited by light emitted from the LED chip 6 to emit light having a different color from the light emitted from the LED chip 6. The color conversion portion 10 has a hemispherical shape. The shape of the color conversion portion 10 is not limited to a hemisphere, and may be a semiellipse sphere, a semicylinder, or the like.

The transparent material for the color conversion portion 10 may be, for example, a silicone resin, an epoxy resin, an acrylic resin, glass, or an organic/inorganic hybrid material in which an organic component and an inorganic component are mixed and/or combined at a nanometer (nm) level or molecular level.

The fluorescent material for the color conversion portion 10 functions as a wavelength conversion material that converts light emitted from the LED chip 6 to light having longer wavelength than the light emitted from the LED chip 6. Accordingly, the LED module 1 can emit mixed-color light constituted by light emitted from the LED chip 6 and light emitted from the fluorescent material.

For example, when the LED chip 6 is a blue LED chip and the fluorescent material of the wavelength conversion material is a yellow fluorescent material, the LED module 1 can provide white light. That is, blue light that is emitted from the LED chip 6 and light that is emitted from the yellow fluorescent material can pass through the LED chip 6 and the submount 4, and as a result the LED module 1 can emit white light.

The fluorescent material serving as the wavelength conversion material is not limited to the yellow fluorescent material, and may include, for example, a set of a yellow fluorescent material and a red fluorescent material, or a set of a red fluorescent material and a green fluorescent material. Also, the fluorescent material serving as the wavelength conversion material is not limited to one kind of yellow fluorescent material, and may include two kinds of yellow fluorescent materials having different emission peak wavelengths. The color rendering property of the LED module 1 can be improved by use of a plurality of fluorescent materials as the wavelength conversion material.

In the LED module 1 of the present embodiment, the submount 4 is constituted by two layers of ceramic layers 4a and 4b which are stacked in the thickness direction.

In the submount 4, the ceramic layers 4a and 4b have different optical properties from each other, and the ceramic layer 4a, which is farther from the LED chip 6, is higher in reflectance with respect to light emitted from the LED chip 6. In this regard, the optical properties refer to reflectance, transmittance, absorptance, or the like. The submount 4 is constituted by at least two ceramic layers stacked in the thickness direction, and have such a property that optical characteristics of the ceramic layers are different from each other, and the further the ceramic layer is from the LED chip 6, the higher the reflectance thereof is with respect to the light emitted from the LED chip 6.

Figure 8:
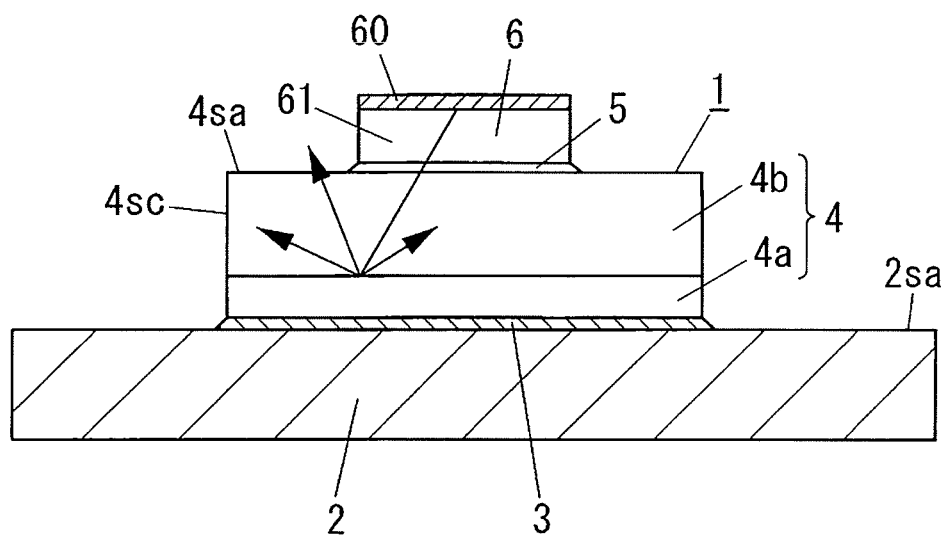
FIG. 8 is a schematic explanatory diagram of a propagating path of light in the LED module of Embodiment 1.

Accordingly, in the LED module 1, light emitted from the light-emitting layer of the LED structure portion 60 of the LED chip 6 toward the further face of the LED chip 6 in the thickness direction is more likely to be reflected at the interface between the ceramic layer 4b and the ceramic layer 4a as shown schematically by arrows in FIG. 8. Therefore, in the LED module 1, it is possible to prevent light which is emitted from the LED chip 6 toward the submount 4 from returning to the LED chip 6 and to prevent the light from entering, the surface 2sa of the opaque substrate 2. As a result, light can be more easily extracted from the face 4sa and the side faces 4sc of the submount 4. Consequently, in the LED module 1, light outcoupling efficiency can be improved. Moreover, when the LED module 1 further includes the opaque substrate 2, it is possible to reduce the influence of reflectance of the opaque substrate 2, and to increase the degree of freedom in terms of the materials of the opaque substrate 2.

With regard to the submount 4, the uppermost ceramic layer 4b that is the closest to the LED chip 6 may be referred to as a first ceramic layer 4b, and the lowermost ceramic layer 4a that is the farthest from the LED chip 6 may be referred to as a second ceramic layer 4a, for convenience of description.

The first ceramic layer 4b may be made of alumina ($Al_2O_3$), for example. The first ceramic layer 4b may be an alumina substrate, for example. When the first ceramic layer 4b is the alumina substrate, the particle diameter of alumina particles of the alumina substrate is preferably in a range between 1 μm to 30 μm. The larger the particle diameter of the alumina particles, the smaller the reflectance of the first ceramic layer 4b. The smaller the particle diameter of the alumina particles, the larger the scattering effect of the first ceramic layer 4b. In short, reducing the reflectance and increasing the scattering effect are in a trade-off relationship.

The aforementioned particle diameter is determined by a number-size distribution curve. Here, the number-size distribution curve is obtained by measuring a particle size distribution by an imaging method. Specifically, the particle diameter is determined by a particle size (two-axis average diameter) and the number of particles determined by image processing of a SEM image obtained by scanning electron microscope (SEM) observation. In the number-size distribution curve, the particle diameter value at the integrated value of 50% is referred to as a median diameter ($d_{50}$), and the aforementioned particle diameter refers to the median diameter.

Figure 9:
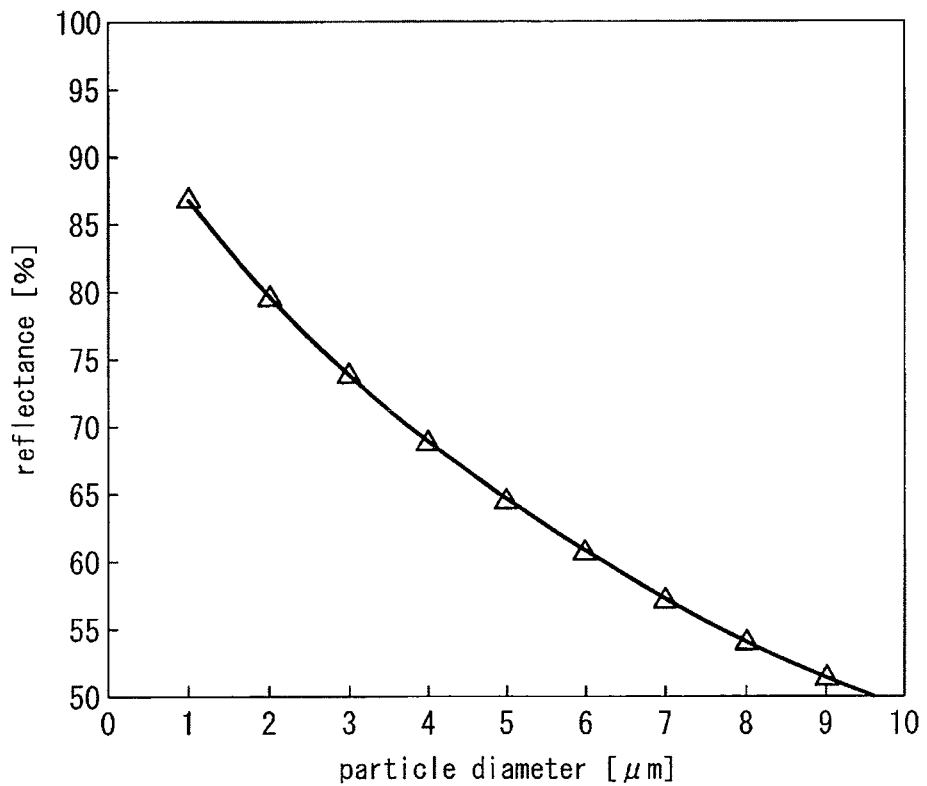
FIG. 9 is an explanatory diagram of the relation between a particle diameter and reflectance of an alumina particle.

Note that, FIG. 9 shows a theoretical relation between the particle diameter and the reflectance of a spherical alumina particle in the alumina substrate. The smaller the particle diameter, the higher the reflectance. The relation of the first ceramic layer 4b between the median diameter ($d_{50}$) and the measured value of reflectance is approximately the same as the theoretical value shown in FIG. 9. The reflectance is measured using a spectrophotometer and an integrating sphere.

The second ceramic layer 4a may be made of, for example, a composite material that contains $SiO_2$, $Al_2O_3$, a material having a higher refractive index than $Al_2O_3$ (such as $ZrO_2$ and $TiO_2$), CaO, and BaO as components. In the second ceramic layer 4a, the particle diameter of $Al_2O_3$ particles is preferably in a range between 0.1 μm to 1 μm. The optical properties (such as reflectance, transmittance, and absorptance) of the second ceramic layer 4a can be adjusted by adjusting components, composition, particle diameter, thickness, or the like of the composite material. In the submount 4, when the first ceramic layer 4b and the second ceramic layer 4a are made of the same kind of material, the first ceramic layer 4b should be made of a material having the particle diameter larger than that for the second ceramic layer 4a.

Figure 10:
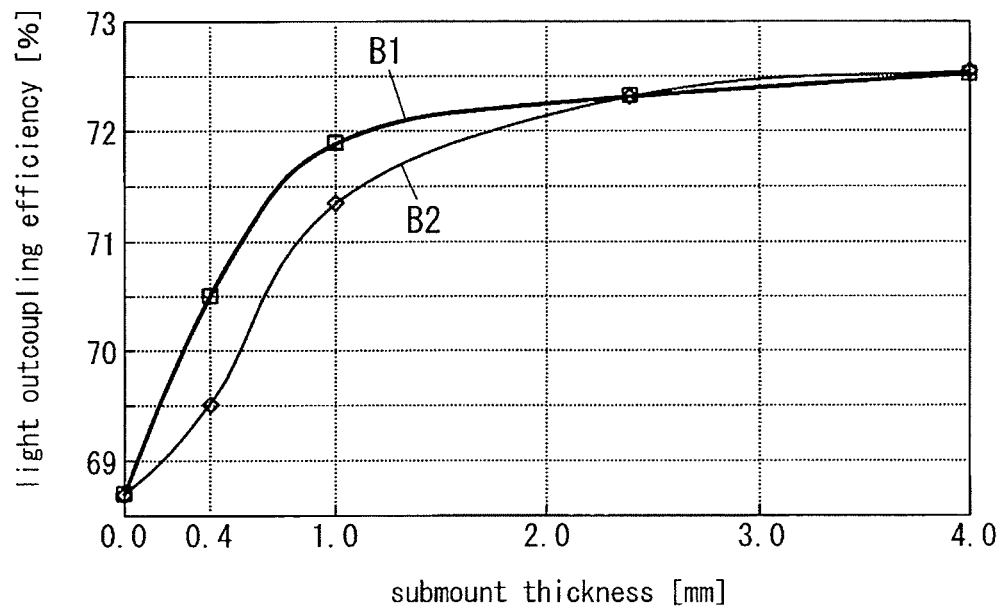
FIG. 10 is an explanatory diagram of a simulation result of the relation between a thickness of a submount and light outcoupling efficiency in an LED module of a comparative example.

Incidentally, the inventors selected, as a comparative example of the LED module 1 of the present embodiment, an LED module including the submount configured by a single layer of alumina substrate. Then, the inventors performed a simulation regarding light outcoupling efficiency of the comparative example of the LED module with a parameter which is the dimension of the submount of the LED module of the comparative example. FIG. 10 shows an example of the results. The simulation is a geometric optical simulation by Monte Carlo ray tracing. Note that, in the simulation, the reflectance of the surface 2sa of the opaque substrate 2 and the absorptance of the opaque substrate 2 are assumed to be 95% and 5%, respectively. Also, in the simulation, the chip size of the LED chip 6 is assumed to be 0.5 mm by 0.24 mm.

In FIG. 10, the horizontal axis represents a thickness of the submount, and the vertical axis represents light outcoupling efficiency. A curve denoted by "B1" in the diagram shows a case where the planar size of the submount is 1 mm sq. (1 mm by 1 mm), and a curve denoted by "B2" in the diagram shows a case where the planar size of the submount is 2 mm sq. (2 mm by 2 mm). From FIG. 10, it is inferred that, when the thickness of the submount is 2 mm or less, the light outcoupling efficiency decreases due to light absorption by the opaque substrate 2, regardless of the planar size of the submount.

Also, FIG. 10 teaches that, when the thickness of the submount is 2 mm or less, the light outcoupling efficiency is higher with a decrease in the planar size of the submount.

Figure 11:
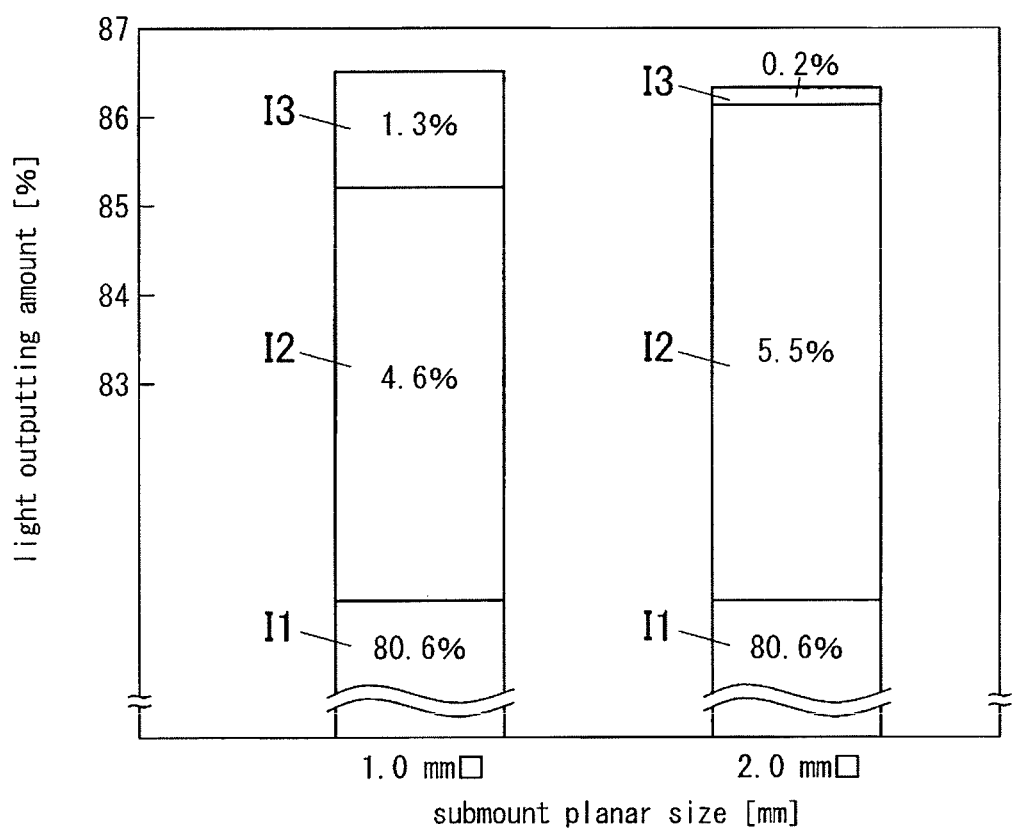
FIG. 11 is an explanatory diagram of a simulation result of the relation between a planar size of the submount and a light outputting amount of the LED module of the comparative example.

Besides, the inventors simulated a ratio between light emission amounts from the faces of the LED module, regarding the LED modules of the comparative examples each including the submount constituted by the alumina substrate only. The submounts had the same thickness of 0.4 mm, and the planar sizes of 1 mm sq. (1 mm by 1 mm) and 2 mm sq. (2 mm by 2 mm), respectively. FIG. 11 shows an example of the results. This simulation is a geometric optical simulation by Monte Carlo ray tracing. Note that, in the simulation, the reflectance of the surface 2sa of the opaque substrate 2 and the absorptance of the opaque substrate 2 are assumed to be 95% and 5%, respectively. Also, in the simulation, the chip size of the LED chip 6 is assumed to be 0.5 mm by 0.24 mm. Also, in the simulation, only a Fresnel loss is assumed to occur at the side faces of the LED chip 6.

Reference sign "I1" in FIG. 11 denotes a ratio of the outputted light amount directly from the LED chip 6. Reference sign "I2" in FIG. 11 denotes a ratio of the outputted light amount from an exposed surface (exposed portion of the surface of the submount) of the submount at the side of the LED chip 6. Reference sign "I3" in FIG. 11 denotes a ratio of the outputted light amount from the side faces of the submount.

From the results in FIGS. 10 and 11, the inventors obtained knowledge that the smaller the planar size of the submount 4, the higher the ratio of the outputted light amount from the side faces 4sc of the submount 4, and as a result the light outcoupling efficiency can be improved.

Moreover, the inventors investigated a relation between the thickness of the submount and the light flux emitted by the LED module with respect to various opaque substrates 2 in condition that a planar size of the submount is 2 mm sq. (2 mm by 2 mm). The light flux is measured by an integrating sphere. As the result, the inventors obtained an experimental result shown in FIG. 12. In the experiment, as the LED chip 6, adopted was a blue LED chip in which the substrate was a sapphire substrate and the emission peak wavelength from the light-emitting layer was 460 nm. The chip size of the LED chip 6 was 0.5 mm by 0.24 mm. The color conversion portion 10 was composed of a silicone resin and a yellow fluorescent material. The white circles (○) in line C1 in FIG. 12 denote measured values of light flux with respect to an LED module of Reference Model 1. In the LED module of Reference Model 1, the submount was an alumina substrate, and the opaque substrate 2 was a silver substrate having reflectance of 98% with respect to light with a wavelength of 460 nm. The white triangles (Δ) in line C2 in FIG. 12 designate measured values of light flux with respect to an LED module of Reference Model 2. In the LED module of Reference Model 2, the submount was an alumina substrate, and the opaque substrate 2 was a substrate including a copper substrate and a reflection layer composed of a white mask having reflectance of 92% with respect to light with a wavelength of 460 nm on a surface of the copper substrate. The white rhombuses (◊) in line C3 in FIG. 12 designate measured values of light flux with respect to an LED module of Reference Model 3. In the LED module of Reference Model 3, the submount was an alumina substrate, and the opaque substrate 2 was an aluminum substrate having reflectance of 95% with respect to light with a wavelength of 460 nm.

Figure 12:
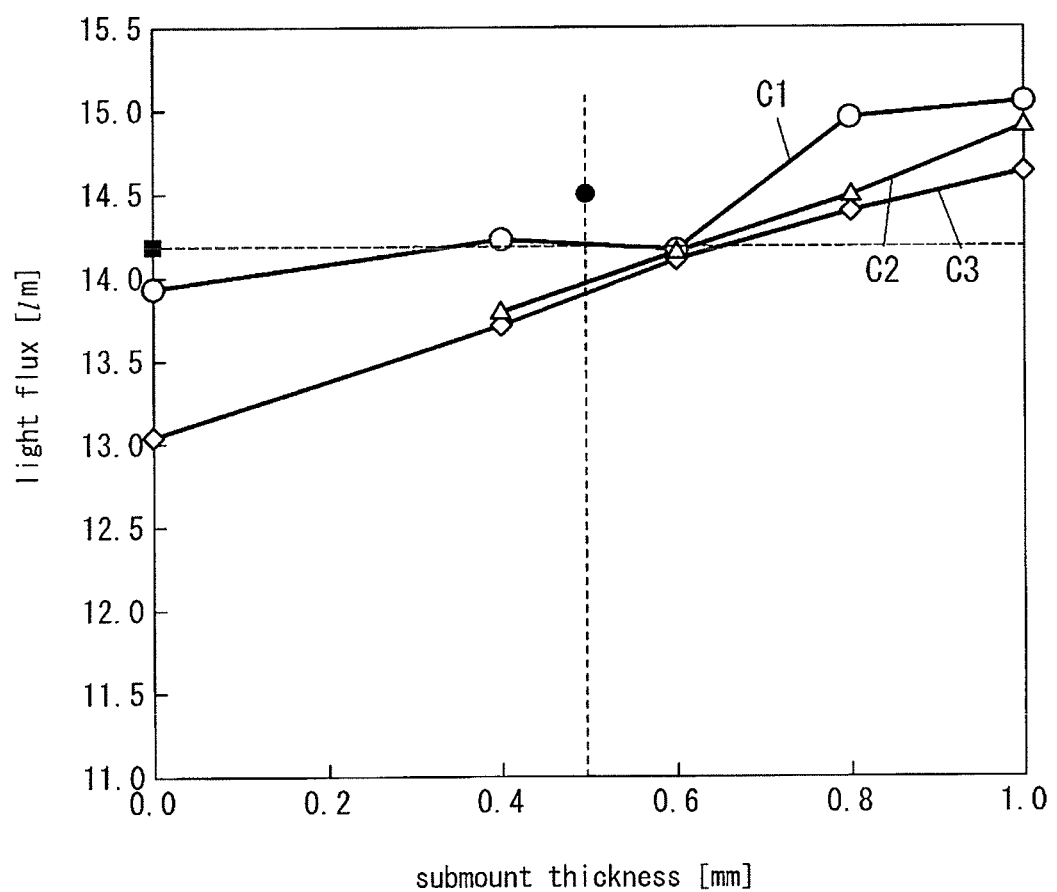
FIG. 12 is an explanatory diagram of an experimental result of the relation between a thickness of the submount and light outcoupling efficiency.

From values denoted by reference signs C1, C2, and C3 in FIG. 12, it is inferred that the light outcoupling efficiency of the LED module 1 of the present embodiment can be improved by increasing the thickness of the submount 4. Also, when the LED module 1 of the present embodiment has a configuration of including the opaque substrate 2, it is speculated that the light outcoupling efficiency can be improved by using a silver substrate as the opaque substrate 2 similarly to Reference Model 1.

On the other hand, from a viewpoint of efficiently dissipating heat generated in the LED chip 6 to the further surface of the opaque substrate 2 (that is, from a viewpoint of improving the heat dissipation property), it is preferable that the submount 4 is thinner. In short, the light outcoupling efficiency and the heat dissipation property are in a trade-off relationship.

Moreover, the inventors fabricated an LED module having a reference structure in which the submount 4 was not provided and a high purity alumina substrate was used as the opaque substrate 2, and performed an experiment of measuring a light flux emitted by the LED module having the reference structure. The black square (■) in FIG. 12 designates measured values of light flux with respect to the LED module having the reference structure. The inventors obtained an experimental result that, the LED module of aforementioned Reference Model 1 is required to include the submount having the thickness of 0.4 mm or more to emit greater light flux than the LED module having the reference structure. Therefore, the inventors considered that it is preferable to adjust the thickness of the submount to an approximate range of 0.4 mm to 0.5 mm, in view of the light outcoupling efficiency and the heat dissipation property. Note that, with regard to the alumina substrate used in the LED module having the reference structure, the thickness of the alumina substrate is 1 mm, the particle diameter of particles constituting the alumina substrate is 1 μm, and the reflectance of the alumina substrate is 91%.

In the LED module of Reference Model 1 in which the silver substrate was used as the opaque substrate 2, there is concern that the reflectance may decrease due to sulfurization of the silver substrate. In the LED module of Reference Model 2 in which the reflection layer composed of the white mask is used, there is concern that the reflectance may decrease due to thermal degradation of the white mask.

Accordingly, in the LED module 1 of the present embodiment, the opaque substrate 2 includes a base material (cupper substrate) made of cupper and a reflection layer composed of the white mask layer provided on a surface of the base material, and the submount 4 is the light-transmissive member having a configuration in which the second ceramic layer 4a and the first ceramic layer 4b are stacked in the thickness direction.

The inventors performed an experiment of measuring light flux emitted by Reference Example 1. Reference Example 1 is according to an LED module of Reference Model 4, which had the substantially same configuration as that of the LED module 1 of the present embodiment but included the patterned wiring circuit 8 on the surface 2sa of the opaque substrate 2 instead of on the submount 4. In Reference Example 1, the submount 4 had the thickness Hs (refer to FIG. 2) of 0.5 mm, the second ceramic layer 4a had the thickness Hsa (refer to FIG. 2) of 0.1 mm and the reflectance of 96% to light with a wavelength of 450 nm, and the first ceramic layer 4b had the thickness Hsb (refer to FIG. 2) of 0.4 mm and the reflectance of 80% to light with a wavelength of 450 nm. The black circle (●) in FIG. 12 designates a measured value of light flux with respect to Reference Example 1. FIG. 12 teaches that the LED module 1 of Reference Example 1 emits a greater light flux than the LED module having the reference structure. Also, from FIG. 12, it is speculated that the LED module 1 of Example 1 emits a greater light flux than those of Reference Models 1, 2, and 3 in which the submount 4 has the thickness of 0.5 mm.

Figure 13:
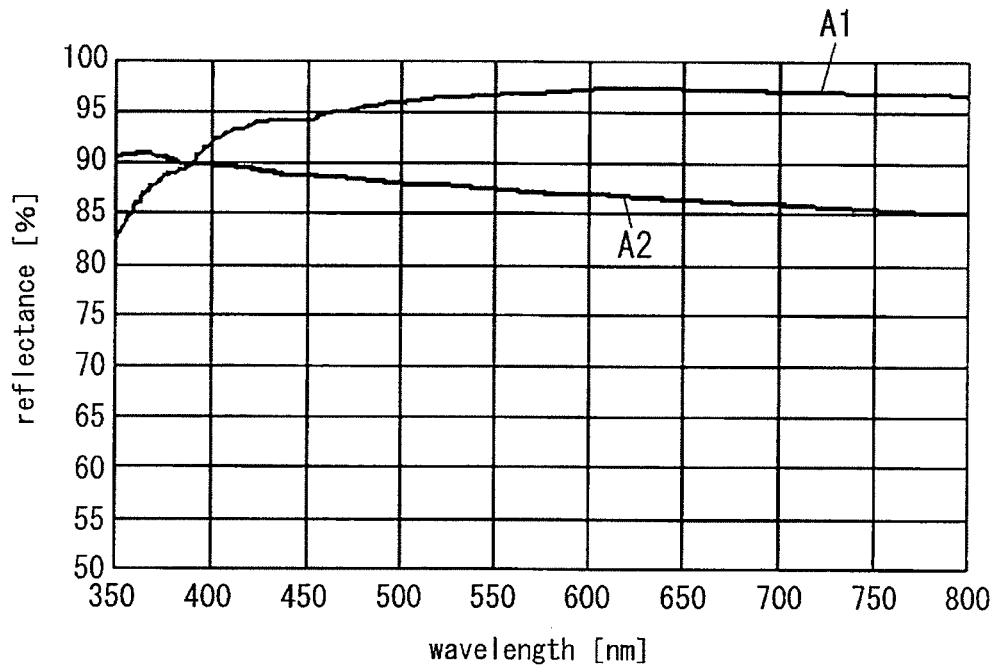
FIG. 13 is a reflectance-wavelength characteristic diagram of a submount and an alumina substrate in Reference Example 1 of Reference Model 4.

Note that, reflectance-wavelength characteristics of the submount 4 in Reference Example 1 are as shown by a curve denoted by reference sign A1 in FIG. 13, and reflectance-wavelength characteristics of a single layer alumina substrate with a thickness of 0.4 mm are as shown by a curve denoted by reference sign A2 in FIG. 13. Note that the alumina substrate has the same specification as those of the alumina substrates in Reference Models 1, 2, and 3. The reflectance-wavelength characteristics shown in FIG. 13 were measured using a spectrophotometer and an integrating sphere.

Moreover, the inventors performed an experiment to measure light flux and chromaticity of light emitted from the LED module 1. In the experiment, the measurement was made for each of the different particle diameters (median diameter) of the alumina particle in the first ceramic layer 4b. In the experiment, the LED chip 6 was a blue LED chip in which the substrate was a sapphire substrate and the emission peak wavelength from the light-emitting layer was 460 nm. The chip size of the LED chip 6 was 0.5 mm by 0.24 mm. The thickness and the planar size of the submount 4 were 0.49 mm and 2 mm sq. (2 mm by 2 mm), respectively.

The chromaticity is a psychophysical property of color that is determined by chromaticity coordinates in an xy chromaticity diagram of a CIE color system. The chromaticity was measured in a direction in which the radiation angle of light emitted from the LED module 1 is 0° (light axis direction), and in a direction in which the radiation angle is 60° (direction in which the angle relative to the light axis is 60°). In the measurement of the chromaticity, a spectral distribution in each of the radiation angles was obtained by a spectrophotometer, and the chromaticity in the CIE color system was calculated from each of the spectral distribution.

Figure 14:
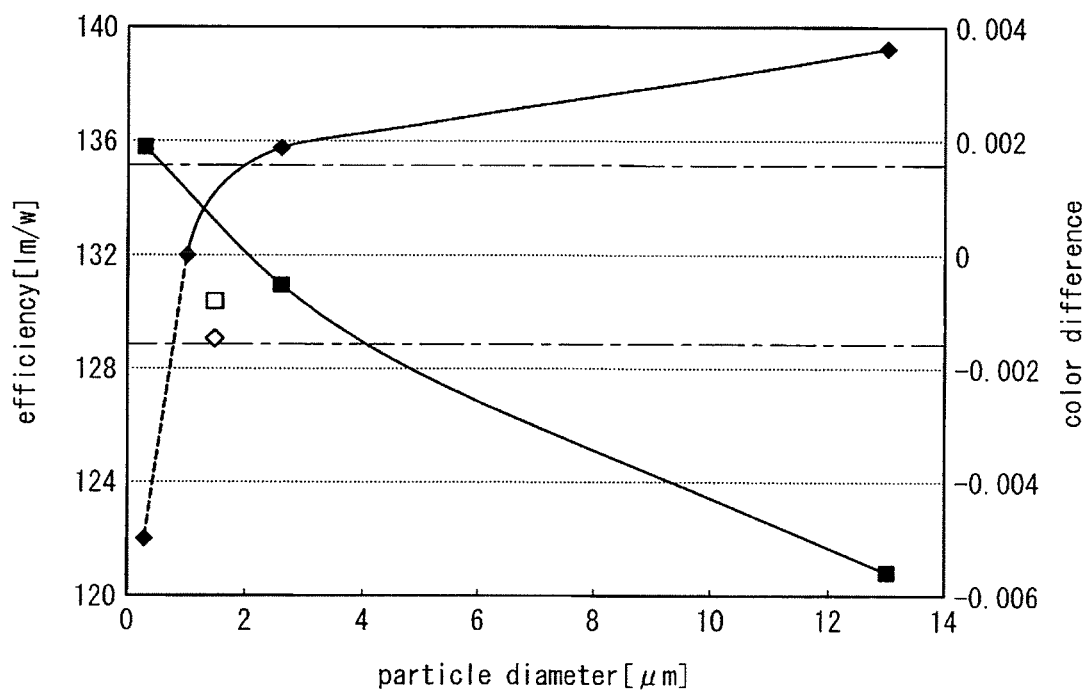
FIG. 14 is an explanatory diagram of an experimental result of the relation between a particle diameter of an alumina particle in a first ceramic layer and efficiency and color difference.

The experimental results are summarized in FIG. 14. The horizontal axis in FIG. 14 indicates a particle diameter. The left vertical axis in FIG. 14 indicates efficiency calculated by a light flux and input power supplied to the LED module 1. The right vertical axis in FIG. 14 indicates a color difference. The color difference is defined as the value of x (hereinafter referred to as "$x_1$") in the direction in which the radiation angle is 60° in the chromaticity coordinates, when a value of x (hereinafter referred to as "$x_0$") in the direction in which the radiation angle is 0° in the chromaticity coordinates is set as a reference. That is, the color difference in the right vertical axis in FIG. 14 is a value of $(x_1-x_0)$. When the value of $(x_1-x_0)$ is positive, it means that the larger the absolute value thereof, the larger the shift of the chromaticity to the yellowish-white side. When the value of $(x_1-x_0)$ is negative, it means that the larger the absolute value thereof, the larger the shift of the chromaticity to the blue-white side. Note that the design value of the chromaticity in the LED module 1 is (0.33, 0.33). That is, the design value of x in the chromaticity coordinates is 0.33. The design value of the chromaticity is an example, and is not limited thereto.

The black rhombuses (♦) in FIG. 14 designate measured values of the efficiency of the LED module 1. The black squares (■) in FIG. 14 designate measured values of the color difference of the LED module 1. The white rhombus (◊) in FIG. 14 designates a measured value of the efficiency of the aforementioned LED module having the reference structure. The white square (□) in FIG. 14 designates a measured value of the color difference of the aforementioned LED module having the reference structure. Note that, since the LED module having the reference structure does not include the submount 4, the particle diameter in the horizontal axis in FIG. 14 shows a particle diameter of particles in the alumina substrate.

The allowable range of the color difference in the LED module 1 is preferably in a range between −0.0015 to 0.0015, for example, from a viewpoint of suppressing color unevenness and a viewpoint of realizing a color difference similar to the color difference of the LED module having the reference structure or less.

FIG. 14 teaches that the LED module 1 has higher efficiency than the LED module having the reference structure. Also, from FIG. 14, it is inferred that the efficiency of the LED module 1 can be increased compared with that of the LED module having the reference structure by setting the particle diameter in a range between 1 μm to 4 μm, while suppressing the color difference from exceeding the allowable range (in other words, becoming larger than the color difference of the LED module having the reference structure).

The first ceramic layer 4b is a first dense layer composed of ceramics sintered at a high temperature in an approximate range of 1500° C. to 1600° C. The first ceramic layer 4b has good rigidity compared with the second ceramic layer 4a, since ceramic particles are bound strongly to each other by the high temperature sintering. Here, the good rigidity indicates that a flexural strength is relatively high. As a material of the first ceramic layer 4b, alumina is preferable.

The second ceramic layer 4a is composed of ceramics sintered at 1000° C. or less (850° C. to 1000° C., for example) which is a relatively low temperature compared with the sintering temperature of the first ceramic layer 4b. The ceramics constituting the second ceramic layer 4a may be a second dense layer which contains a ceramic filler (ceramic microparticles) and a glass component, or a porous layer containing a ceramic filler (ceramic microparticles) and a glass component, for example.

The second dense layer is composed of dense ceramics in which ceramic fillers are bound each other by sintering and glass components are arranged around the ceramic fillers as a matrix. In the second dense layer, the ceramic filler mainly performs a function of reflecting light. The second dense layer may be made of borosilicate glass, glass ceramics which contains lead borosilicate glass and alumina, a material in which a ceramic filler is mixed to glass ceramics which contains soda-lime glass and alumina, or the like. The glass content of the glass ceramics is preferably set in a range of around 35 to 60 wt %. The ceramics content of the glass ceramics is preferably set in a range of around 40 to 60 wt %. Note that, in the second dense layer, the zinc component of the lead borosilicate glass can be substituted for titanium oxide or tantalum oxide to increase refractive index of the glass ceramics. The ceramic filler is preferably made of a material having higher refractive index than glass ceramics, and may be, for example, tantalum pentoxide, niobium pentoxide, titanium oxide, barium oxide, barium sulfate, magnesium oxide, calcium oxide, strontium oxide, zinc oxide, zirconium oxide, or silicate oxide (zircon).

Figure 15:
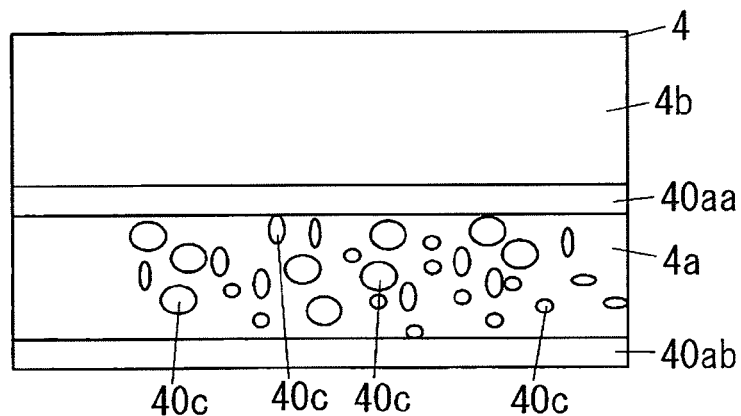
FIG. 15 is a schematic explanatory diagram of the submount in the LED module of Embodiment 1.

When the second ceramic layer 4a is constituted by a porous layer (hereinafter, "second ceramic layer 4a" is also referred to as "porous layer 4a"), it is preferable that a first glass layer 40aa is interposed between a porous layer 4a having a plurality of pores 40c and the first ceramic layer 4b, and a second glass layer 40ab is formed on an opposite side of the porous layer 4a from the first ceramic layer 4b, as shown in the schematic diagram in FIG. 15. The porosity of the porous layer 4a is set to be around 40%, but is not limited thereto. The first glass layer 40aa and the second glass layer 40ab are transparent layers composed of a glass component and transmit visible light. The thicknesses of the first glass layer 40aa and the second glass layer 40ab may be set to around 10 µm, for example, but are not limited thereto. Around half of the glass component of each of the first glass layer 40aa and the second glass layer 40ab is composed of SiO$_2$, but the glass component is not limited thereto.

The first glass layer 40aa is provided so as to be interposed between the porous layer 4a and the first ceramic layer 4b, and is closely-attached to the surface of the porous layer 4a and to the surface of the first ceramic layer 4b by sintering at the time of manufacture.

The second glass layer 40ab is provided on the opposite face of the porous layer 4a from the first ceramic layer 4b, and protects the porous layer 4a. Accordingly, pores 40c that exist on the opposite surface of the porous layer 4a from the first ceramic layer 4b is enclosed by the second glass layer 40ab.

The porous layer 4a contains a ceramic filler (ceramic particulate) and a glass component. In the porous layer 4a, the ceramic fillers are combined to form clusters by sintering so as to form a porous structure. The glass component serves as a binder for the ceramic filler. In the porous layer 4a, the ceramic filler and the plurality of pores mainly perform a function of reflecting light. Note that, the porous layer 4a can be formed in accordance with a manufacturing process of a package disclosed in paragraphs [0023]-[0026] and in FIG. 4 in WO2012/039442 A1.

Figure 16:
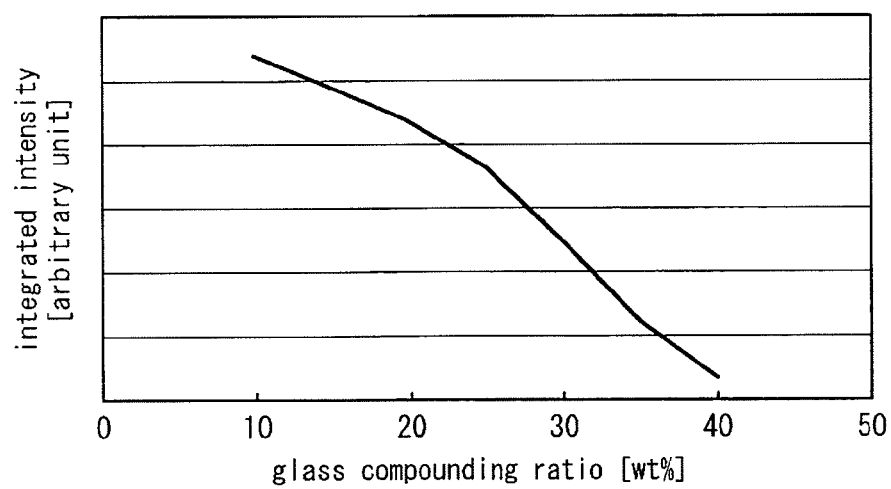
FIG. 16 is an explanatory diagram of the relation between a glass compounding ratio of the submount in the LED module of Embodiment 1 and integrated intensity of an integrating sphere.

The reflectance of the porous layer 4a can be changed by, for example, changing a weight ratio between the glass component and the ceramic component (such as alumina and zirconia). That is, the reflectance of the porous layer 4a can be changed by changing the glass compounding ratio. In FIG. 16, the horizontal axis indicates a glass compounding ratio, and the vertical axis indicates an integrated intensity measured with an integrating sphere. In measurement with the integrating sphere, intensities of reflected light with wavelengths between 380 to 780 nm are integrated. FIG. 16 teaches that the reflectance can be increased with a decrease in the glass compounding ratio.

Figure 17:
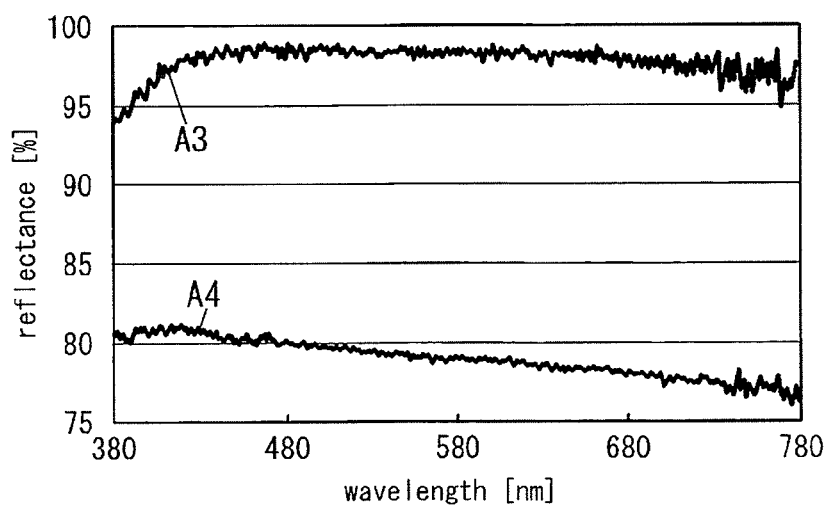
FIG. 17 is a reflectance-wavelength characteristic diagram of the submount and an alumina substrate in Example 1 of Embodiment 1.

Accordingly, in Example 1, the first ceramic layer 4b is formed by sintering alumina at 1600° C., and the porous layer 4a is formed by sintering materials at 850° C., the materials being compounded such that the weight ratio of the glass component to the ceramic component is 20:80. In Example 1, the glass component is borosilicate glass with a median diameter of around 3 µm, and the alumina is a compound of alumina with a median diameter of around 0.5 µm and alumina with a median diameter of around 2 µm, and the zirconia has a median diameter of around 0.2 µm. In Example 1, the first ceramic layer 4b has the thickness of 0.38 mm, and the porous layer 4a has the thickness of 0.10 mm. The reflectance-wavelength characteristics of the submount 4 in Example 1 is indicated by a curve designated by "A3" in FIG. 17, and the reflectance-wavelength characteristics of the single layer alumina substrate with a thickness of 0.38 mm is as shown by a curve designated by "A4" in FIG. 17. Note that, the weight ratio of the glass component to the ceramic component in the porous layer 4a and the particle diameters (median diameters) of the respective materials are not particularly limited.

The porous layer 4a has a graded composition in which the density of the glass component gradually decreases from the both sides thereof to the inside in the thickness direction, since the glass components of the first glass layer 40aa and the second glass layer 40ab infiltrate at the time of manufacture.

Specifically, as the result of observing a cross-section along the thickness direction of the porous layer 4a with a thickness of around 100 µm with a microscope, it was found out that in regions from respective faces of the porous layer 4a to the depth of around 20 µm in the thickness direction, glass dense layers exist in which glass occupies 70% or more of the area per unit area. In contrast to this, in the internal region deeper than 20 µm from respective faces of the porous layer 4a in the thickness direction, glass occupies around 20% of the area per unit area, and a non-dense layer exists in which the glass and the ceramic filler are mixed at a certain ratio.

In the LED module 1 of the present embodiment, the submount 4 is constituted by the two ceramic layers 4a and 4b, and optical properties of the ceramic layers 4a and 4b differ from each other, and the ceramic layer 4a which is further from the LED chip 6 has a higher reflectance with respect to light emitted from the LED chip 6 than the ceramic layer 4b that is closer to the LED chip 6. Accordingly, light outcoupling efficiency of the LED module 1 of the present embodiment can be improved compared with that of a LED module including the submount 4 which is constituted by a single layer alumina substrate. In the LED module 1 of the present embodiment, it is possible to reduce an amount of light reflected from the face 4sa of the submount 4, and as a result, absorption loss in the LED chip 6 can be reduced. Furthermore, in the LED module 1 of the present embodiment, absorptance of light (approximately 0%) of the submount 4 can be smaller than the absorptance of light (around 2 to 8%, for example) of the opaque substrate 2, and parts of light incident on the face 4sa of the submount 4 can be scattered in the ceramic layer 4b and can be reflected at the interface between the ceramic layer 4b and the ceramic layer 4a. Consequently, in the LED module 1, it is possible to reduce an amount of light which passes through the submount 4 and arrives at the surface 2sa of the opaque substrate 2 and absorption loss at the opaque substrate 2. As a result, light outcoupling efficiency can be improved.

Incidentally, in the LED module 1 of the present embodiment, the first ceramic layer 4b has relatively higher light transmittance, and the second ceramic layer 4a has relatively higher light scattering rate, out of the first ceramic layer 4b and the second ceramic layer 4a. Accordingly, it is inferred that, in the LED module 1, light can be diffused in the second ceramic layer 4a that is farther from the LED chip 6, and an amount of light that is diffused before arriving at the opaque substrate 2 increases compared with a LED module having only the first ceramic layer 4b. Also, it is speculated that, in the LED module 1, the possibility that light reflected by the opaque substrate 2 directly below the submount 4 is diffused without returning to the LED chip 6 can be increased. In contrast, it is speculated that, in the LED module 1, when the submount 4 is constituted by only the second ceramic layer 4a, the possibility that light is scattered in the vicinity of the LED chip 6 and then returns to the LED chip 6 may be increased, unfortunately, because the possibility that light emitted from the LED chip 6 toward the submount 4 is scattered in a vicinity of the LED chip 6 may be increased. Consequently, it is speculated that, in the LED module 1, it is possible to reduce an amount of light returning to the LED chip 6, compared with a LED module including the submount 4 constituted by only the second ceramic layer 4a. Moreover, in the LED module 1, it is possible to reduce the thickness of the submount 4 required to obtain the same reflectance, compared with the submount 4 constituted by only the first ceramic layer 4b.

The color conversion portion 10 is formed on the submount 4 and has a hemispherical shape so as to cover the LED chip 6 and a portion of each of the wires 7. Therefore, the LED module 1 preferably includes an encapsulating portion (not shown) which covers the exposed portion of each of the wires 7 and the color conversion portion 10. The encapsulating portion is preferably made of a transparent material. The transparent material of the encapsulating portion may be, for example, a silicone resin, an epoxy resin, an acrylic resin, glass, or an organic and inorganic hybrid material in which an organic component and an inorganic component are mixed and/or combined at a nanometer level or molecular level. The transparent material of the encapsulating portion is preferably a material having a linear expansion coefficient which is close to that of the transparent material of the color conversion portion 10, and is more preferably a material having a linear expansion coefficient that is the same as that of the transparent material of the color conversion portion 10. Accordingly, in the LED module 1, it is possible to suppress the concentration of stress on each of the wires 7 in a vicinity of the interface between the encapsulating portion and the color conversion portion 10 due to the difference between the linear expansion coefficients of the encapsulating portion and the color conversion portion 10. Consequently, in the LED module 1, disconnection of wires 7 can be suppressed. Furthermore, in the LED module 1, it is possible to suppress the occurrence of cracks in the encapsulating portion or in the color conversion portion 10 due to the difference between the linear expansion coefficients of the encapsulating portion and the color conversion portion 10. The encapsulating portion is preferably formed in a hemispherical shape, but the shape thereof is not limited thereto, and may be a semiellipse spherical shape or a semicircular columnar shape. The shape of the color conversion portion 10 is not limited to a hemispherical shape, and may be a semiellipse spherical shape or a semicylinderical shape.

Figure 18:
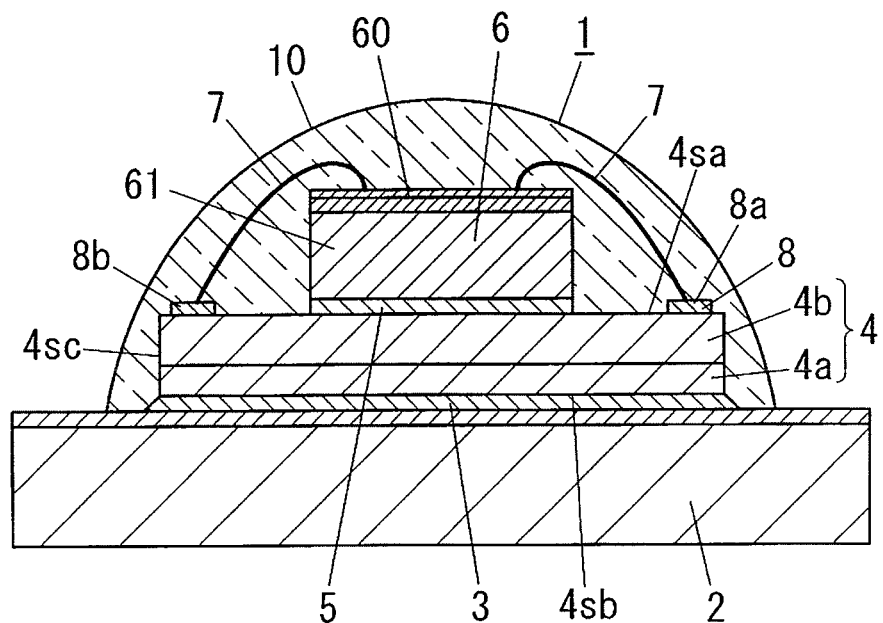
FIG. 18 is a schematic cross-section illustrating the first modification of the LED module of Embodiment 1.

The color conversion portion 10 may be formed in a hemispherical shape which covers the LED chip 6, the wires 7, and the submount 4, similarly to that of the LED module 1 of the first modification of shown in FIG. 18.

With regard to the first modification shown in FIG. 18, the reason why the light outcoupling efficiency of the LED module 1 is improved will be described with reference to the inferred mechanism diagrams in FIGS. 19, 20A, 20B, and 20C. Note that the first modification is in the scope of the present invention, even if the inferred mechanism is different from the mechanism described below.

Figure 19:
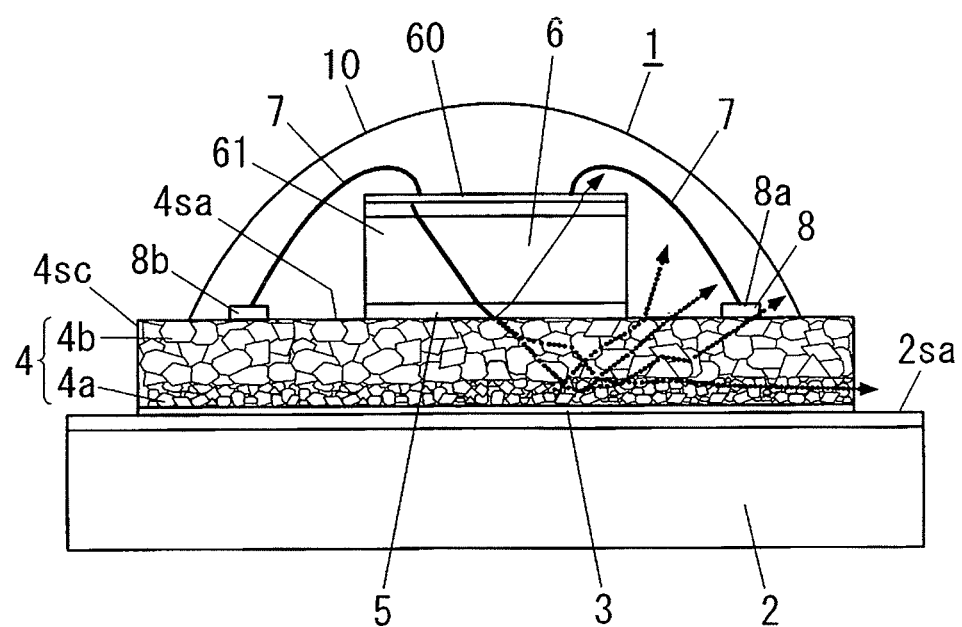
FIG. 19 is an inferred mechanism diagram for illustrating the principle relating to improvement of light outcoupling efficiency in the first modification of the LED module of Embodiment 1.
Figure 20:
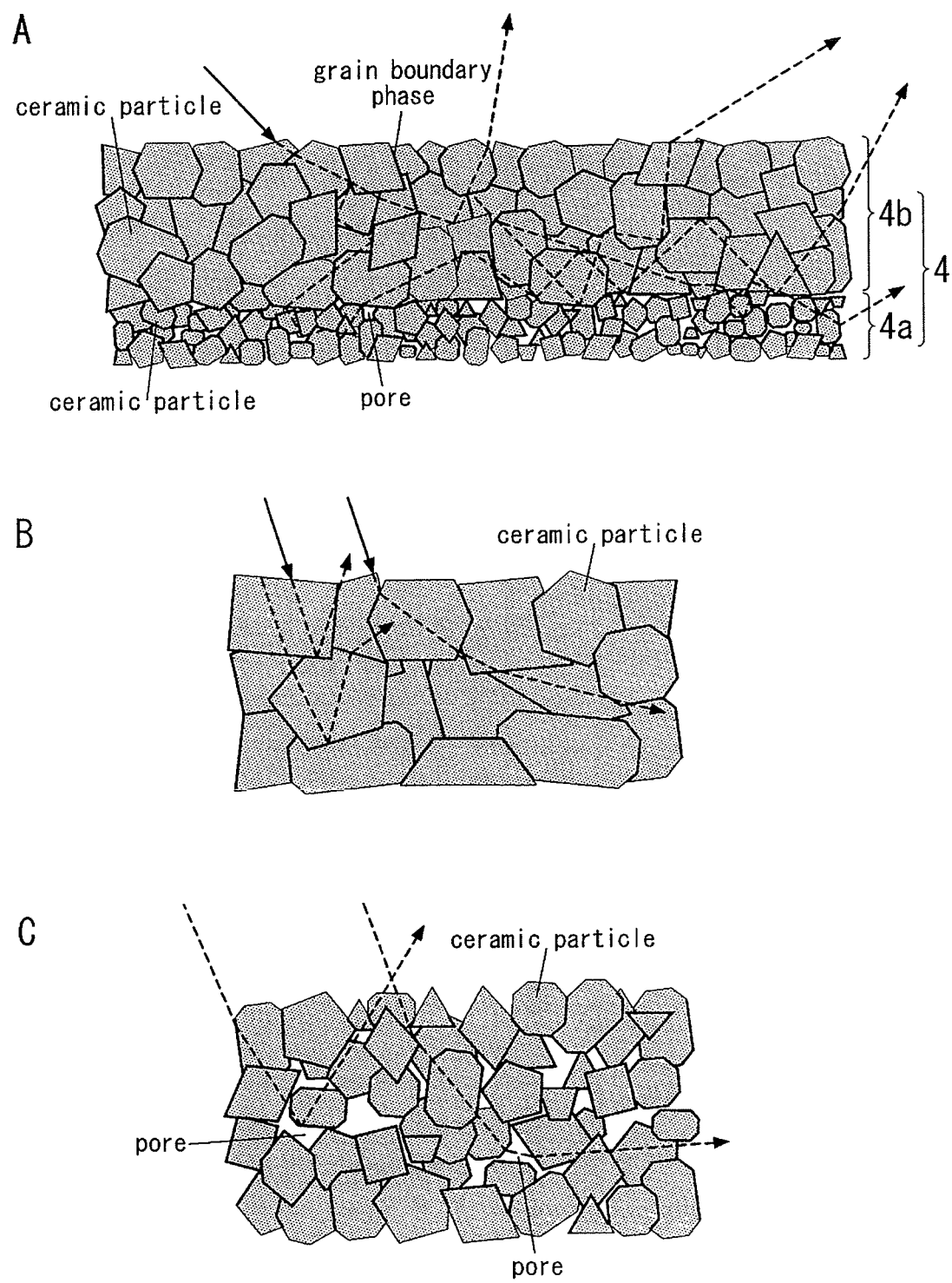
FIGS. 20A to 20C are inferred mechanism diagrams for illustrating the principle relating to improvement of light outcoupling efficiency in the first modification of the LED module of Embodiment 1.

Arrows shown in FIGS. 19, 20A, 20B, and 20C schematically illustrate propagating paths of rays of light which are emitted from the light-emitting layer of the LED structure portion 60 in the LED chip 6. Solid-line arrows in FIGS. 19, 20A, and 20B schematically illustrate propagating paths of rays of light which are emitted from the light-emitting layer and are reflected by the face 4sa of the submount 4. Broken-line arrows in FIGS. 19, 20A, 20B, and 20C schematically illustrate propagating paths of rays of light which are emitted from the light-emitting layer of the LED structure portion 60 and enter the submount 4.

The inventors inferred that, as shown in FIGS. 19, 20A, and 20B, reflection and refraction occur in the first ceramic layer 4b at the interface between the ceramic particles and the grain boundary phase (glass component is the main component therein) caused by a difference between the refractive indices of the ceramic particle and the grain boundary phase. Also, the inventors inferred that, as shown in FIGS. 19 and 20C, reflection and refraction occur in the second ceramic layer 4a at the interface between the ceramic particle and the pore and the grain boundary phase (glass component is the main component) caused by a difference between the refractive indices of the ceramic particle and the pore and the grain boundary phase. Also, the inventors inferred that, as shown in FIGS. 19 and 20C, reflection and refraction occur in the second ceramic layer 4a at the interface between the pore and the grain boundary phase caused by a difference between the refractive indices of the pore and the grain boundary phase. Also, the inventors inferred that, with respect to a ceramic plate, when the plate thickness is the same, the larger the particle diameter of the ceramic particles in the plate, the smaller the reflectance and the larger the transmittance, since the larger the particle diameter of the ceramic particles, the smaller the number of interfaces, and the probability that light passes through the interface between the ceramic particles and the grain boundary phase is reduced when light propagates a unit length.

The inventors inferred that light outcoupling efficiency of the LED module 1 can be improved by causing light emitted from the LED chip 6 to pass through the first ceramic layer 4b as much as possible, and causing the light to be reflected in the second ceramic layer 4a as much as possible. Therefore, it is preferable that, in the submount 4, the first ceramic layer 4b includes ceramic particles having a greater particle diameter than the second ceramic layer 4a while the second ceramic layer 4a includes ceramic particles having a smaller particle diameter than the first ceramic layer 4b and further include pores.

Figure 21:
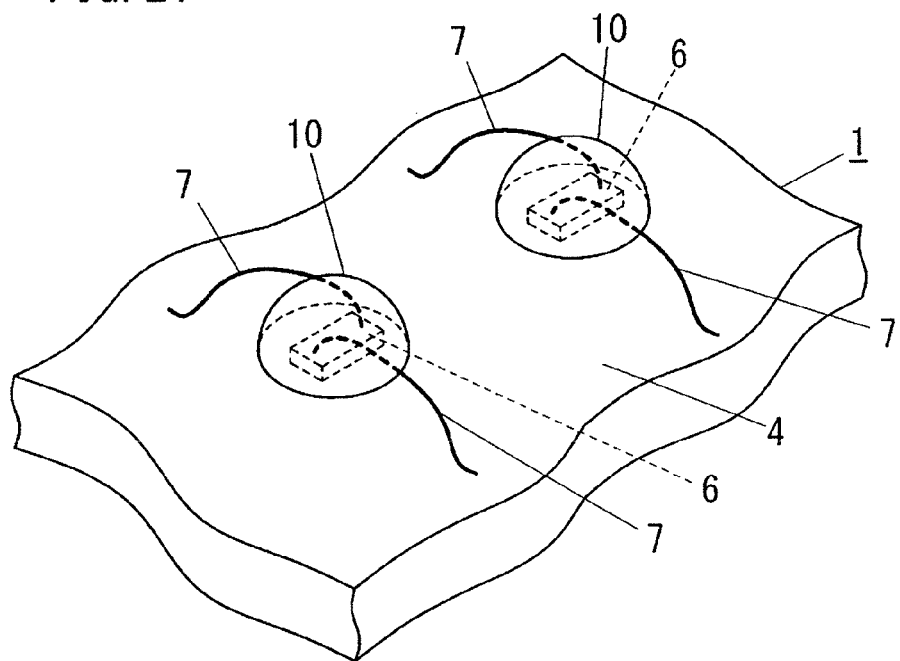
FIG. 21 is a schematic perspective view of the second modification of the LED module of Embodiment 1 with a partial cutaway thereof.

In the LED module 1, the submount 4 may have an elongated shape, and a plurality of LED chips 6 may be arranged along the longitudinal direction of the submount 4. In this case, in the LED module 1, the wires 7 may extend along a direction perpendicular to the arrangement direction of the LED chips 6, and the color conversion portions 10 may have a hemispherical shape to cover the respective LED chips 6 and portions of the respective wires 7 on the submount 4, similarly to a LED module of the second modification shown in FIG. 21, for example. Note that, in FIG. 21, the patterned wiring circuit 8 in FIG. 1 is omitted.

Figure 22:
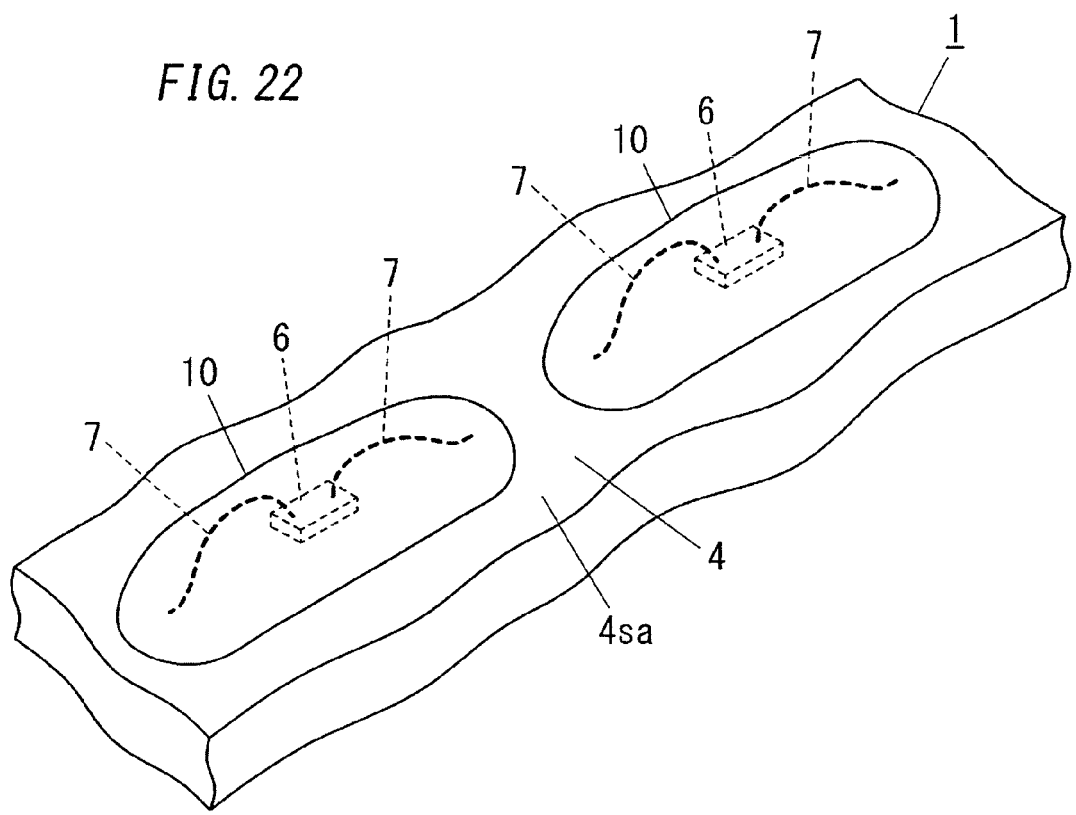
FIG. 22 is a schematic perspective view of the third modification of the LED module of Embodiment 1, which is partially exploded.

Alternatively, in the LED module 1, the wires 7 may extend along the arrangement direction of the LED chips 6, and the color conversion portions 10 may have a convex shape to cover the respective LED chip 6 and the respective wires 7, similarly to a LED module of the third modification shown in FIG. 22, for example. Note that, in FIG. 22, the patterned wiring circuit 8 in FIG. 1 is omitted.

In the LED module 1 of the present embodiment, the ceramic layers (first ceramic layer 4b and second ceramic layer 4a) of the submount 4 are light-transmissive layers having different optical properties.

The submount 4 is constituted by at least two light-transmissive layers stacked in the thickness direction, and has such a property that optical properties of the light-transmissive layers differ from each other, and a light-transmissive layer of the plurality of light-transmissive layers which is farther from the LED chip 6 is higher in reflectance in a wavelength range of the light emitted from the LED chip 6. Hereinafter, the uppermost light-transmissive layer which is the closest to the LED chip 6 may be referred to as a first light-transmissive layer, and the lowermost light-transmissive layer which is farther from the LED chip 6 may be referred to as a second light-transmissive layer.

The first light-transmissive layer is preferably composed of a material that has high transmittance with respect to light emitted from the LED chip 6, and has a refractive index close to the refractive index of the LED chip 6. The refractive index of the first light-transmissive layer being close to the refractive index of the LED chip 6 means that the difference between the refractive index of the first light-transmissive layer and the refractive index of the substrate 61 in the LED chip 6 is 0.1 or less, and is more preferably 0. The first light-transmissive layer is preferably composed of a material having a high thermal resistance.

The material of the first light-transmissive layer is not limited to ceramics, and may be glass, SiC, GaN, GaP, sapphire, an epoxy resin, a silicone resin, unsaturated polyester, or the like. The material of the ceramics is not limited to $Al_2O_3$, and may be another metal oxide (such as magnesia, zirconia, and titania), a metal nitride (such as aluminum nitride), or the like. As the material of the first light-transmissive layer, ceramics is more preferable than a single crystal from a viewpoint of causing light emitted from the LED chip 6 to be forward-scattered.

The light-transmissive ceramics may be LUMICERA® available from Murata Manufacturing Co., Ltd., HICERAM (product name) available from NGK Insulators, Ltd., or the like. LUMICERA® has a $Ba(Mg,Ta)O_3$-based complex perovskite structure as the main crystal phase. HICERAM is a light-transmissive alumina ceramic.

The first light-transmissive layer made of ceramic preferably include particles having the particle diameter of around 1 µm to 5 µm.

The first light-transmissive layer may be a single crystal in which voids, a modified portion having a different refractive index, or the like is formed. The voids, the modified portion, or the like may be formed by irradiating, with a laser beam from a femto-second laser, a scheduled formation region of the voids, the modified portion, or the like in the single crystal. The wavelength and the irradiation conditions of the laser beam from the femto-second laser may vary appropriately according to the material of the single crystal, the forming target (void or modified portion), the size of the forming target, or the like. The first light-transmissive layer may be made of a base resin (such as epoxy resin, silicone resin, and unsaturated polyester) (hereinafter, referred to as "first base resin") which contains a filler (hereinafter, referred to as "first filler") having a refractive index different from the base resin. It is more preferable that a difference between the refractive indices of the first filler and the first base resin is small. The first filler preferably has higher thermal conductivity. The first light-transmissive layer preferably has a high density of the first filler, from a viewpoint of increasing thermal conductivity. The shape of the first filler is preferably a sphere, from a viewpoint of suppressing total reflection of incident light. The larger the particle diameter of the first filler, the smaller the reflectivity and the refractivity thereof. The first light-transmissive layer may be configured such that a first filler having a relatively large particle diameter is present in a region of the first light-transmissive layer close to the LED chip 6 in the thickness direction, and a first filler having a relatively small particle diameter is present in a region thereof distant from the LED chip 6. In this case, the first light-transmissive layer may include a plurality of stacked layers having the first fillers with different particle diameters.

On the surface of the first light-transmissive layer close to the LED chip 6 (the face 4sa of the submount 4), a fine asperity structure portion is preferably formed around the mounting region of the LED chip 6 so as to suppress total reflection of light which is emitted from the LED chip 6 toward the submount 4 and is reflected by or refracted in the submount 4. The asperity structure portion may be formed by roughening the surface of the first light-transmissive layer by sandblast processing or the like. The surface roughness of the asperity structure portion is preferably such that an arithmetic average roughness Ra specified in JIS B 0601-2001 (ISO 4287-1997) is around 0.05 µm.

The submount 4 may have a configuration in which a resin layer having a smaller refractive index than the first light-transmissive layer is formed on the surface of the first light-transmissive layer close to the LED chip 6 around the mounting region of the LED chip 6. The material of the resin layer may be a silicone resin, an epoxy resin, or the like. The material of the resin layer may be a resin containing a fluorescent material.

The second light-transmissive layer is more preferably configured such that light emitted from the LED chip 6 is diffusely reflected, than configured such that the light is specularly reflected.

The material of the second light-transmissive layer is not limited to ceramics, and may be glass, SiC, GaN, GaP, sapphire, an epoxy resin, a silicone resin, unsaturated polyester, or the like. The material of the ceramics is not limited to $Al_2O_3$, and may be another metal oxide (such as magnesia, zirconia, and titania), a metal nitride (such as aluminum nitride), or the like.

The second light-transmissive layer made of ceramics preferably includes particles having the particle diameter of 1 µm or less, and more preferably include particles having the particle diameter of around 0.1 µm to 0.3 µm. Also, the second light-transmissive layer may be the aforementioned porous layer 4a. In a case where the first light-transmissive layer was the first ceramic layer 4b composed of alumina having purity of 99.5%, the bulk density of the first light-transmissive layer was 3.8 to 3.95 $g/cm^3$. In a case where the first light-transmissive layer was the first ceramic layer 4b composed of alumina having purity of 96%, the bulk density of the first light-transmissive layer was 3.7 to 3.8 $g/cm^3$. In contrast, in a case where the second light-transmissive layer was the porous layer 4a, the bulk density of the second light-transmissive layer was 3.7 to 3.8 $g/cm^3$. Note that, the aforementioned bulk density is a value estimated by image processing a SEM image observed and obtained by an SEM.

The second light-transmissive layer may be of a single crystal in which voids, a modified portion having a different refractive index, or the like is formed. The voids, the modified portion, or the like may be formed by irradiating, with a laser beam from a femto-second laser, a scheduled formation region of the voids, the modified portion, or the like in the single crystal. The wavelength and the irradiation conditions of the laser beam from the femto-second laser may vary appropriately according to the material of the single crystal, the forming target (void or modified portion), the size of the forming target, or the like. The second light-transmissive layer may be made of a base resin (such as epoxy resin, silicone resin, unsaturated polyester, and a fluorine resin) (hereinafter, referred to as "second base resin") which contains a filler (hereinafter, referred to as "second filler") having a refractive index different from the base resin. The second light-transmissive layer may be configured such that a second filler having a relatively large particle diameter is present in a region of the second light-transmissive layer close to the LED chip 6 in the thickness direction, and a second filler having a relatively small particle diameter is present in a region thereof distant from the LED chip 6. The material of the second filler is preferably, for example, a white inorganic material, and may be a metal oxide such as $TiO_2$ and ZnO. The particle diameter of the second filler is preferably in a range between around 0.1 µm to 0.3 µm, for example. The filling rate of the second filler is preferably in a range of around 50 to 75 wt %, for example. The silicone resin for the second base resin may be methyl silicone, phenyl silicone, or the like. In a case where the second filler is in a form of solid particle, it is preferable that there is a great difference between the refractive indices of the second filler and the second base resin. A material containing the second base resin and the second filler in the second base resin may be KER-3200-T1 available from Shin-Etsu Chemical Co., Ltd. or the like.

The second filler may be a core-shell particle, hollow particle, or the like. The refractive index of the core of the core-shell particle can be arbitrarily selected, but is preferably smaller than the refractive index of the second base resin. It is preferable that the hollow particle has a smaller refractive index than the second base resin, and that inside of the hollow particle is gas (such as air and inert gas) or vacuum.

The second light-transmissive layer may be a light diffusion sheet. The light diffusion sheet may be a white polyethylene terephthalate sheet having a plurality of bubbles, or the like.

The submount 4 may be formed by, in a case of both the first light-transmissive layer and the second light-transmissive layer being made of ceramics, stacking ceramic green sheets to be the first light-transmissive layer and the second light-transmissive layer individually and sintering the stacked sheets. Note that, in the submount 4, provided that the second light-transmissive layer includes bubbles, the first light-transmissive layer may include bubbles. In such a case, it is preferable that the first light-transmissive layer is smaller in the number of bubbles and higher in the bulk density than the second light-transmissive layer.

The first light-transmissive layer and the second light-transmissive layer are preferably composed of a material that has a high resistance to light and heat, which are emitted from the LED chip 6 and the fluorescent material.

The LED module 1 may include a reflection layer over the further face 4sb of the submount 4 to reflect light from the LED chip 6 or the like. The reflection layer may be made of silver, aluminum, a silver aluminum alloy, silver alloys other than the silver aluminum alloy, an aluminum alloy, or the like. The reflection layer may be constituted by a thin film, a metal foil, a solder mask (solder), or the like. The reflection layer may be provided on the submount 4, or may be provided on the opaque substrate 2.

Figure 23:
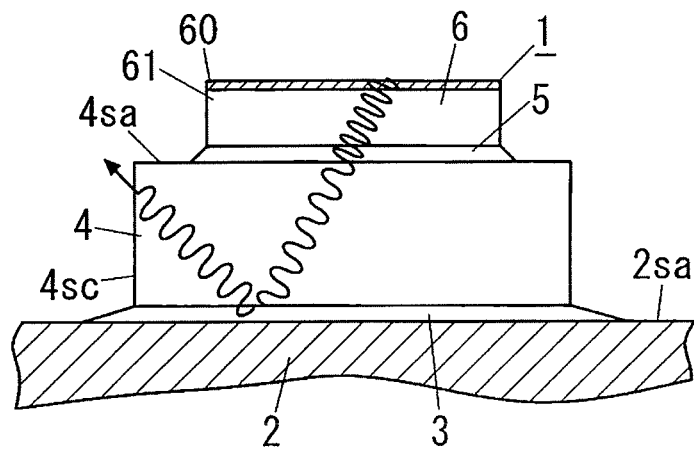
FIG. 23 is a main portion schematic cross-section of the fourth modification of the LED module of Embodiment 1.

Hereinafter, the fourth modification of the LED module 1 of the present embodiment will be described with reference to FIG. 23.

The LED module 1 of the fourth modification differs from the LED module 1 of Embodiment 1 in that the first bond 5 and the second bond 3 are both composed of a transparent material and a first fluorescent material. The second fluorescent material is a fluorescent material that is excited by the light emitted from the LED chip 6 to emit light having a different color from the emitted light of the LED chip 6. In short, the LED module 1 of the fourth modification differs from the LED module 1 of Embodiment 1 in that the first bond 5 and the second bond 3 contain the fluorescent material that is excited by the light emitted from the LED chip 6 to emit light having a different color from the emitted light of the LED chip 6. Note that, constituent elements similar to those in Embodiment 1 are provided with the same reference numerals, and redundant description thereof will be omitted. Also, in FIG. 23, illustrations of the wires 7 and the patterned wiring circuit 8 shown in FIG. 1 are omitted.

The fluorescent material functions as a wavelength conversion material that converts the light emitted from the LED chip 6 to light with a longer wavelength than the light from the LED chip 6. Accordingly, it is possible, using the LED module 1, to obtain mixed-color light constituted by light that is emitted from the LED chip 6 and light emitted from the fluorescent material.

When including a blue LED chip as the LED chip 6 and a yellow fluorescent material as the fluorescent material of the wavelength conversion material for example, the LED module 1 can emit white light. That is, in the LED module 1, blue light that is emitted from the LED chip 6 and light that is emitted from the yellow fluorescent material can pass through the LED chip 6 and the submount 4, and as a result white light can be obtained. Note that, FIG. 23 schematically illustrates an example of propagating paths of light which are emitted from the LED chip 6 and of light produced as a result of wavelength conversion by the fluorescent material in the first bond 5.

The fluorescent material serving as the wavelength conversion material is not limited to the yellow fluorescent material, and may include, for example, a set of a yellow fluorescent material and a red fluorescent material, or a set of a red fluorescent material and a green fluorescent material. Also, the fluorescent material serving as the wavelength conversion material is not limited to one kind of yellow fluorescent material, and may include two kinds of yellow fluorescent materials having different emission peak wavelengths. The color rendering property of the LED module 1 can be improved by use of a plurality of fluorescent materials as the wavelength conversion material.

In the LED module 1, at least one of the first bond 5 and the second bond 3 may contain the second fluorescent material which is excited by light emitted from LED chip 6 to emit light having a different color from the emitted light of the LED chip 6. Accordingly, the LED module 1 can produce mixed-color light constituted by light emitted from the LED chip 6 and light emitted from the fluorescent material.

In the LED module 1, when both the first bond 5 and the second bond 3 contain the fluorescent materials, the fluorescent material in the first bond 5 and the fluorescent material in the second bond 3 may emit light rays having different wavelengths from each other.

In this case, the fluorescent material in the first bond 5 that is closer to the LED chip 6 may be a fluorescent material that emits light having a relatively long wavelength (such as red fluorescent material) among two kinds of fluorescent materials, and the fluorescent material in the second bond 3 that is farther from the LED chip 6, may be a fluorescent material that emits light having a relatively short wavelength (green fluorescent material). Accordingly, in the LED module 1, it is possible to suppress secondary absorption of light converted by the fluorescent material in the first bond 5, by the fluorescent material in the second bond 3. The LED module 1 includes a combination of the red fluorescent material and the green fluorescent material as the combination of the two kinds of fluorescent materials. Even when the green fluorescent material is a fluorescent material having poor temperature characteristics (a fluorescent material in which temperature quenching occurs frequently) compared with the red fluorescent material, the green fluorescent material can be arranged close to the opaque substrate 2 which functions as a heat sink, and therefore, temperature increase of the green fluorescent material can be suppressed, and as a result, the temperature quenching of the green fluorescent material can be suppressed.

Furthermore, the LED module 1 may include a fluorescent material to emit light having a relatively short wavelength (green fluorescent material) as the fluorescent material in the first bond 5 that is close to the LED chip 6, and a fluorescent material to emit light having a relatively long wavelength (red fluorescent material) as the fluorescent material in the second bond 3 that is distant from the LED chip 6, for example, among two kinds of fluorescent materials. Accordingly, in the LED module 1, it is possible to suppress secondary absorption of light which has been converted by the fluorescent material in the second bond 3, by the fluorescent material in the first bond 5.

Note that, in the LED module 1 of the fourth modification, the opaque substrate 2 preferably functions as a heat sink, similarly to the LED module 1 of Embodiment 1.

Figure 24:
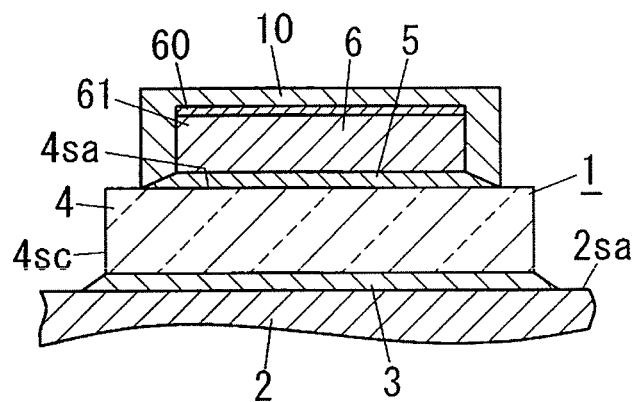
FIG. 24 is a main portion schematic cross-section of the fifth modification of the LED module of Embodiment 1.

Hereinafter, the fifth modification of the LED module 1 of the present embodiment will be described with reference to FIG. 24.

In the LED module 1 of the fifth modification, the shape of the color conversion portion 10 is different from that of the LED module 1 of Embodiment 1. Note that, constituent elements similar to those in Embodiment 1 are provided with the same reference numerals, and redundant description thereof will be omitted. Also, in FIG. 24, illustrations of the wires 7 and the patterned wiring circuit 8 shown in FIG. 1 are omitted.

The color conversion portion 10 is provided to cover side faces of the LED chip 6 and an opposite surface of the LED chip 6 from the first bond 5. In the LED module 1 of the present embodiment, the color conversion portion 10 is in the form of a layer. The color conversion portion 10 can be formed by a method such as molding and screen-printing. In the LED module 1, the color conversion portion 10 is formed into a layer-form so as to be thin, and therefore it is possible to reduce an amount of light which is to be converted to heat by the fluorescent material in the color conversion portion 10.

The LED module 1 may be configured such that the color conversion portion 10 contains a light diffusion material. The light diffusion material is preferably composed of particles and dispersed in the color conversion portion 10. In the LED module 1, due to the color conversion portion 10 containing the light diffusion material, color unevenness can be further suppressed. The material of the light diffusion material may be an inorganic material such as aluminum oxide, silica, titanium oxide, and Au, an organic material such as a fluorine based resin, an organic and inorganic hybrid material in which an organic component and an inorganic component are mixed and/or combined at a nanometer level or molecular level, or the like. In the LED module 1, the larger the difference between the refractive indices of the light diffusion material and the transparent material of the light conversion portion 10, the smaller the required light diffusion material content to obtain an effect to suppress color unevenness to a similar level.

It is possible to further improve the color rendering property of the LED module 1 by that the LED chip 6 is a blue LED chip and the color conversion portion 10 contains a plurality of fluorescent materials (green fluorescent material and red fluorescent material) and the light diffusion material. Furthermore, it is possible to further improve the color rendering property of the LED module 1 by that the LED chip 6 is an ultraviolet LED chip and the color conversion portion 10 contains a plurality of kinds of fluorescent materials (blue fluorescent material, green fluorescent material, and red fluorescent material) and the light diffusion material.

Figure 25:
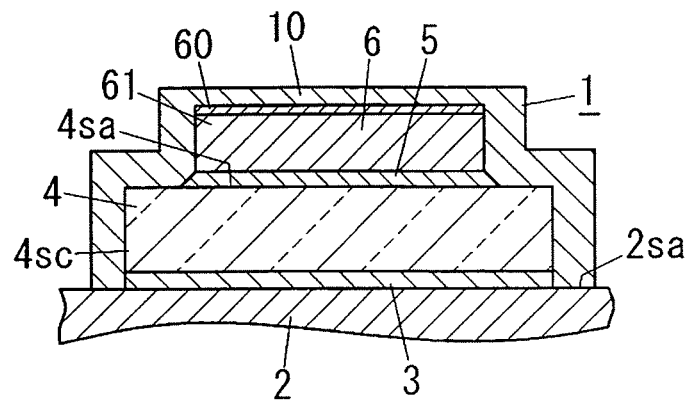
FIG. 25 is a main portion schematic cross-section of the sixth modification of the LED module of Embodiment 1.

The LED module 1 of the fifth modification may be configured such that at least one of the first bond 5 and the second bond 3 contains a second fluorescent material in addition to the color conversion portion 10. The second fluorescent material is a fluorescent material which is excited by light emitted from the LED chip 6 to emit light having a different color from the emitted light of the LED chip 6. The LED module 1 may be configured such that the color conversion portion 10 is provided so as to cover not only the LED chip 6 but also periphery of the submount 4 (in the example in FIG. 25, the periphery of the face 4sa and the side faces 4sc), as the sixth modification shown in FIG. 25, for example. In FIG. 25, illustrations of the wires 7 and the patterned wiring circuit 8 shown in FIG. 1 are omitted.

In a case of the sixth modification, a fluorescent material in the color conversion portion 10 provided around the submount 4 is preferably a fluorescent material to emit light having a relatively short wavelength compared with a fluorescent material in the first bond 5. Accordingly, in the LED module 1 of the sixth modification, it is possible to suppress re-absorption in the color conversion portion 10 provided around the submount 4.

Note that, in each of the LED modules 1 of the fifth modification and the sixth modification, as with the LED module 1 of Embodiment 1, the opaque substrate 2 preferably functions as a heat sink.

Figure 26:
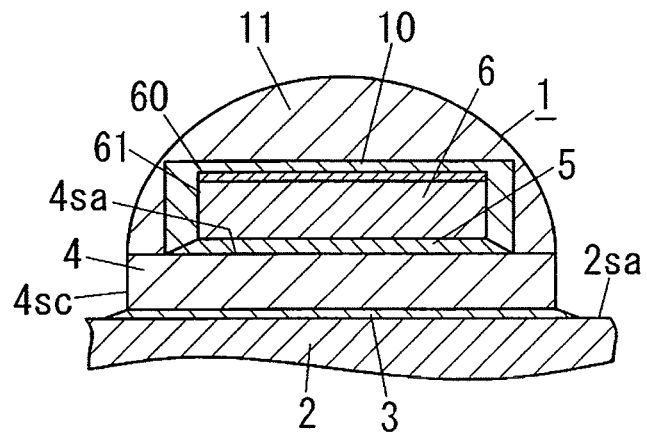
FIG. 26 is a main portion schematic cross-section of the seventh modification of the LED module of Embodiment 1.

Hereinafter, the seventh modification of the LED module 1 of the present embodiment will be described with reference to FIG. 26.

The LED module 1 of the seventh modification differs from the LED module 1 of the fifth modification in including a resin portion 11 which covers the LED chip 6 on the face 4sa of the submount 4. The resin portion 11 preferably serves as an outer cover through which light passes last (in other words, an outer cover for extracting light). The resin portion 11 in the LED module 1 of the present embodiment also covers the color conversion portion 10. Note that, constituent elements similar to those in the fifth modification are provided with the same reference numerals, and redundant description thereof will be omitted. Also, in FIG. 26, illustrations of the wires 7 and the patterned wiring circuit 8 shown in FIG. 1 are omitted.

The resin portion 11 is preferably formed of a transparent resin containing a light diffusion material. The transparent resin is a silicone resin. The transparent resin is not limited to the silicone resin, and may be an epoxy resin, an acrylic resin, or the like. The material of the light diffusion material may be an inorganic material such as aluminum silica, titanium oxide, and Au, an organic material such as a fluorine based resin, or an organic and inorganic hybrid material in which an organic component and an inorganic component are mixed and/or combined at a nanometer level or molecular level, or the like.

The resin portion 11 has a hemispherical shape, but the shape thereof is not limited to the hemispherical shape, and may be a hemispherical shape or a hemicylindrical shape.

The LED module 1 of the seventh modification includes the resin portion 11 and therefore the reliability can be improved. Also, the LED module 1 may be configured such that the resin portion 11 contains the light diffusion material, as described above. Accordingly, in the LED module 1, color unevenness can be further suppressed. Also, when the color conversion portion 10 contains a plurality of kinds of fluorescent materials and the resin portion 11 contains a light diffusion material, the color rendering property of the LED module 1 can be further improved.

Note that, as with the LED module 1 of the Embodiment 1, the opaque substrate 2 of the LED module 1 of the seventh modification preferably functions as a heat sink.

Figure 27:
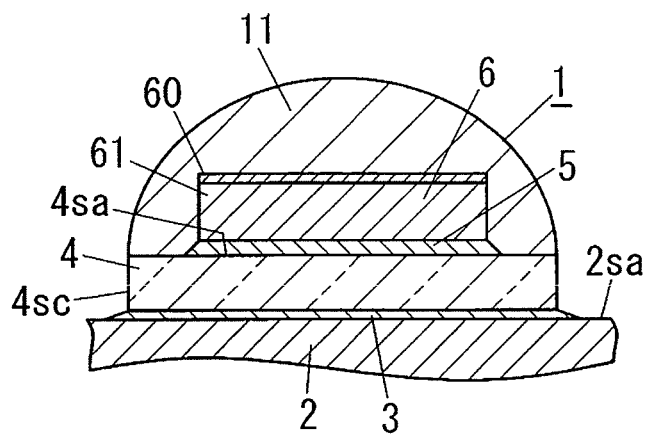
FIG. 27 is a main portion schematic cross-section of the eighth modification of the LED module of Embodiment 1.

Hereinafter, the eighth modification of the LED module 1 of the present embodiment will be described with reference to FIG. 27.

The LED module 1 of the eighth modification differs from the LED module 1 of the fifth modification in including a resin portion 11 which covers the LED chip 6 on the face 4sa of the submount 4. The resin portion 11 preferably serves as an outer cover through which light is extracted. Note that, constituent elements similar to those in the fifth modification are provided with the same reference numerals, and redundant description thereof will be omitted. Also, in FIG. 27, illustrations of the wires 7 and the patterned wiring circuit 8 shown in FIG. 1 are omitted.

The resin portion 11 is preferably formed of a transparent resin containing a light diffusion material. The transparent resin is a silicone resin. However, the transparent resin is not limited to the silicone resin, and may be an epoxy resin, an acrylic resin, or the like. The material of the light diffusion material may be an inorganic material such as aluminum oxide, silica, titanium oxide, and Au, an organic material such as a fluorine based resin, or an organic and inorganic hybrid material in which an organic component and an inorganic component are mixed and/or combined at a nanometer level or molecular level, or the like.

The resin portion 11 has a hemispherical shape, but the shape thereof is not limited to the hemispherical shape, and may be a hemiellipse spherical shape or a hemicylidrical shape.

The LED module 1 of the eighth modification has improved reliability due to the resin portion 11. Furthermore, the LED module 1 may be configured such that the resin portion 11 contains the light diffusion material, as described above. Accordingly, in the LED module 1, color unevenness can be suppressed. Also, when the LED module 1 is configured such that at least one of the first bond 5 and the second bond 3 contains a plurality of kinds of fluorescent materials (first fluorescent materials) and the resin portion 11 contains the light diffusion material, the color rendering property can be further improved.

Note that, as with the LED module 1 of Embodiment 1, the opaque substrate 2 of the LED module 1 of the eighth modification preferably functions as a heat sink.

Figure 28:
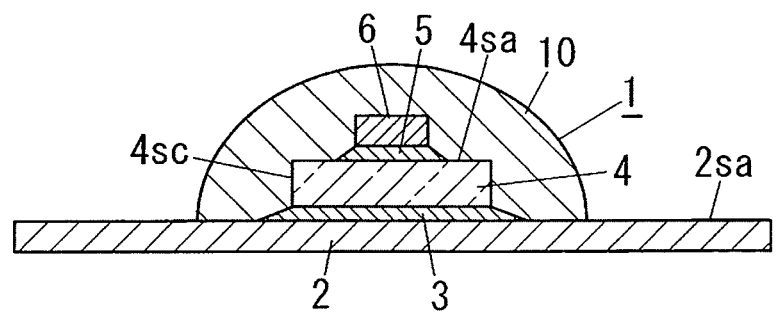
FIG. 28 is a main portion schematic cross-section of the ninth modification of the LED module of Embodiment 1.

Hereinafter, the ninth modification of the LED module 1 of the present embodiment will be described with reference to FIG. 28.

The LED module 1 of the ninth modification differs from the LED module 1 of Embodiment 1 in terms of the shape of the color conversion portion 10. Note that, constituent elements similar to those in Embodiment 1 are provided with the same reference numerals, and redundant description thereof will be omitted. Also, in FIG. 28, illustrations of the wires 7 and the patterned wiring circuit 8 shown in FIG. 1 are omitted.

The color conversion portion 10 has a hemispherical shape and is formed on the surface 2sa of the opaque substrate 2 so as to cover the first bond 5, the submount 4, the second bond 3, and the LED chip 6.

In the LED module 1 of the ninth modification, some of rays of the light produced in a light-emitting layer (not shown) in the LED chip 6 and then passing through the LED chip 6 and the first bond 5 are diffused in the submount 4. Consequently, the light passing through the LED chip 6 and the first bond 5 is less likely to be totally reflected, and more likely to be extracted from the submount 4 through any one of the side faces 4sc and the face 4sa. Therefore, in the LED module 1, light outcoupling efficiency can be improved and a total light flux amount can be increased. Moreover, in the LED module 1, by providing the surface 2sa of the opaque substrate 2 with diffuse reflective properties or specular reflective properties, light emitted toward the opaque substrate 2 from the color conversion portion 10 is likely to be reflected by the opaque substrate 2, and thus light outcoupling efficiency can be improved. In this case, in the LED module 1, some of rays of light that are reflected by the opaque substrate 2 and travel toward the color conversion portion 10 enter the color conversion portion 10 again, and consequently, the conversion rate at the color conversion portion 10 can be increased.

Figure 29:
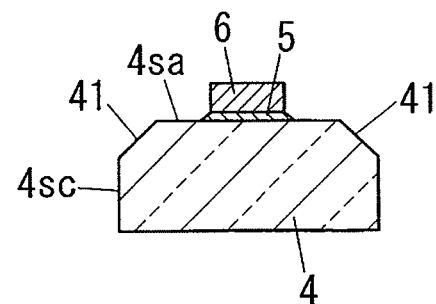
FIG. 29 is a main portion schematic cross-section for illustrating another exemplary configuration of the submount in the LED module of Embodiment 1.

In the submount 4, as shown in FIG. 29, chamfers 41 may be formed between the face 4sa and the side faces 4sc at a periphery of the face 4sa. The chamfer 41 is a C chamfer with a chamfering angle of 45°, but the chamfer is not limited thereto and may be an R chamfer.

The color conversion portion 10 has a hemispherical shape, but the shape thereof is not limited thereto, and may be a hemispherical shape or a hemicylindrical shape.

Note that, as with the LED module 1 of Embodiment 1, the opaque substrate 2 of the LED module 1 of the ninth modification preferably functions as a heat sink. Also, in the LED module 1 of the ninth modification, instead of the color conversion portion 10, an encapsulating portion composed of a transparent resin having the same shape as the color conversion portion 10 may be provided.

Figure 30:
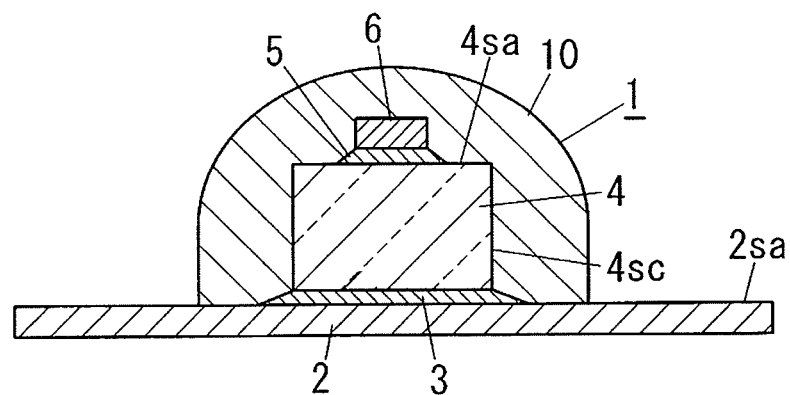
FIG. 30 is a main portion schematic cross-section of the tenth modification of the LED module of Embodiment 1.

Hereinafter, the tenth modification of the LED module 1 of the present embodiment will be described with reference to FIG. 30.

The LED module 1 of the tenth modification differs from the LED module 1 of the ninth modification in terms of the shape of the color conversion portion 10. Note that, constituent elements similar to those in the ninth modification are provided with the same reference numerals, and redundant description thereof will be omitted. Also, in FIG. 30, illustrations of the wires 7 and the patterned wiring circuit 8 shown in FIG. 1 are omitted.

The color conversion portion 10 in the LED module 1 of the tenth modification has a bombshell shape. The color conversion portion 10 having the bombshell shape has a hemispherical portion at the front end (the end that is distant from the opaque substrate 2) and a columnar portion at the back end (the end that is close to the opaque substrate 2).

The planar shape of the submount 4 is not limited to a rectangular shape, and may be a polygonal shape other than the rectangle or a round shape.

Note that, as with the LED module 1 of Embodiment, the opaque substrate 2 of the LED module 1 of the tenth modification preferably functions as a heat sink.

Figure 31:
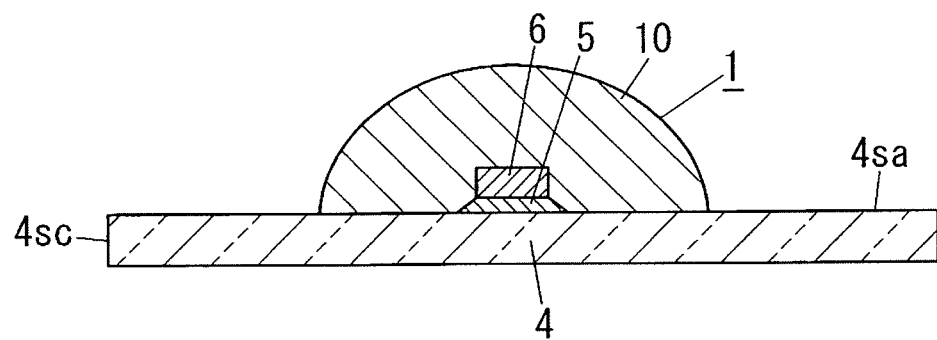
FIG. 31 is a main portion schematic cross-section of the eleventh modification of the LED module of Embodiment 1.

Hereinafter, the eleventh modification of the LED module 1 of the present embodiment will be described with reference to FIG. 31.

The basic configuration of the LED module 1 of the eleventh modification is substantially the same as that of the LED module 1 of Embodiment 1, but differs therefrom in that the opaque substrate 2 (refer to FIG. 1) is constituted by a device main body of a lighting device (unshown in Figures) and the device main body and the submount 4 are bonded with the second bond 3 (refer to FIG. 1). Note that, constituent elements similar to those of the LED module 1 of Embodiment 1 are provided with the same reference numerals, and redundant description thereof will be omitted. Also, in FIG. 31, illustrations of the wires 7 and the patterned wiring circuit 8 shown in FIG. 1 are omitted.

Incidentally, the inventors performed simulation in terms of values of dimensional parameters of the submount 4, which are effective to improve the light outcoupling efficiency of the LED module 1. As a result, the inventors obtained knowledge that the dimensional parameters preferably satisfy conditions defined by Equations (10), (11), and (12) described later. The simulation conditions are the same as the simulation conditions described in the ninth modification.

The planar shape of the submount 4 is not limited to a rectangular shape, and may be a polygonal shape other than the rectangle or a round shape.

Note that, as with the LED module 1 of Embodiment 1, the opaque substrate 2 of the LED module 1 of the eleventh modification preferably functions as a heat sink.

Incidentally, not only the LED module 1 of the eleventh modification, but each of the LED modules 1 of Embodiment 1 and the first modification to the tenth modification can be used as light sources of various lighting apparatuses.

The lighting apparatus which includes the LED module 1 may be, for example, a lighting device including a light source that is the LED module 1 and is provided on a device main body. The lighting device may include the device main body and the LED module 1 that is held on the device main body. In the lighting device including the LED module 1, light outcoupling efficiency can be improved.

The lighting apparatus which includes the LED module 1 may be, for another example, a straight-tube LED lamp which is a type of a lamp. The lamp may include a light source that is the LED module 1. In the lamp including a light source that is the LED module 1, light outcoupling efficiency can be improved. Note that, in terms of the straight-tube LED lamp, "straight-tube LED lamp system with L-type pin cap GX16t-5 (for general illumination)" (JEL 801:2010) is standardized by Japan Electric Lamp Manufacturers Association, for example.

Such a straight-tube LED lamp may include: a tube main body having a straight-tube shape and made of a light-transmissive material (such as milky white glass and a milky white resin); and a first cap and a second cap which are respectively provided at an end and the other end of the tube main body in the longitudinal direction. The LED module 1 is accommodated in the tube main body. The opaque substrate 2 has an elongated shape, and a plurality of LED chips 6 are aligned along the longitudinal direction of the opaque substrate 2.

Embodiment 2

Figure 32:
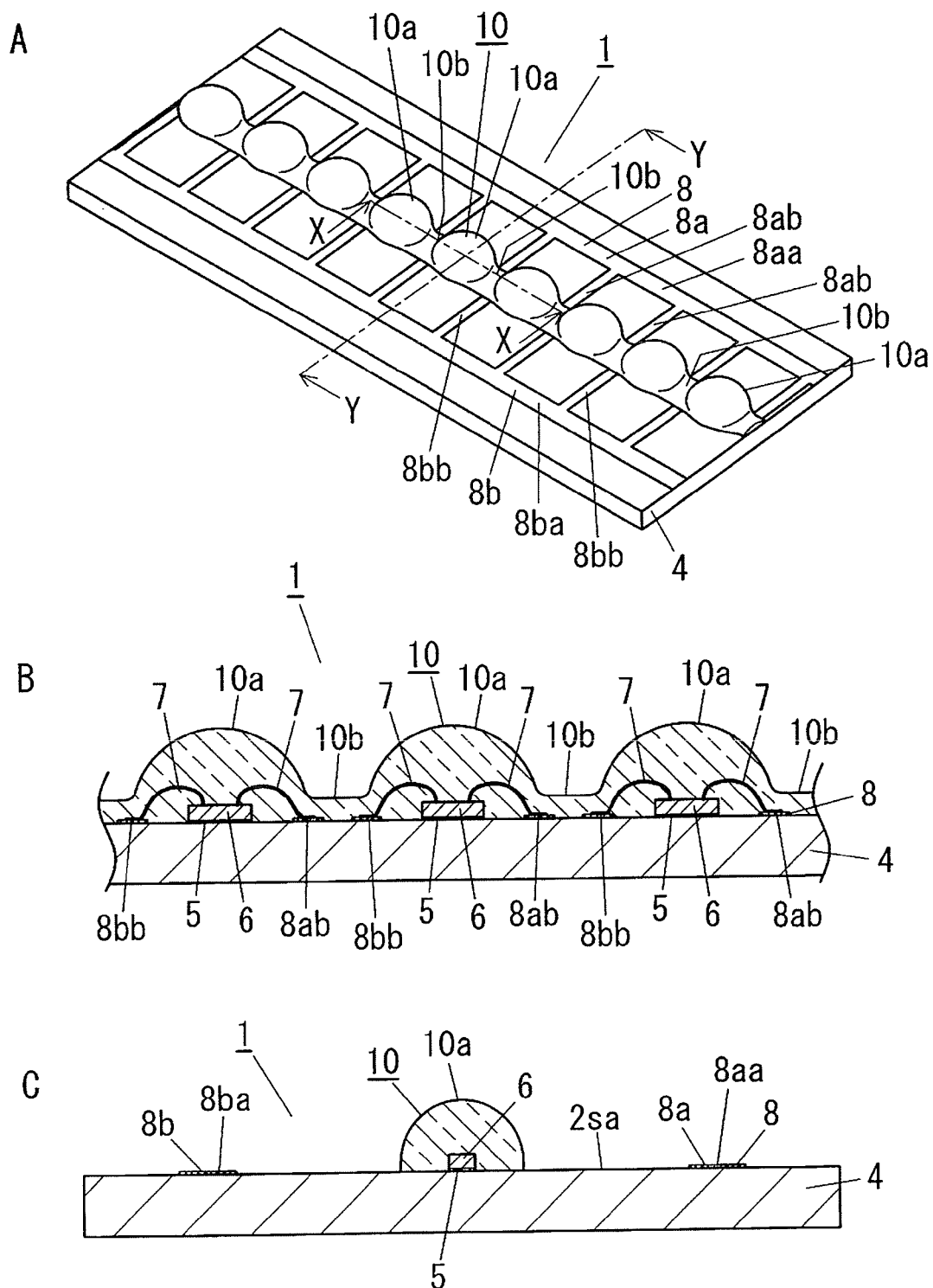
FIG. 32A is a schematic perspective view of an LED module of Embodiment 2.
FIG. 32B is a schematic cross-section taken along X-X in FIG. 32A.
FIG. 32C is a schematic cross-section taken along Y-Y in FIG. 32A.

An LED module 1 of the present embodiment differs from the LED module 1 of Embodiment 1 in that, as shown in FIGS. 32A, 32B, and 32C, a submount 4 has an elongated shape and a plurality of LED chips 6 are included. Note that, constituent elements similar to those in Embodiment 1 are provided with the same reference numerals, and redundant description thereof will be omitted.

In the LED module 1, the plurality of LED chips 6 are aligned along a prescribed direction (in the horizontal direction in FIG. 32B) on a face 4sa of the submount 4. In the LED module 1, the LED chips 6 aligned in the prescribed direction and wires 7 that are connected to the respective LED chips 6 are covered by a color conversion portion 10 having a band shape. The color conversion portion 10 has recessed portions 10b to suppress total reflection of light emitted from each of the LED chips 6 between adjacent LED chips 6 to each other in the prescribed direction.

A patterned wiring circuit 8 serving as a circuit includes a first conductor 8a (first patterned wiring circuit) to which a first electrode (anode electrode) of the LED chip 6 is to be connected and a second conductor 8b (second patterned wiring circuit) to which the second electrode (cathode electrode) of the LED chip 6 is to be connected.

The first conductor 8a and the second conductor 8b each have a planar shape of a comb shape. The first conductor 8a and the second conductor 8b are arrayed so as to interdigitate in the lateral direction of the submount 4. In this regard, in the patterned wiring circuit 8, a first shaft 8aa of the first conductor 8a faces a second shaft 8ba of the second conductor 8b. In the patterned wiring circuit 8, first comb teeth 8ab of the first conductor 8a and second comb teeth 8bb of the second conductor 8b are arranged alternately in in the longitudinal direction of the submount 4 and separated by a space.

In the LED module 1, the plurality of (nine in an example shown in the diagram) LED chips 6 are arranged in the longitudinal direction (in the aforementioned prescribed direction) of the submount 4 and are connected in parallel. In the LED module 1, power can be supplied to a parallel circuit in which the plurality of LED chips 6 are connected in parallel. In short, in the LED module 1, power can be supplied to all the LED chips 6 by applying voltage between the first conductor 8a and the second conductor 8b. When a plurality of the LED modules 1 are arranged, adjacent LED modules 1 may be electrically connected by conductive members, wires for feed wiring (not shown), connectors (not shown), or the like. In this case, one power supply unit can supply power to the plurality of LED modules 1 so that all the LED chips 6 of the respective LED modules 1 can emit light.

The color conversion portion 10 is made of a transparent material containing a first fluorescent material, for example. The color conversion portion 10 is preferably made of a resin being a transparent material in which the first fluorescent material is dispersed. The resin of the color conversion portion 10 is not particularly limited, as long as it transmits light emitted from the LED chip 6 as well as light emitted from the first fluorescent material.

The resin of the color conversion portion 10 may be a silicone resin, an epoxy resin, an acrylic resin, an urethane resin, an oxetane resin, a polycarbonate resin, or the like. As the resin, the silicone resin is preferable from a viewpoint of thermal resistance and weather resistance, and gel-like silicone is more preferable from a viewpoint of suppressing breaking of the wires 7 due to a thermal stress caused by temperature cycling.

The first fluorescent material functions as a wavelength conversion material to convert light emitted from the LED chip 6 into light having a longer wavelength than the light emitted from the LED chip 6. Accordingly, the LED module 1 can provide mixed-color light constituted by the light emitted from the LED chip 6 and light emitted from the fluorescent material. In short, the color conversion portion 10 has a function serving as a wavelength conversion portion to convert light emitted from the LED chip 6 into light having a longer wavelength than the light emitted from the LED chip 6. Besides, the color conversion portion 10 has a function serving as an encapsulating portion for encapsulating each LED chip 6 and each wire 7.

When including a blue LED chip as the LED chip 6 and a yellow fluorescent material as the fluorescent material being the wavelength conversion material, for example, the LED module 1 can emit white light. That is, in the LED module 1, blue light emitted from the LED chip 6 and light emitted from the yellow fluorescent material can be emitted outside through the surface of the color conversion portion 10, and as a result, white light can be obtained.

The fluorescent material serving as the wavelength conversion material is not limited to the yellow fluorescent material, and may include, for example, a set of a yellow fluorescent material and a red fluorescent material, or a set of a red fluorescent material and a green fluorescent material. Also, the fluorescent material serving as the wavelength conversion material is not limited to one kind of yellow fluorescent material, and may include two kinds of yellow fluorescent materials having different emission peak wavelengths. The color rendering property of LED module 1 can be improved by use of a plurality of fluorescent materials as the wavelength conversion material.

The color conversion portion 10 has, as described above, recessed portions 10b to suppress total reflection of light emitted from each of the LED chips 6 between the LED chips 6 which are adjacent to each other in the prescribed direction. Accordingly, in the LED module 1, it is possible to suppress total reflection of light which is emitted from the LED chip 6 and then strikes an interface between the color conversion portion 10 and air. Consequently, in the LED module 1, it is possible to reduce an amount of light which is confined due to total reflection, compared with the LED module including the color conversion portion 10 having a hemicylindrical shape, and therefore light outcoupling efficiency can be improved. In short, in the LED module 1, a total reflection loss can be reduced, and light outcoupling efficiency can be improved.

The color conversion portion 10 is formed so as to have a cross section including a step which corresponds to a step between the face of the LED chip 6 and the face 4sa of the submount 4. Consequently, the color conversion portion 10 has a cross section along a direction orthogonal to the arrangement direction of the LED chips 6, and a cross section along the arrangement direction of the LED chips 6, the former is a convex shape while the latter has recesses and convexes. In short, in the LED module 1, the color conversion portion 10 with a band shape has a recess and convex structure to improve the light outcoupling efficiency.

The period of the recess and convex structure is the same as the array pitch of the LED chips 6. The period of the recess and convex structure is the array pitch of the convex portions 10a which cover respective LED chips 6.

The surface shape of the color conversion portion 10 may be designed such that the angle between a light ray from the LED chip 6 and a normal line on the surface of the color conversion portion 10 at a point where the light ray from the LED chip 6 crosses the surface thereof is smaller than the critical angle. Here, in the LED module 1, each of the convex portions 10a of the color conversion portion 10 is preferably designed to have the surface shape such that, in substantially all the areas of the surface of the convex portion 10a of the color conversion portion 10, the incident angle (light incident angle) of the light ray from the LED chip 6 is smaller than the critical angle.

For this reason, in the color conversion portion 10, each of the convex portions 10a which covers a corresponding LED chip 6 is preferably formed in a hemispherical shape. Each convex portion 10a is designed such that the light axis of the convex portion 10a is aligned with the light axis of the LED chip 6 covered with the convex portion 10a in the thickness direction of the submount 4. Accordingly, in the LED module 1, it is possible to suppress not only the total reflection at the surface (interface between the color conversion portion 10 and air) of the color conversion portion 10 but also color unevenness. The color unevenness is a state in which chromaticity varies depending on an irradiation direction of light. In the LED module 1, the color unevenness can be suppressed to such an extent the color unevenness cannot be perceived visually.

In the LED module 1, it is possible to substantially equalize light path lengths of light rays from the LED chip 6 to the surface of the convex portion 10a regardless the emission direction of light from the LED chip 6. As a result, color unevenness can be further suppressed. The shape of each convex portion 10a of the color conversion portion 10 is not limited to hemisphere, and may be a semielliptical shape, for example. Note that, each convex portion 10a may have a shape, a cuboid shape, or the like.

For manufacturing the LED module 1, first, the submount 4 is prepared. Thereafter, the LED chips 6 are die-bonded on the face 4sa of the submount 4 with a die bonding apparatus or the like. Thereafter, the first electrode and the second electrode of each of the LED chips 6 are connected to the patterned wiring circuit 8 via the respective wires 7 with a wire bonding apparatus, or the like. Thereafter, the color conversion portion 10 is formed using a dispenser system or the like.

In a case where the color conversion portion 10 is formed with a dispenser system, a material of the color conversion portion 10 is applied by discharging the material from a nozzle while a dispenser head is moved in the arrangement direction of the LED chips 6, for example.

Here, in order to apply the material of the color conversion portion 10 with the dispenser system so as to form an application shape corresponding to the surface shape of the color conversion portion 10, the material is discharged and applied while the dispenser head is moved, for example. Specifically, an application amount is varied by varying the moving speed of the dispenser head while the distance between the nozzle and the face 4sa of the submount 4 directly under the nozzle is varied by moving the dispenser head up and down. More specifically, the moving speed of the dispenser head is relatively varied in applying the material between in a region to form the convex portion 10a of the color conversion portion 10 and in a region to form a portion of the color conversion portion 10 between adjacent convex portions 10a. The moving speed of the dispenser head is slow in the former region, and the moving speed thereof is fast in the latter region. Moreover, the dispenser head is moved up and down depending on the surface shape of the color conversion portion 10. Accordingly, by the method of forming the color conversion portion 10 with the dispenser system, it is possible to form, with the material, the application shape in accordance with the surface shape of the color conversion portion 10. The application shape may be set in view of contraction in curing the material.

The dispenser system preferably includes: a movement mechanism constituted by a robot for moving the dispenser head; a sensor unit for measuring heights of the face 4sa of the submount 4 and the nozzle from a table; and a controller for controlling the movement mechanism and a discharge amount of the material from the nozzle. The controller can be realized, for example, by loading an appropriate program to a microcomputer. The dispenser system can be adapted to various types of products different in the array pitch of the LED chips 6, the number of the LED chips 6, the width of the color conversion portion 10, or the like, by changing the program loaded to the controller appropriately.

The surface shape of the color conversion portion 10 can be controlled by adjusting viscosity or the like of the material, for example. The curvature of the surface (convex face) in each of the convex portions 10a can be designed with viscosity and surface tension of the material, a height of the wire 7, or the like. Larger curvature can be realized by increasing the viscosity and the surface tension of the material, or by increasing the height of the wire 7. A smaller width (band width) of the color conversion portion 10 having the band shape can be realized by increasing the viscosity and the surface tension of the material. The viscosity of the material is preferably set to be in a range of around 100 to 2000 mPa·s. Note that, the value of the viscosity may be measured under a room temperature using a cone and plate rotational viscometer, for example.

The dispenser system may include a heater to heat an un-cured material so as to adjust viscosity to a desirable value. Accordingly, in the dispenser system, reproducibility of the application shape of the material can be improved, and reproducibility of the surface shape of the color conversion portion 10 can be improved.

Figure 33:
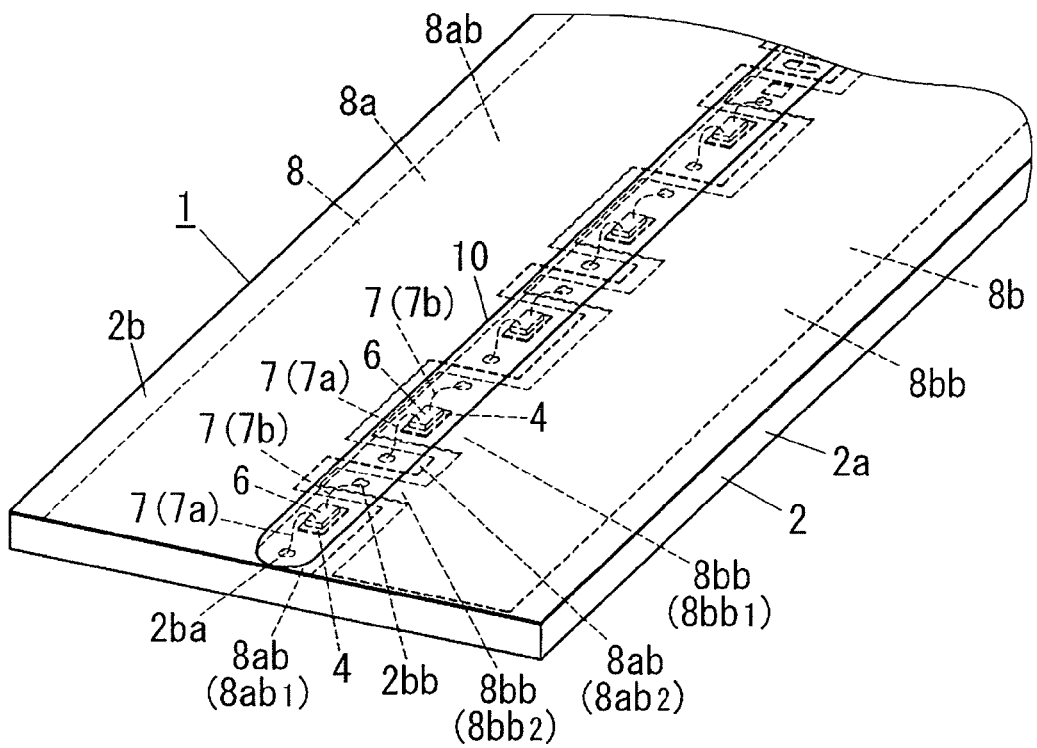
FIG. 33 is a schematic perspective view of the modification of the LED module of Embodiment 2, which is partially exploded.
Figure 34:
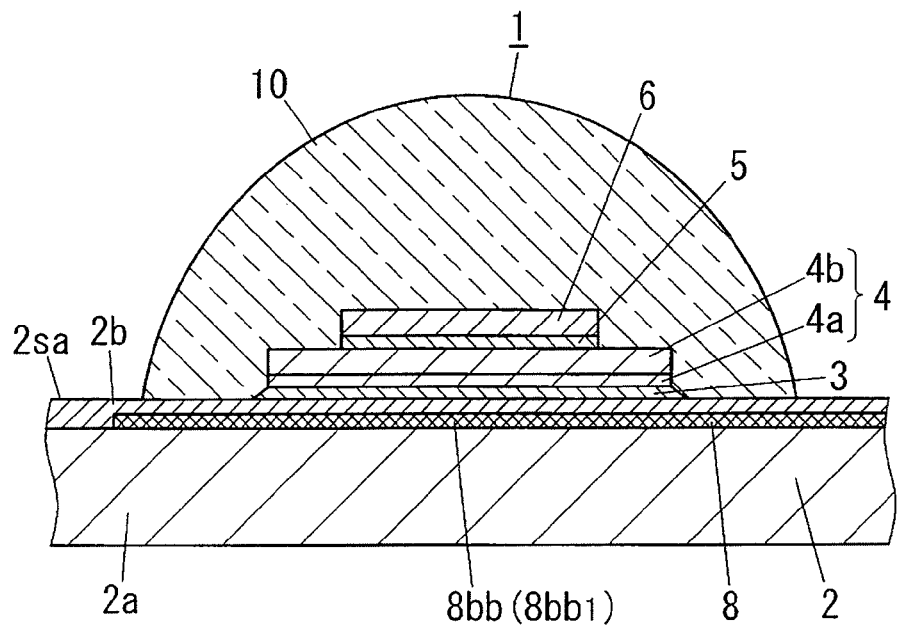
FIG. 34 is a schematic perspective view of the modification of the LED module of Embodiment 2.

Hereinafter, a modification of the LED module 1 of the present embodiment will be described with reference to FIGS. 33 and 34. Note that, constituent elements similar to those in Embodiment 2 are provided with the same reference numerals, and redundant description thereof will be omitted appropriately.

In an LED module 1 of the modification, a plurality of LED chips 6 are arranged on the surface 2$sa$ of the opaque substrate 2 in a prescribed direction (hereinafter, referred to as "first direction") at equal intervals.

The patterned wiring circuit 8 includes the first conductor 8$a$ and the second conductor 8$b$ which are each formed into a comb shape and interdigitate. The first conductor 8$a$ is electrically connected to the first electrode of each of the LED chip 6 via the wire 7 (hereinafter, referred to as "first wire 7$a$"). The second conductor 8$b$ is electrically connected to the second electrode of each of the LED chip 6 via the wire 7 (hereinafter, referred to as "second wire 7$b$").

The first conductor 8$a$ includes a first shaft 8$aa$ formed along the first direction and a plurality of first comb teeth 8$ab$ which are formed along a second direction orthogonal to the first direction.

The second conductor 8$b$ includes a second shaft 8$ba$ which is formed along the first direction and a plurality of second comb teeth 8$bb$ which are formed along the second direction.

The plurality of first comb teeth 8$ab$ of the first conductor 8$a$ are constituted by first comb teeth 8$ab$ (8$ab_1$) having a relatively large tooth width and first comb teeth 8$ab$ (8$ab_2$) having a relatively small tooth width. In the first conductor 8$a$, the wide first comb teeth 8$ab_1$ and the narrow first comb teeth 8$ab_2$ are arranged alternately in the first direction.

The plurality of second comb teeth 8$bb$ of the second conductor 8$b$ are constituted by second comb teeth 8$bb$ (8$bb_1$) having a relatively large tooth width and second comb teeth 8$bb$ (8$bb_2$) having a relatively small tooth width. In the second conductor 8$b$, the wide second comb teeth 8$bb_1$ and the narrow second comb teeth 8$bb_2$ are arranged alternately in the first direction.

The patterned wiring circuit 8 includes the wide first comb teeth 8$ab_1$, the narrow second comb teeth 8$bb_2$, the narrow first comb teeth 8$ab_2$, and the comb teeth 8$bb_1$ which are arranged cyclically in the first direction.

The opaque substrate 2 is provided with the patterned wiring circuit 8 on a surface of a base substrate 2$a$ having an electrical insulation property, and a mask layer 2$b$ which covers the patterned wiring circuit 8 over the surface of the base substrate 2$a$. The mask layer 2$b$ is formed over the surface of the base substrate 2$a$ so as to also cover portions in which the patterned wiring circuit 8 is not formed. The material of the mask layer 2$b$ may be a white mask made of a resin (such as silicone resin) which contains a white pigment such as barium sulfate ($BaSO_4$) and titanium dioxide ($TiO_2$). The white mask may be a white mask material "ASA COLOR (registered trademark) RESIST INK" made of silicone produced by Asahi Rubber Inc., or the like.

The mask layer 2$b$ has a plurality of openings 2$ba$ for exposing first pads on the first comb teeth 8$ab$ to which the respective first wires 7$a$ are connected and a plurality of openings 2$bb$ for exposing second pads on the second comb teeth 8$bb$ to which the respective second wires 7$b$ are connected. In short, the mask layer 2$b$ has the openings 2$ba$ and the openings 2$bb$ which are formed alternately in the first direction. In the mask layer 2$b$, the plurality of openings 2$ba$ and the plurality of openings 2$bb$ are formed so as to be aligned on a line.

The openings 2$ba$ for exposing the first pads on the wide first comb teeth 8$ab_1$ are located at a distant side from the respective adjacent narrow second comb teeth 8$bb_2$ with respect to the respective center lines of the wide first comb teeth 8$ab_1$ in the first direction. In the LED module 1, the submounts 4 and the LED chips 6 are arranged vertically above regions on the wide first comb teeth 8$ab_1$ that are close to the respective narrow second comb teeth 8$bb_2$ with respect to the respective center lines thereof.

The openings 2$ba$ for exposing the first pads on the narrow first comb teeth 8$ab_2$ are located on the respective center lines of the narrow first comb teeth 8$ab_2$.

The openings 2$bb$ for exposing the second pads on the wide second comb teeth 8$bb_1$ are located at a distant side from the respective adjacent narrow first comb teeth 8$ab_2$ with respect to the respective center lines of the wide second comb teeth 8$bb_1$ in the first direction. In the LED module 1, the submounts 4 and the LED chips 6 are arranged vertically above regions on the wide second comb teeth 8$bb_1$ that are close to the respective narrow first comb teeth 8$ab_2$ with respect to the respective center lines thereof.

The openings 2$bb$ for exposing the second pads on the narrow second comb teeth 8$bb_2$ are located on the respective center lines of the narrow second comb teeth 8$bb_2$.

Each LED chip 6 is located between, in a planar view, the first pad to which the first electrode is connected via the first wire 7$a$ and the second pad to which the second electrode is connected via the second wire 7$b$. In short, in the LED module 1, the plurality of LED chips 6, the plurality of first pads, and the plurality of second pads are formed so as to be aligned on a line in a planar view.

The color conversion portion 10 is formed in a band shape to cover the plurality of LED chips 6, the plurality of first wires 7$a$, and the plurality of second wires 7$b$. The cross section of the color conversion portion 10 along a direction orthogonal to the first direction is a hemispherical shape. The color conversion portion 10 may have a similar shape to that of Embodiment 2.

In the LED module 1 of the modification, the patterned wiring circuit 8 is present on the opaque substrate 2 to overlap respective vertical projection regions of the LED chips 6. In the LED module 1 of the modification, heat generated in the LED chips 6 and the color conversion portions 10 in lighting can thereby be conducted to a wide area via the patterned wiring circuit 8. That is, in the LED module 1 of the modification, a heat dissipation property can be improved, and light output can be increased. In the LED module 1 of the modification, since the directions of the LED chips 6 can be made the same, handling of the LED chips 6 in bonding process of the LED chips 6 on the respective submounts 4 on the opaque substrate 2 can be facilitated, and manufacturing can be facilitated.

Incidentally, the LED module 1 of Embodiment 2 and the LED module 1 of the modification of Embodiment 2 can be used as a light source for a variety of lighting apparatuses, similar to the LED modules 1 of Embodiment 1 and the first modification to the eleventh modification of Embodiment 1. Preferable examples of a lighting apparatus which includes the LED module 1 include: a lighting device having a light source which is the LED module 1 and provided on a device main body: and a lamp (such as a straight-tube LED lamp and a bulb type lamp), but the lighting apparatus is not limited thereto and may be other lighting apparatuses.

Hereinafter, a lighting device 50 including the LED module 1 of Embodiment 2 as a light source will be described with reference to FIGS. 35A and 35B.

The lighting device 50 is an LED lighting device and includes a device main body 51 and an LED module 1 serving as a light source held by the device main body 51.

The device main body 51 is formed in an elongated shape (rectangle plate shape, here) and is larger than the LED module 1 in a planar size. In the lighting device 50, the LED module 1 is provided on a surface 51*b* of the device main body 51 in the thickness direction. In the lighting device 50, the LED module 1 and the device main body 51 are arranged such that the longitudinal direction of the LED module 1 is aligned with the longitudinal direction of the device main body 51. The lighting device 50 includes a cover 52 for covering the LED module 1 provided on the surface 51*b* of the device main body 51. The cover 52 transmits light which is emitted from the LED module 1.

The lighting device 50 includes a lighting unit 53 which supplies direct current electric power to the LED module 1 for lighting (allowing light emission) each of the LED chips 6. In the lighting device 50, the lighting unit 53 and the LED module 1 are electrically connected via wires 54 e.g., lead wires.

In the lighting device 50, at the further surface 51*c* of the device main body 51 in the thickness direction, a recess 51*a* is formed to house the lighting unit 53. The recess 51*a* is formed along the longitudinal direction of the device main body 51. Also, the device main body 51 has a through hole (not shown) to which the wire 54 is to be inserted. The through hole penetrates a thin portion between the surface 51*b* and the inner bottom face of the recess 51*a*.

In the LED module 1, the wires 54 can be connected to exposed portions of the patterned wiring circuit 8. A connection portion between the patterned wiring circuit 8 and the wire 54 may be a connection portion composed of a conductive bonding material such as solder, a connection portion constituted by a male connector and a female connector, or the like.

In the lighting device 50, the LED module 1 can be lighted with direct current electric power supplied from the lighting unit 53. Note that, the lighting unit 53 may receive power from an alternating current power supply such as a commercial power supply, or receive electric power from a direct current power supply such as a solar cell and a storage battery.

The light source in the lighting device 50 is not limited to the LED module 1 of Embodiment 2, but may be any of LED modules 1 of Embodiment 1, the first modification to the eleventh modification of Embodiment 1, and the modification of Embodiment 2.

The device main body 51 is preferably made of a material having high thermal conductivity, and is more preferably made of a material having higher thermal conductivity than the submount 4. Here, the device main body 51 is preferably made of a metal having high thermal conductivity such as aluminum and copper.

The LED module 1 may be fixed to the device main body 51 by: a method using a fixture such as a screw; or bonding the device main body 51 to the LED module 1 by providing therebetween an epoxy resin layer which is a thermoset sheet adhesive. The sheet adhesive may be a sheet adhesive made of a stack of a plastic film (PET film) and a B stage epoxy resin layer (thermoset resin). The B stage epoxy resin layer contains a filling material composed of a filler such as silica and alumina and has a property in which viscosity becomes small and fluidity becomes large when heated. Such a sheet adhesive may be an adhesive sheet TSA available from Toray Industries, Inc. or the like. The filler may be an electrical insulation material having high thermal conductivity than an epoxy resin which is a thermoset resin. The thickness of the aforementioned epoxy resin layer is set to be 100 μm, but this value is an example, and the thickness is not limited thereto, and may be set in a range of around 50 μm to 150 μm as appropriate. The thermal conductivity of the aforementioned epoxy resin layer is preferably larger than 4 W/m·K.

The epoxy resin layer which is a sheet adhesive described above has high thermal conductivity, high fluidity when heated, and high adhesiveness to a surface having asperity, along with having an electrical insulation property. Consequently, in the lighting device 50, it is possible to suppress generation of gaps between the aforementioned insulation layer of the epoxy resin layer and the LED module 1 and between the insulation layer and the device main body 51, and as a result it is possible to improve adhesion reliability and to suppress an increase of a thermal resistance and occurrence of variation due to lack of adhesion. The insulation layer has an electrical insulation property and thermal conductivity, and has a function of connecting the LED module 1 and the device main body 51 thermally.

Thus, in the lighting device 50, it is possible to lower a thermal resistance between each LED chip 6 and the device main body 51 and reduce a variation of thermal resistances, compared with a lighting device where a heat dissipation sheet (heat conduction sheet) of a rubber sheet type or a silicone gel type such as Sarcon® is interposed between the LED module 1 and the device main body 51. Accordingly, in the lighting device 50, since the heat dissipation property is improved and therefore an increase in junction temperature of each of the LED chips 6 can be suppressed. Hence, input power can be increased and light output can be increased. The thickness of the aforementioned epoxy resin layer is set to be 100 μm, but this value is an example, and the thickness is not limited thereto, and may be set in a range of around 50 μm to 150 μm as appropriate. The thermal conductivity of the aforementioned epoxy resin layer is preferably larger than 4 W/m·K.

The cover 52 may be made of an acrylic resin, a polycarbonate resin, a silicone resin, glass, or the like.

The cover 52 has a lens portion (not shown) which is formed integrally therewith and controls a directional distribution of light emitted from the LED module 1. Cost can be reduced compared with a configuration in which a lens which has been separately prepared from the cover 52 is attached to the cover 52.

The lighting device 50 described above includes the LED module 1 serving as the light source, and therefore cost thereof can be reduced and light output thereof can be increased.

The lighting device 50 includes the device main body 51 made of metal, and therefore the heat dissipation property thereof can be improved.

Figure 36:
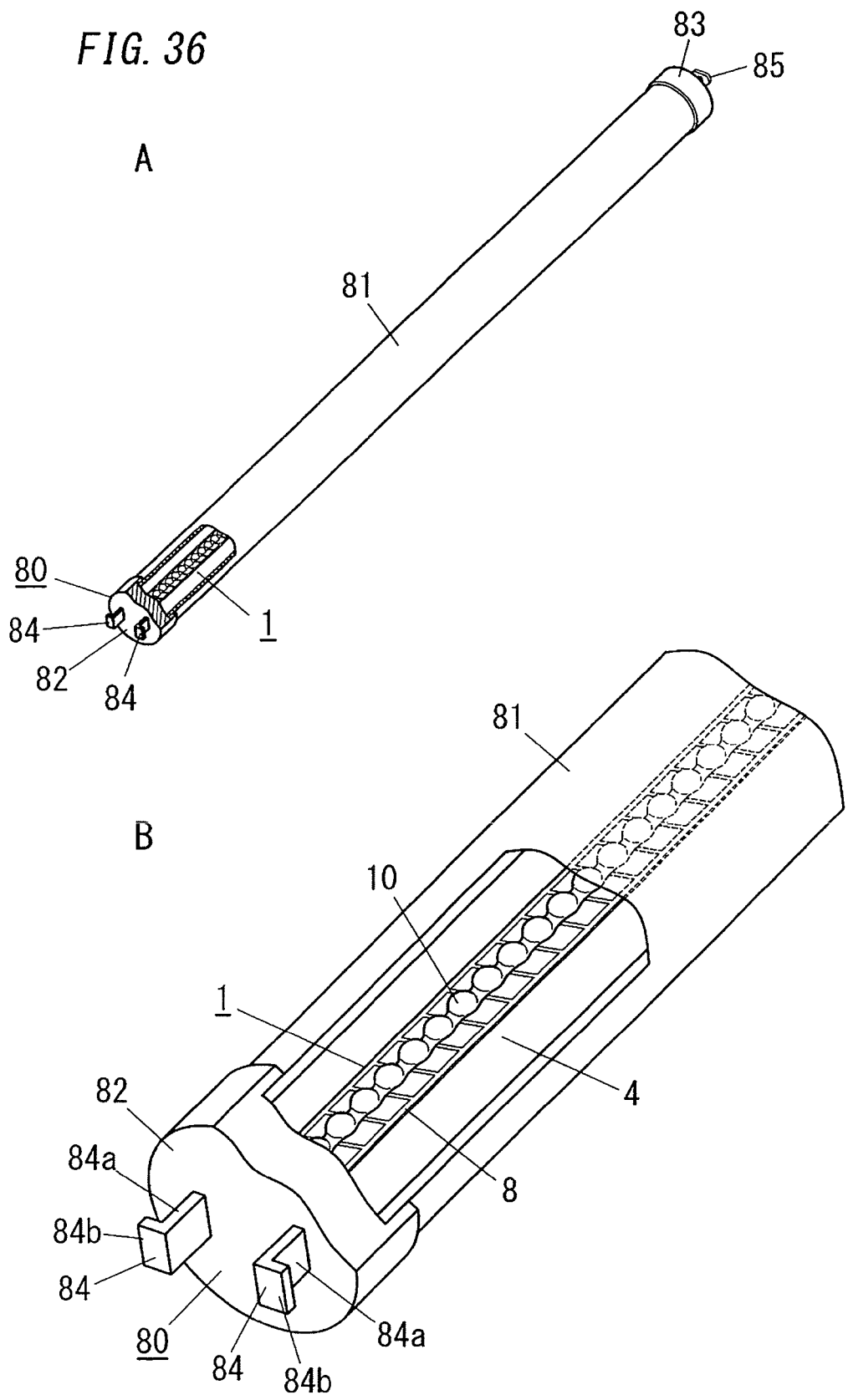
FIG. 36A is a schematic perspective view of a straight-tube LED lamp of Embodiment 2, which is partially exploded.
FIG. 36B is a main portion enlarged view in FIG. 36A.

Hereinafter, a straight-tube LED lamp 80 including a light source that is the LED module 1 of Embodiment 2 will be described with reference to FIGS. 36A and 36B.

The straight-tube LED lamp 80 includes: a tube main body 81 having a straight-tube shape (cylindrical shape) formed of a light-transmissive material; and a first cap 82 and a second cap 83 that are respectively provided at an end portion and the other end portion of the tube main body 81 in the longitudinal direction. The LED module 1 of Embodiment 2 is housed in the tube main body 81. The LED module 1 is not limited to the LED module 1 of Embodiment 2, but may be any of LED modules 1 of Embodiment 1 and the first modification to the eleventh modification of Embodiment 1. Note that, in terms of a general straight-tube LED lamp, "straight-tube LED lamp system with L-type pin cap GX16t-5 (for general illumination)" (JEL 801:2010) is standardized by Japan Electric Lamp Manufacturers Association, for example.

The tube main body 81 may be made of transparent glass, milky white glass, a transparent resin, a milky white resin, or the like.

The first cap 82 has two power supply terminals 84 and 84 (hereinafter referred to as "first lamp pins") which are electrically connected to the LED module 1. These two first lamp pins 84 and 84 are configured to be electrically connected to two power supply contacts respectively of a lamp socket for a power supply which is held in the device main body of a lighting device (not shown).

The second cap 83 has one grounding terminal 85 (hereinafter referred to as "second lamp pin") for grounding. This one second lamp pin 85 is configured to be electrically connected to a grounding contact of a lamp socket for grounding which is held in the device main body.

Each of the first lamp pins 84 is formed in an L-shape, and is constituted by a pin main body 84a which protrudes along the longitudinal direction of the tube main body 81 and a key portion 84b which extends along the radial direction of the tube main body 81 from the tip of the pin main body 84a. The two key portions 84b extend in directions so as to be farther from each other. Note that each of the first lamp pins 84 is formed by bending a long metal plate.

The second lamp pin 85 protrudes from an end face (cap reference face) of the second cap 83 in the opposite direction to the tube main body 81. The second lamp pin 85 is formed in a T-shape. Note that the straight-tube LED lamp 80 is preferably configured so as to meet the standard of "straight-tube LED lamp system with L-type pin cap GX16t-5 (for general illumination)" (JEL 801:2010) which is standardized by Japan Electric Lamp Manufacturers Association, or the like.

The straight-tube LED lamp 80 as described above includes the aforementioned LED module 1 in the tube main body 81, and therefore cost thereof can be reduced and light output thereof can be increased.

A lamp which includes the LED module 1 is not limited to the aforementioned straight-tube LED lamp, and may be a straight-tube LED lamp including the LED module 1 and a lighting unit to switch on the LED module 1 both in the tube main body. Note that power is supplied to the lighting unit from an external power supply via lamp pins.

The LED module 1 of Embodiment 2 includes the submount 4 having an elongated shape and a plurality of the LED chips 6, but the shape of the submount 4 and the number of LED chips 6 and arrangement of the LED chips 6 can be changed as appropriate depending on the type or the like of the lighting device to which the LED module 1 is applied.

Embodiment 3

Figure 37:
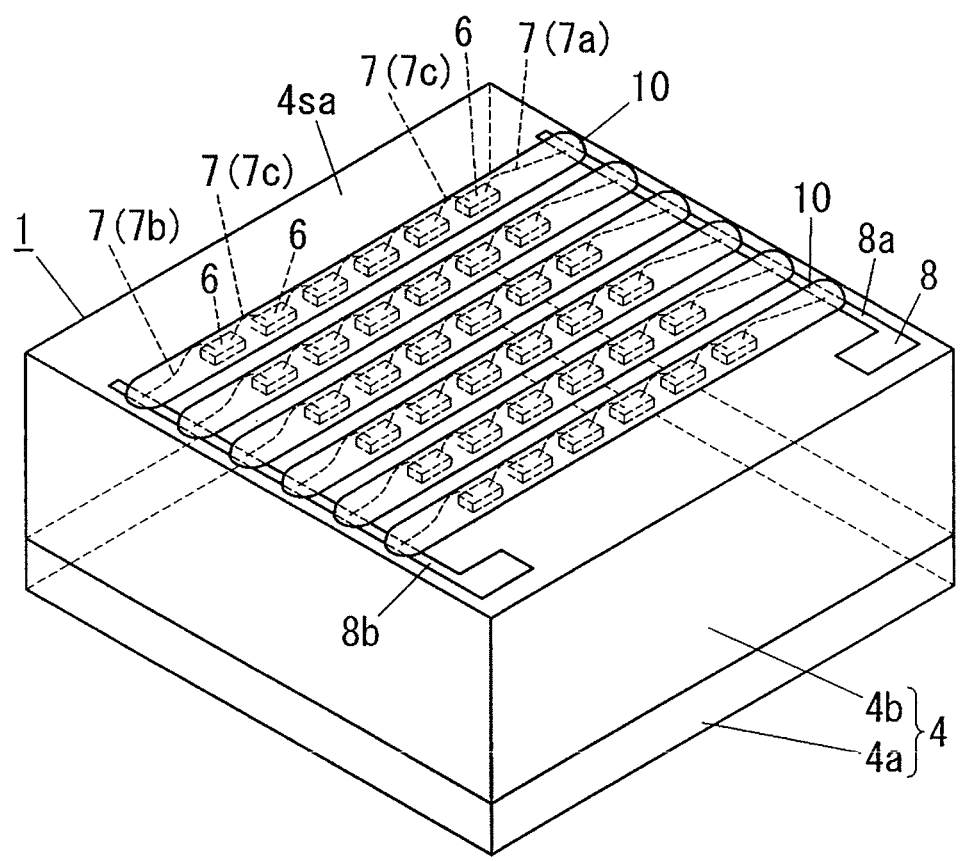
FIG. 37 is a schematic perspective view of an LED module of Embodiment 3.
Figure 38:
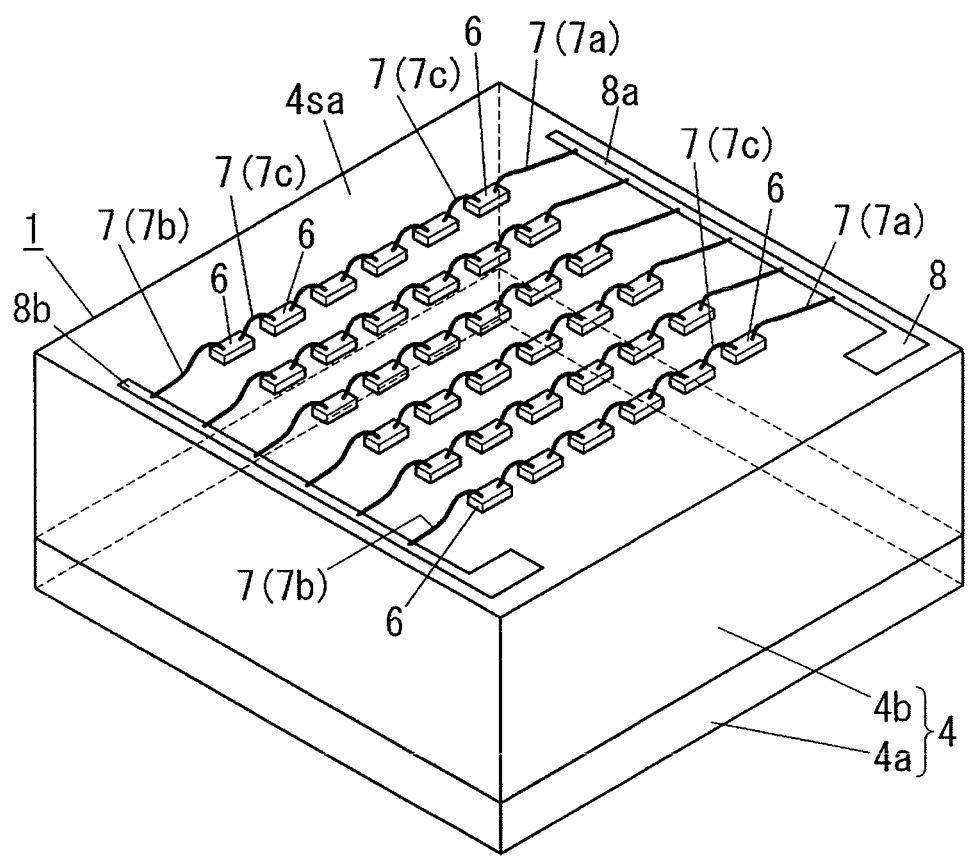
FIG. 38 is a main portion schematic perspective view of the LED module of Embodiment 3.
Figure 39:
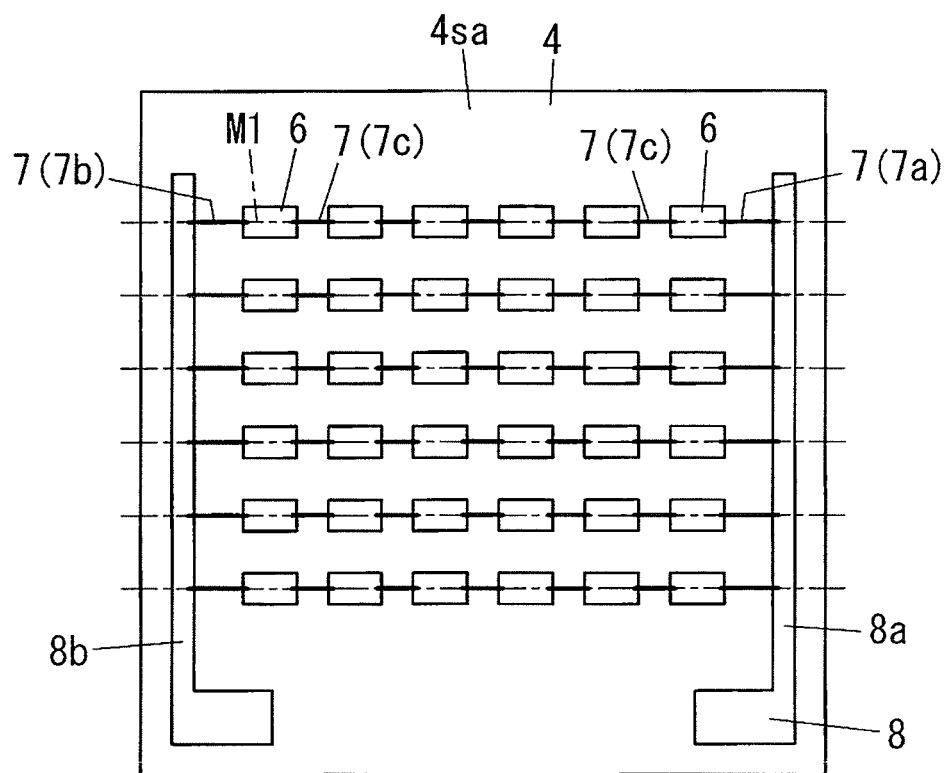
FIG. 39 is a main portion schematic plan view of the LED module of Embodiment 3.

Hereinafter, an LED module 1 of the present embodiment will be described with reference to FIGS. 37 to 39.

The LED module 1 of the present embodiment differs from the LED module 1 of Embodiment 2 in that a submount 4 has a square shape and a plurality of (36 in an example in the diagram) LED chips 6 are arranged in a two-dimensional array. Note that, constituent elements similar to those in Embodiment 2 are provided with the same reference numerals, and redundant description thereof will be omitted.

The LED module 1 includes the plurality of LED chips 6 on a face 4sa of the submount 4. A patterned wiring circuit 8 includes a first conductor 8a and a second conductor 8b which are arranged separately from each other on the face 4sa of the submount 4. In the LED module 1, the plurality of LED chips 6 include a group of LED chips 6 which are connected in series and arranged on a virtual line M1 which connects the first conductor 8a and the second conductor 8b to each other. In the LED module 1, an LED chip of the group of LED chips 6 that is closest to the first conductor 8a on the virtual line M1 has an anode electrode which is electrically connected to the first conductor 8a by a wire 7 (first wire 7a). Besides, an LED chip of the group of LED chips 6 that is closest to the second conductor 8b on the virtual line M1 has a cathode electrode which is electrically connected to the second conductor 8b by a wire 7 (second wire 7b). Furthermore, adjacent LED chips of the group of LED chips 6 on the virtual line M1 are electrically connected in such a manner that an LED chip of the adjacent LED chips that is closer to the first conductor 8a has a cathode electrode which is electrically connected to the anode electrode of an LED chip of the adjacent LED chips that is closer to the second conductor 8b by a wire 7 (third wire 7c).

Accordingly, in contrast to an LED module in which the first conductor 8a and the second conductor 8b exist in the vicinities of the LED chips 6, the LED module 1 can suppress absorption, by the patterned wiring circuit 8, of light such as light that is emitted from any LED chip 6 and directly reaches the patterned wiring circuit 8 and light emitted from any LED chip 6 and reaches the surface 4sa of the submount 4 and passes through the submount 4 and reaches the patterned wiring circuit 8. As a result, light outcoupling efficiency can be improved.

With regard to the LED module 1, a plurality of (six in an example in the diagram) the virtual lines M1 are set, and the groups of the LED chips 6 includes six LED chips and are arranged individually on the virtual lines M1, but the number of virtual lines M1 and the number of LED chips 6 on the virtual line M1 are not limited thereto.

The LED module 1 preferably includes a color conversion portion 10 to cover the first wire 7a, the second wire 7b, the third wire 7c, and the group of the LED chips 6 which are arranged on the virtual line M1. The color conversion portion 10 is formed in a hemicylindrical shape. Consequently, occurrence of disconnection of the third wire 7c which connects adjacent LED chips 6 to each other can be suppressed, and reliability can be improved. Moreover, in the LED module 1, light outcoupling efficiency can be improved and color unevenness can be suppressed. In the LED module 1, since the patterned wiring circuit 8 is provided along the periphery of the submount 4, light absorption by the patterned wiring circuit 8 can be further suppressed, and light outcoupling efficiency can be further improved.

In the LED module 1, the color conversion portion 10 serves as an encapsulating portion with a band shape which covers the first wire 7a, the second wire 7b, the third wire 7c, and the plurality of LED chips 6 arranged on the virtual line M1. However, the band shaped encapsulating portion formed by a transparent material may be provided, instead of the color conversion portion 10. The transparent material of the encapsulating portion may be a silicone resin, an epoxy resin, an acrylic resin, glass, an organic and inorganic hybrid material in which an organic component and an inorganic component are mixed and/or combined at a nanometer (nm) level or molecular level. The LED module 1 includes the band shaped encapsulating portion to cover the first wire 7a, the second wire 7b, the third wire 7c, and the plurality of LED chips 6 that are arranged on the virtual line M1, and therefore, light outcoupling efficiency can be improved. The planar shape of the submount 4 is not limited to the square shape, and may be a polygonal shape other than a square, a round shape, or the like. In the LED module 1, the first conductor 8a and the second conductor 8b are respectively formed in a band shape and are arranged to face each other, but the shapes of the first conductor 8a and the second conductor 8b are not particularly limited. The virtual line M1 is a straight line, but is not limited thereto, and may be a curve or a combination of straight lines and curves.

Figure 40:
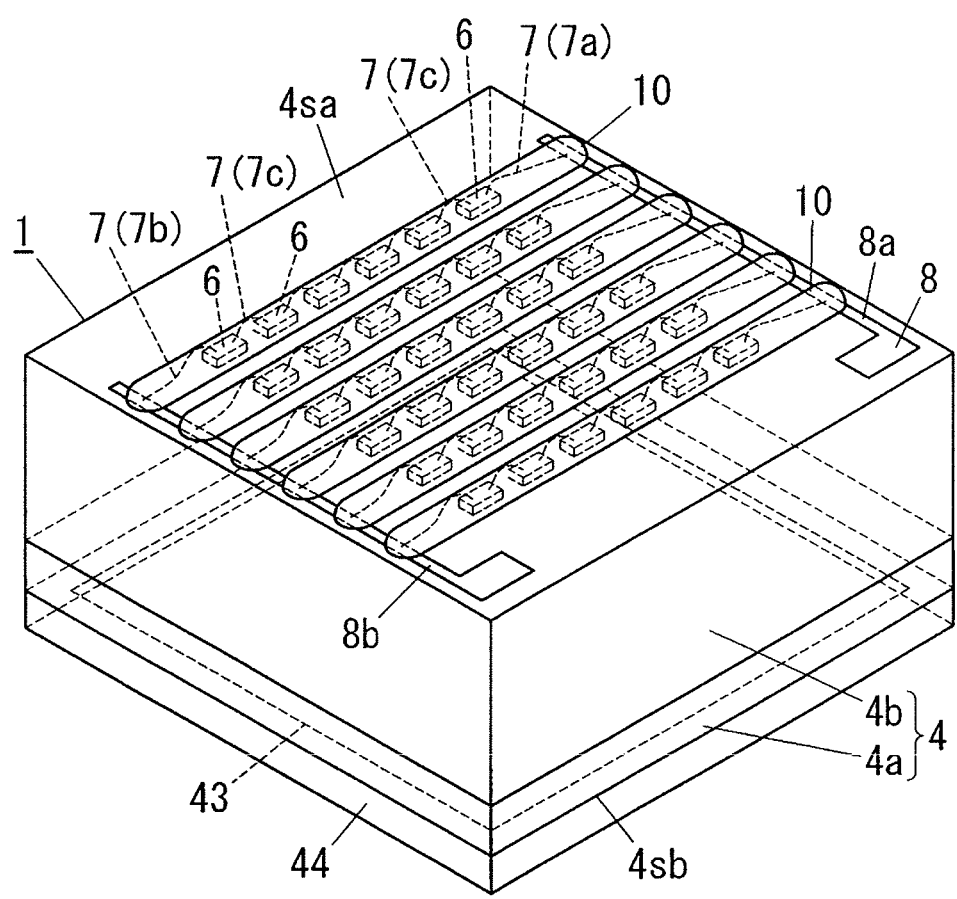
FIG. 40 is a schematic perspective view of the first modification of the LED module of Embodiment 3.

Hereinafter, the first modification of the LED module 1 of the present embodiment will be described with reference to FIG. 40.

The LED module 1 of the first modification differs from the LED module 1 of Embodiment 3 in including a reflection layer 43 to reflect light from the LED chips 6. The reflection layer 43 is provided on the further face 4sb in the thickness direction of the submount 4. Note that, constituent elements similar to those in Embodiment 3 are provided with the same reference numerals, and redundant description thereof will be omitted.

In the LED module 1 of the first modification, it is preferable that the reflection layer 43 is a metal layer and the LED module 1 includes a protection layer 44 to protect the reflection layer on the further face 4sb of the submount 4.

The metal layer is preferably made of a material having high reflectance with respect to light emitted from the LED chip 6. The metal layer may be made of silver, a silver alloy, or the like. In the LED module 1, when the metal layer of the reflection layer 43 is made of silver or a silver alloy, it is preferable that the reflection layer 43 has a planar size smaller than the planar size of the submount 4, and the protection layer 44 is formed so as to cover the surface and the side faces of the reflection layer 43. Accordingly, in the LED module 1, sulfurization of the reflection layer 43 due to exposure to the air can be suppressed, and as a result, aging deterioration of the light outcoupling efficiency can be suppressed. The protection layer 44 may be constituted by a ceramic layer, or the like.

A method of manufacturing the LED module 1 of the first modification is substantially the same as the method of manufacturing the LED module 1 of Embodiment 2, and differs therefrom in that, in a step of preparing the submount 4, the submount 4 provided with the reflection layer 43 and the protection layer 44 both at the further face 4sa is prepared.

After preparing the submount 4, wire bonding of the first wire 7a, the second wire 7b, and the third wire 7c are performed with a die bonding apparatus or the like, and thereafter the color conversion portion 10 may be formed using a dispenser system or the like.

Incidentally, the reflection layer 43 may be formed by, for example, screen-printing a silver paste for forming the reflective layer 43, on a ceramic green sheet for forming the second light-transmissive layer (the second ceramic layer 4a) that is farthest from the LED chip 6, and then sintering the silver paste to form the reflective layer 43. Accordingly, in the method of manufacturing the LED module 1, the second light-transmissive layer can be formed through a process of forming the reflection layer 43, and as a result, cost can be reduced. In the method of manufacturing the LED module 1, the second light-transmissive layer, the reflection layer 43, and the protection layer 44 may be formed at the same time by screen-printing a silver paste on the ceramic green sheet for forming the second light-transmissive layer, overlaying thereon a ceramic green sheet for forming the protection layer, and thereafter sintering them.

Figure 41:
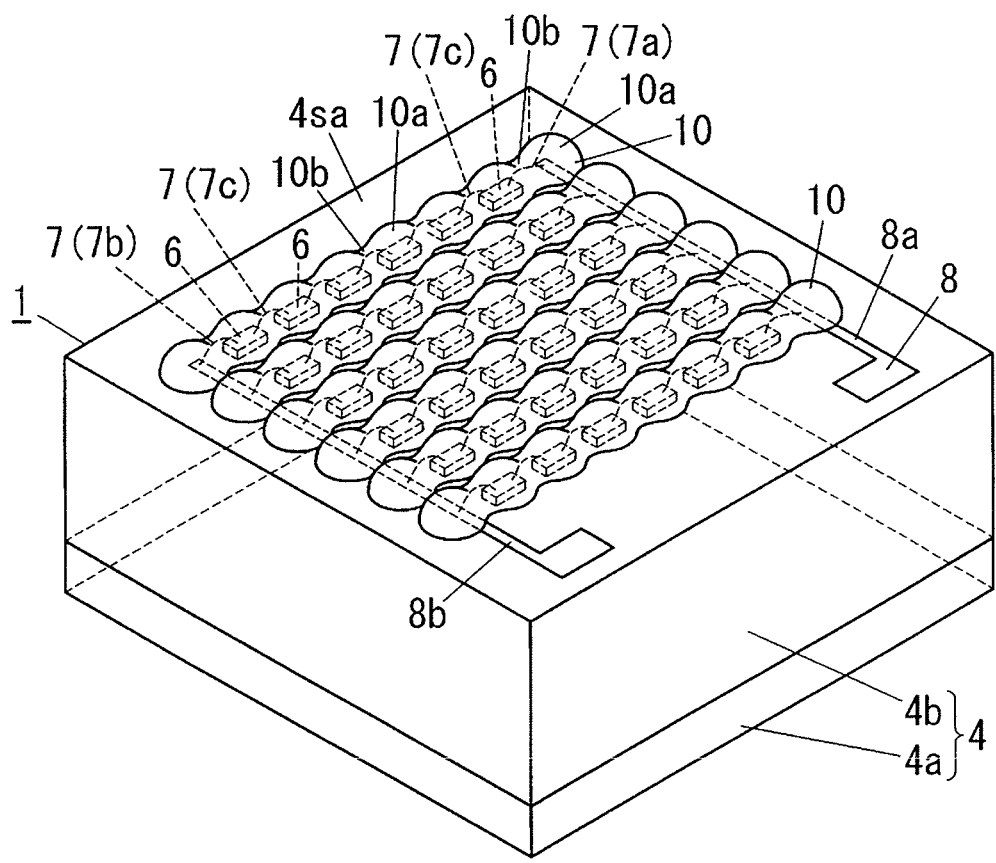
FIG. 41 is a schematic perspective view of the second modification of the LED module of Embodiment 3.
Figure 42:
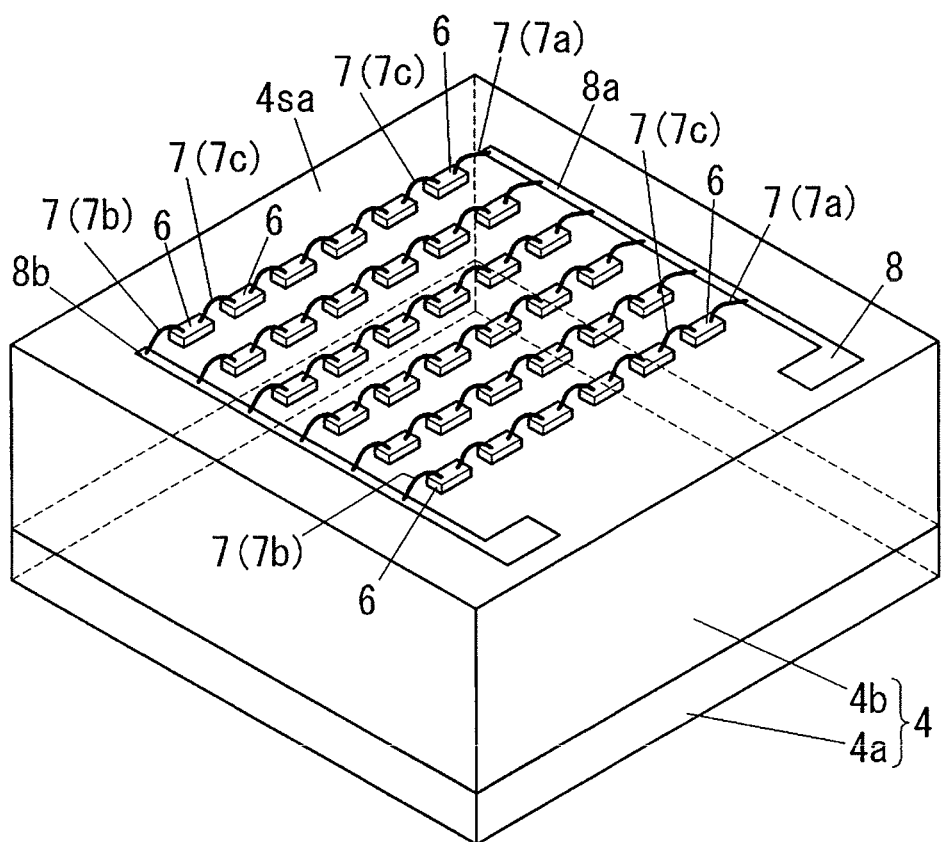
FIG. 42 is a main portion schematic perspective view of the second modification of the LED module of Embodiment 3.

Hereinafter, the second modification of the LED module 1 of the present embodiment will be described with reference to FIGS. 41 and 42.

An LED module 1 of the second modification is shorter than the LED module 1 of Embodiment 3 in the distance between the first conductor 8a and the second conductor 8b, the distance between the first conductor 8a and the LED chip 6 that is closest to the first conductor 8a, and the distance between the second conductor 8b and the LED chip 6 that is closest to the second conductor 8b. Note that, constituent elements similar to those in Embodiment 3 are provided with the same reference numerals, and redundant description thereof will be omitted.

The color conversion portion 10 in the LED module 1 of the second modification has recessed portions 10b. Each recessed portion 10b is provided between the adjacent LED chips 6 on the virtual line M1 and suppresses total reflection of light which is emitted from the LED chips 6.

Accordingly, in the LED module 1 of the second modification, it is possible to suppress total reflection of light which is emitted from the LED chip 6 and strikes an interface between the color conversion portion 10 and the air. Consequently, in the LED module 1 of the second modification, it is possible to reduce light which is confined due to total reflection, compared with LED module including the color conversion portion 10 with a hemicylindrical shape. Hence, light outcoupling efficiency can be improved. In short, in the LED module 1, total reflection loss can be reduced and light outcoupling efficiency can be improved.

In the LED module 1 of the second modification, the color conversion portion 10 also serves as an encapsulating portion. However, an encapsulating portion may be provided instead of the color conversion portion 10, the encapsulating portion being formed by a transparent material having the same shape as the color conversion portion 10.

Figure 43:
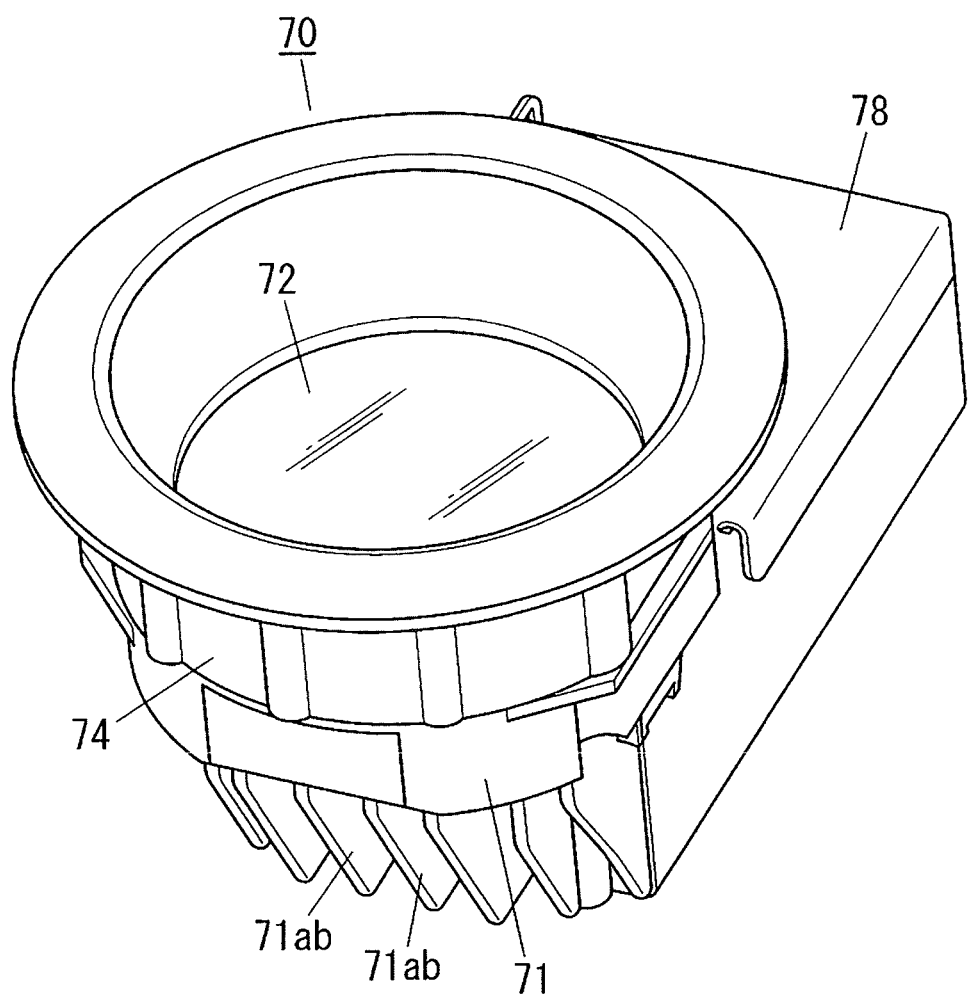
FIG. 43 is a schematic perspective view of a lighting device of Embodiment 3.
Figure 44:
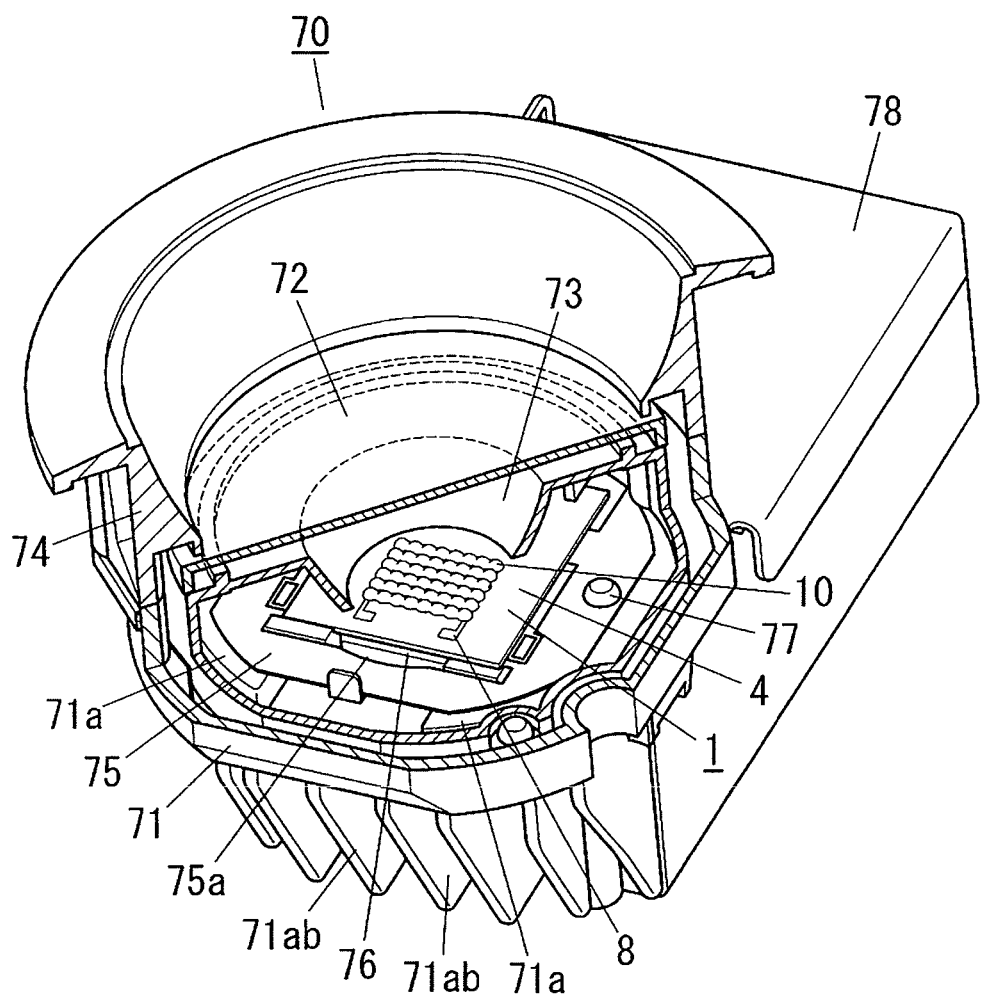
FIG. 44 is a schematic perspective view of the lighting device of Embodiment 3, which is partially exploded.
Figure 45:
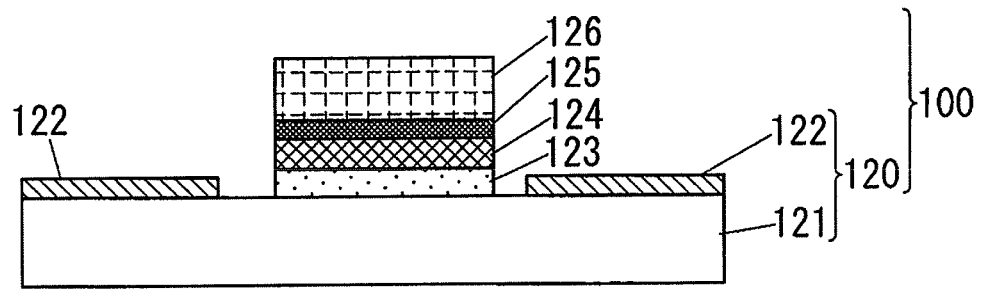
FIG. 45 is a cross section of a light emission apparatus of a conventional example.
Figure 46:
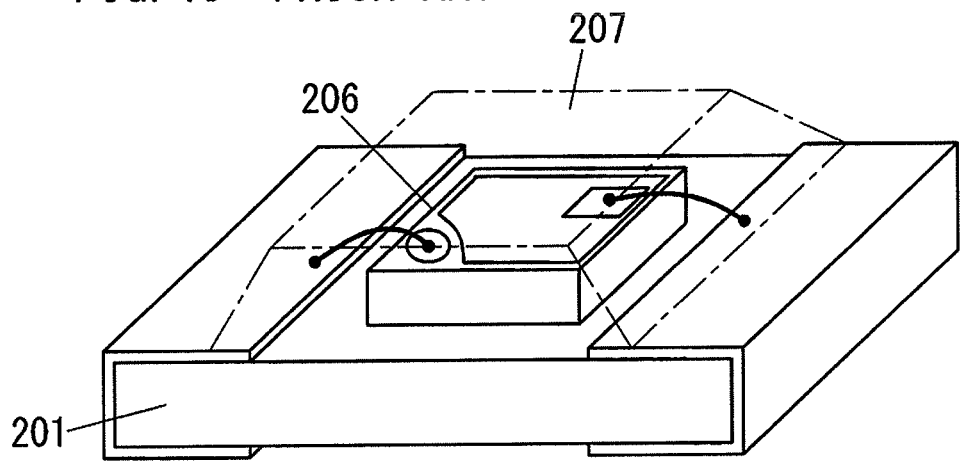
FIG. 46 is a perspective explanatory diagram of a chip-type light-emitting element of another conventional example.
Figure 47:
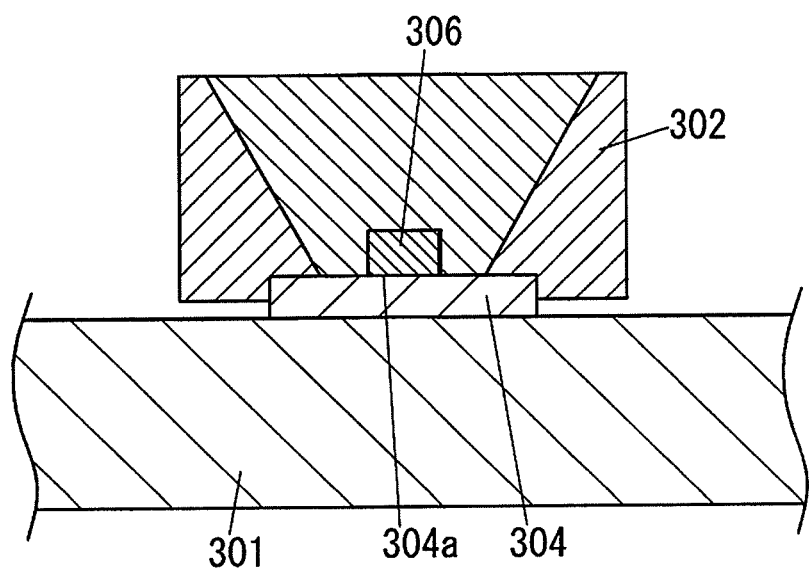
FIG. 47 is a cross section of a configuration of yet another conventional example.

Hereinafter, an example of a lighting device 70 including the LED module 1 of the second modification will be described with reference to FIGS. 43 and 44.

The lighting device 70 is an LED lighting device which can be used as a downlight, and includes a device main body 71 and a light source that is the LED module 1 and is held by the device main body 71. Besides, the lighting device 70 includes a case 78 which has a rectangular box shape and accommodates a lighting unit to operate the LED module 1. The lighting unit and the LED module 1 are electrically connected by wires (unshown) or the like.

In the lighting device 70, the device main body 71 is formed in a disk shape, and the LED module 1 is present on a face of the device main body 71. The lighting device 70 includes a plurality of fins 71ab which protrude from a further face of the device main body 71. The device main body 71 and the fins 71ab are formed integrally.

Moreover, the lighting device 70 includes a first reflector 73 to reflect light which is emitted laterally from the LED module 1, a cover 72, and a second reflector 74 to control a directional distribution of light which is outputted from the cover 72. Note that, in the lighting device 70, a device outer cover to house the LED module 1, the first reflector 73 and the cover 72 is constituted by the device main body 71 and the second reflector 74.

The device main body 71 has two projecting base portions 71a, which face each other on the face thereof. In the lighting device 70, a plate shaped fixing member 75 to fix the LED module 1 is attached to the two projecting base portions 71a. The fixing member 75 is formed of a metal plate, and is fixed to each of the projecting base portions 71a by a screw 77. The first reflector 73 is fixed to the device main body 71. The LED module 1 may be sandwiched between the first reflector 73 and the fixing member 75. The first reflector 73 is formed of a white synthetic resin.

The fixing member 75 has an opening 75a for exposing part of the submount 4 of the LED module 1. The lighting device 70 includes a thermal conduction portion 76 interposed between the submount 4 and the device main body 71. The thermal conduction portion 76 has a function of conducting heat from the submount 4 to the device main body 71. The thermal conduction portion 76 is formed of a heat-conductive grease, but is not limited thereto, and may be formed of a heat-conductive sheet.

The heat-conductive sheet may be a silicone gel sheet having electrical insulation and thermal conductivity. The silicone gel sheet used as the heat-conductive sheet is preferably soft. This king of silicone gel sheet may be Sarcon® or the like.

The material of the heat-conductive sheet is not limited to silicone gel, and may be elastomer, for example, so long as the material has electrical insulation and thermal conductivity.

In the lighting device 70, heat generated in the LED module 1 can be efficiently conducted to the device main body 71 via the thermal conduction portion 76. Consequently, in the lighting device 70, heat generated in the LED module 1 can be efficiently released from the device main body 71 and the fins 71ab.

The device main body 71 and the fins 71ab are preferably formed of a material having high thermal conductivity, and more preferably made of a material having higher thermal conductivity than the submount 4. Here, the device main body 71 and the fins 71ab are preferably formed of a metal having high thermal conductivity such as aluminum and copper.

The cover 72 may be made of an acrylic resin, a polycarbonate resin, a silicone resin, glass, or the like.

The cover 72 may has a lens portion (not shown) for controlling a directional distribution of light emitted from the LED module 1. The cover 72 and the lens portion may be formed integrally.

The second reflector 74 may be made of aluminum, stainless steel, a resin, ceramic, or the like.

The lighting device 70 described above includes a light source that is the aforementioned LED module 1, and therefore cost can be reduced and light output can be increased. Besides, the lighting device 70 may have a configuration in which the device main body 71 also serves as the opaque substrate 2 of the LED module 1.

The invention claimed is:

1. An LED module comprising:
   a submount having a face in a thickness direction of the submount;
   an LED chip bonded to the face with a first bond;
   a reflective layer provided on a further face of the submount in the thickness direction for reflecting light from the LED chip;
   a patterned wiring circuit electrically connected to the LED chip; and
   an opaque substrate,
   the first bond allowing light emitted from the LED chip to pass therethrough,
   the submount being a light-transmissive member having light diffusing properties and having a planar size larger than a planar size of the LED chip,
   the patterned wiring circuit being provided on the face of the submount so as not to overlap the LED chip,
   the submount being constituted by a first ceramic layer and a second ceramic layer which are stacked in the thickness direction, the first ceramic layer and the second ceramic layer being arranged from the LED chip in order of the first ceramic layer and the second ceramic layer, the first ceramic layer being thicker than the second ceramic layer, the first ceramic layer including ceramic particles having a greater particle diameter than the second ceramic layer, while the second ceramic layer includes ceramic particles having a smaller particle diameter than the first ceramic layer and the second ceramic layer further includes pores, the first ceramic layer and the second ceramic layer having different optical properties so that the second ceramic layer which is farther from the LED chip is higher than the first ceramic layer in reflectance in a wavelength range of the light emitted from the LED chip,
   the submount being bonded to a surface of the opaque substrate with a second bond,
   a silver paste being screen printed on a ceramic green paste, the silver paste formed onto the second ceramic layer,
   the silver paste being sintered to form the reflective layer, while the sintering also forms the second ceramic layer from the ceramic green paste such that the reflective layer is formed onto the second ceramic layer, and
   the surface of the opaque substrate having one of light diffusing properties or specular reflective properties.

2. The LED module according to claim 1, further comprising:
   a color conversion portion made of a transparent material containing a first fluorescent material which is excited by the light emitted from the LED chip to emit light having a different color from the light emitted from the LED chip,
   the color conversion portion covering sides of the LED chip and an opposite surface of the LED chip from the first bond.

3. The LED module according to claim 2, wherein the color conversion portion contains a light diffusion material.

4. The LED module according to claim 1, wherein at least one of the first bond and the second bond contains a second fluorescent material which is excited by the light emitted from the LED chip to emit light having a different color from the light emitted from the LED chip.

5. The LED module according to claim 1, further comprising a resin portion which is situated over the face of the submount and serves as an outer cover through which light passes last,
the resin portion being made of a transparent resin which contains a light diffusion material.

6. The LED module according to claim 1, further comprising a plurality of the LED chips on the face of the submount,
wherein:
the patterned wiring circuit includes a first conductor and a second conductor that are arranged apart from each other on the face of the submount;
the plurality of the LED chips include a group of LED chips which are connected in series and arranged on a virtual line connecting the first conductor and the second conductor to each other;
an LED chip of the group of LED chips that is closest to the first conductor on the virtual line has an anode electrode which is electrically connected to the first conductor by a first wire;
an LED chip of the group of LED chips that is closest to the second conductor on the virtual line has a cathode electrode which is electrically connected to the second conductor by a second wire; and
adjacent LED chips of the group of LED chips on the virtual line are electrically connected to each other in such a manner that an LED chip of the adjacent LED chips that is closer to the first conductor has a cathode electrode which is electrically connected to an anode electrode of an LED chip of the adjacent LED chips that is closer to the second conductor by a third wire.

7. The LED module according to claim 6, comprising
an encapsulating portion with a band shape which covers the first wire, the second wire, the third wire, and the group of the LED chips arranged on the virtual line,
the encapsulating portion having a recessed portion between the adjacent LED chips on the virtual line for suppressing total reflection of light emitted from the adjacent LED chips.

8. The LED module according to claim 1, wherein:
the reflective layer is a metal layer; and
the LED module further comprises a protection layer provided on the further face of the submount for protecting the reflective layer.

9. A method of manufacturing an LED module having a submount having a face in a thickness direction of the submount, an LED chip bonded to the face with a first bond that allows light emitted from the LED chip to pass therethrough, a reflective layer provided on a further face of the submount in the thickness direction for reflecting light from the LED chip, a patterned wiring circuit electrically connected to the LED chip, and an opaque substrate, the method comprising:
providing the patterned wiring circuit on the face of the submount so as not to overlap the LED chip, wherein:
the submount is a light-transmissive member having light diffusing properties and having a planar size larger than a planar size of the LED chip,
the submount is constituted by a first ceramic layer and a second ceramic layer which are stacked in the thickness direction, the first ceramic layer and the second ceramic layer being arranged from the LED chip in order of the first ceramic layer and the second ceramic layer, the first ceramic layer being thicker than the second ceramic layer, the first ceramic layer including ceramic particles having a greater particle diameter than the second ceramic layer, while the second ceramic layer includes ceramic particles having a smaller particle diameter than the first ceramic layer and the second ceramic layer further includes pores, the first ceramic layer and the second ceramic layer having different optical properties so that the second ceramic layer which is farther from the LED chip is higher than the first ceramic layer in reflectance in a wavelength range of the light emitted from the LED chip, and
the submount is bonded to a surface of the opaque substrate with a second bond;
screen-printing a silver paste on a ceramic green paste, the silver paste formed onto the second ceramic layer; and
sintering the silver paste to form the reflective layer, while the sintering also forms the second ceramic layer from the ceramic green paste, such that the reflective layer is formed onto the second ceramic layer.

10. A lighting device comprising:
a device main body; and
a light source that is the LED module according to claim 1.

* * * * *